United States Patent [19]

Bloomquist et al.

[11] Patent Number: 4,663,009

[45] Date of Patent: May 5, 1987

[54] SYSTEM AND METHOD FOR DEPOSITING PLURAL THIN FILM LAYERS ON A SUBSTRATE

[75] Inventors: Darrel R. Bloomquist, Boise; George A. Drennan, Eagle; Robert J. Lawton, Boise, all of Id.; James E. Opfer, Palo Alto, Calif.; Michael B. Jacobson, Boise, Id.

[73] Assignee: Hewlett-Packard Company, Palo Alto, Calif.

[21] Appl. No.: 699,969

[22] Filed: Feb. 8, 1985

[51] Int. Cl.[4] ............................................. C23C 14/34
[52] U.S. Cl. .................................. 204/192.2; 204/298; 204/192.15
[58] Field of Search .............. 204/298, 192 R, 192 M, 204/192 C; 118/718, 719, 729, 733; 427/250, 255.5, 255.7

[56] References Cited

U.S. PATENT DOCUMENTS

| | | | |
|---|---|---|---|
| 3,584,847 | 6/1971 | Hammond et al. | 118/719 X |
| 4,236,946 | 12/1980 | Aboaf et al. | 204/192 M X |
| 4,274,936 | 6/1981 | Love | 204/298 X |
| 4,313,815 | 2/1982 | Graves et al. | 204/298 |
| 4,379,743 | 4/1983 | Nakatsukasa et al. | 204/298 |
| 4,410,407 | 10/1983 | Macaulay | 204/298 X |
| 4,426,265 | 1/1984 | Brunsch et al. | 204/192 M |
| 4,500,407 | 2/1985 | Boys et al. | 204/298 |
| 4,505,950 | 3/1985 | Yamazaki | 718/719 |

Primary Examiner—John F. Niebling
Assistant Examiner—Nam X. Nguyen
Attorney, Agent, or Firm—Leslie G. Murray

[57] ABSTRACT

A sealed substrate processing path has plural selectably isolatable vacuum deposition chambers along the path. A transporter carries substrates along the path and an independently controllable sputter deposition is performed in each deposition chamber on substrates therein. Substrates are loaded from a load chamber to a first deposition chamber while a vacuum is maintained in the first and load chambers. Substrates are transferred from a last deposition chamber to an unload chamber while a vacuum is maintained in the last and load chambers. Substrates are placed in the load chamber while the load and first chambers are isolated and are removed from the unload chamber while the last and unload chambers are isolated. In one embodiment, substrates travel succesively from the load chamber to first through fourth deposition chambers and then to the unload chamber. In another embodiment, substrates travel from the load chamber to first to second to first and to third deposition chambers and then to the unload chamber. First and second alternating load chambers are provided in another embodiment with substrates being loaded into the second load chamber while substrates are transferred from the first load chamber to the first deposition chamber and vice versa. The respective first and second load chambers are coupled through an interface chamber to the first deposition chamber and are each isolatable from the interface chamber during loading.

15 Claims, 38 Drawing Figures

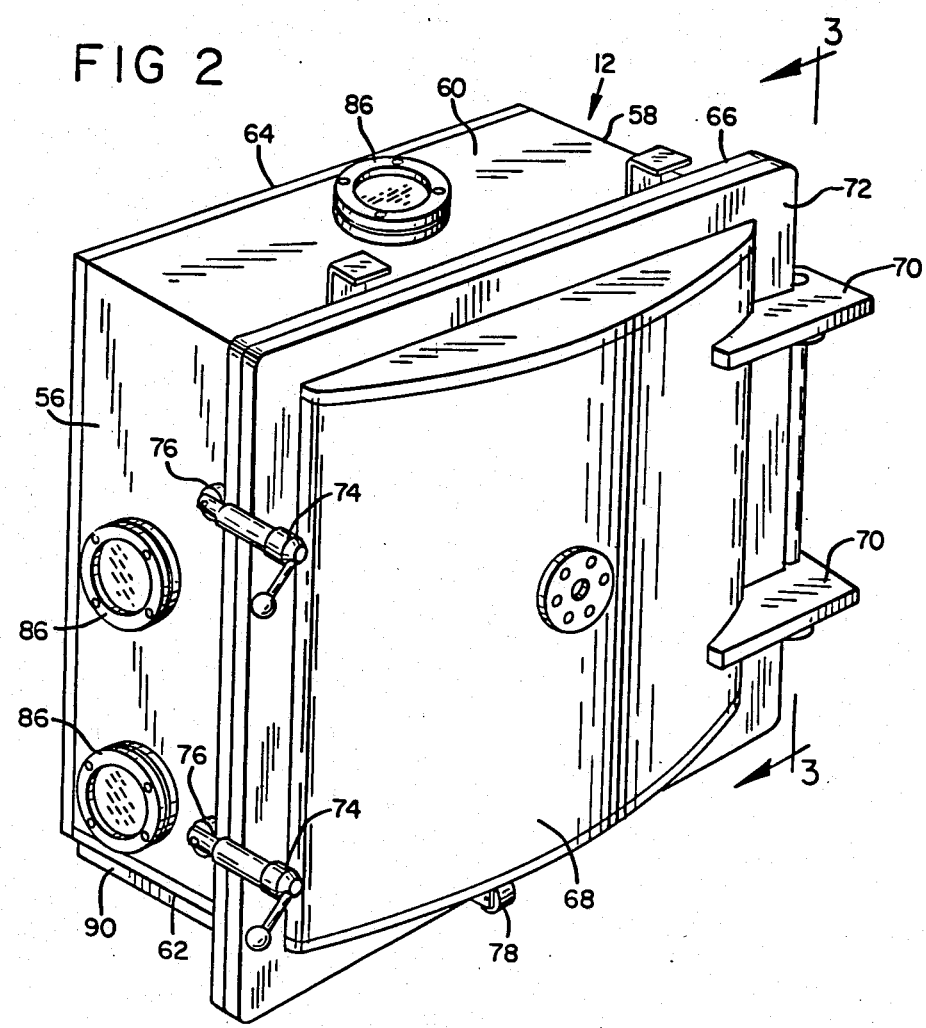

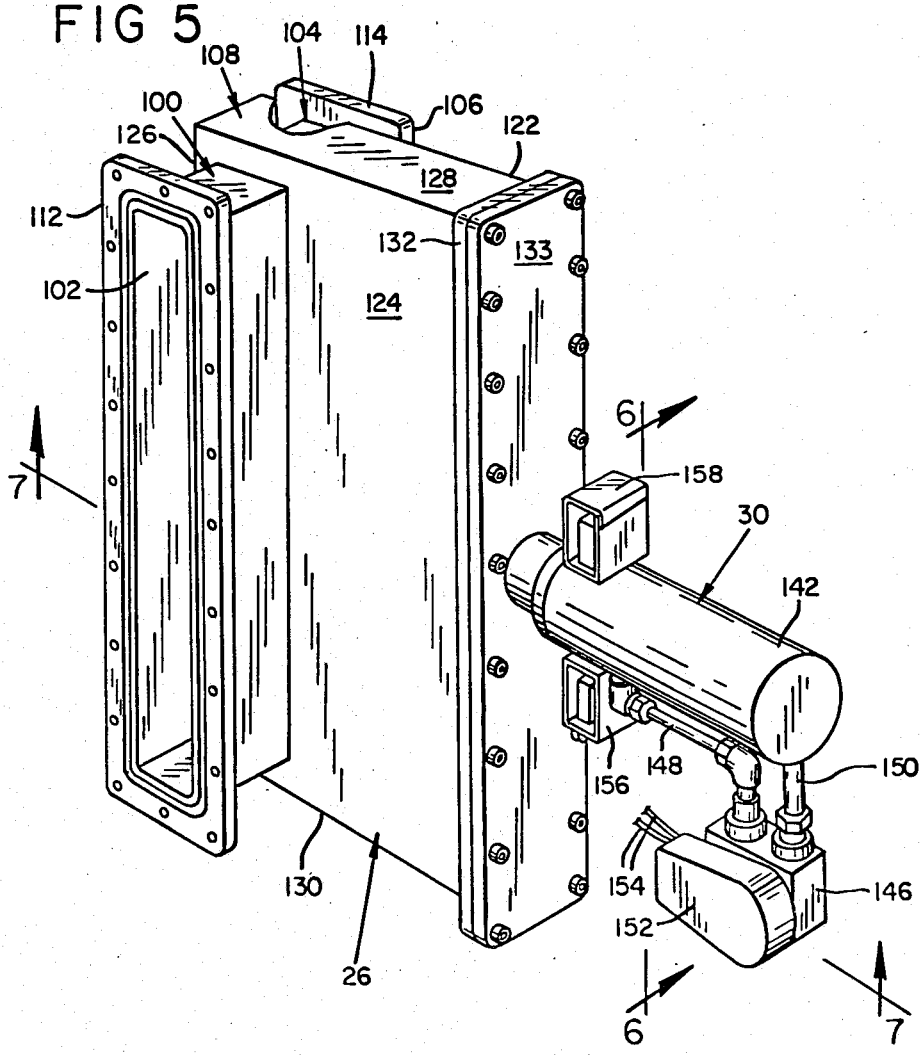

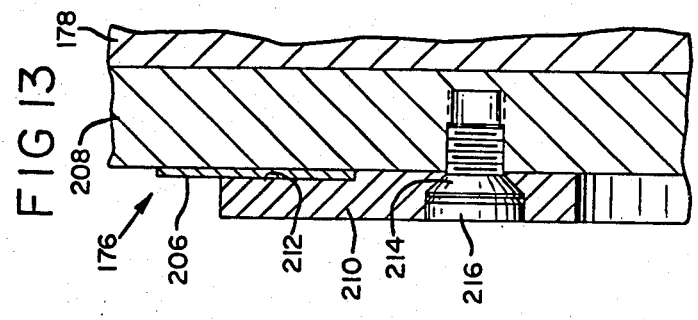
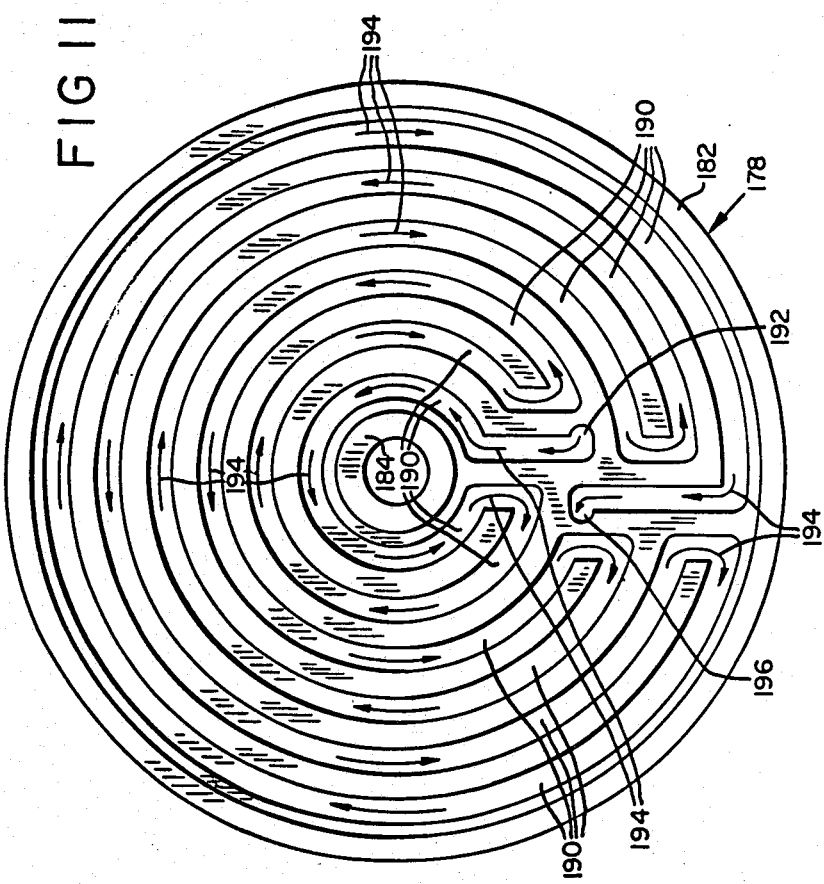

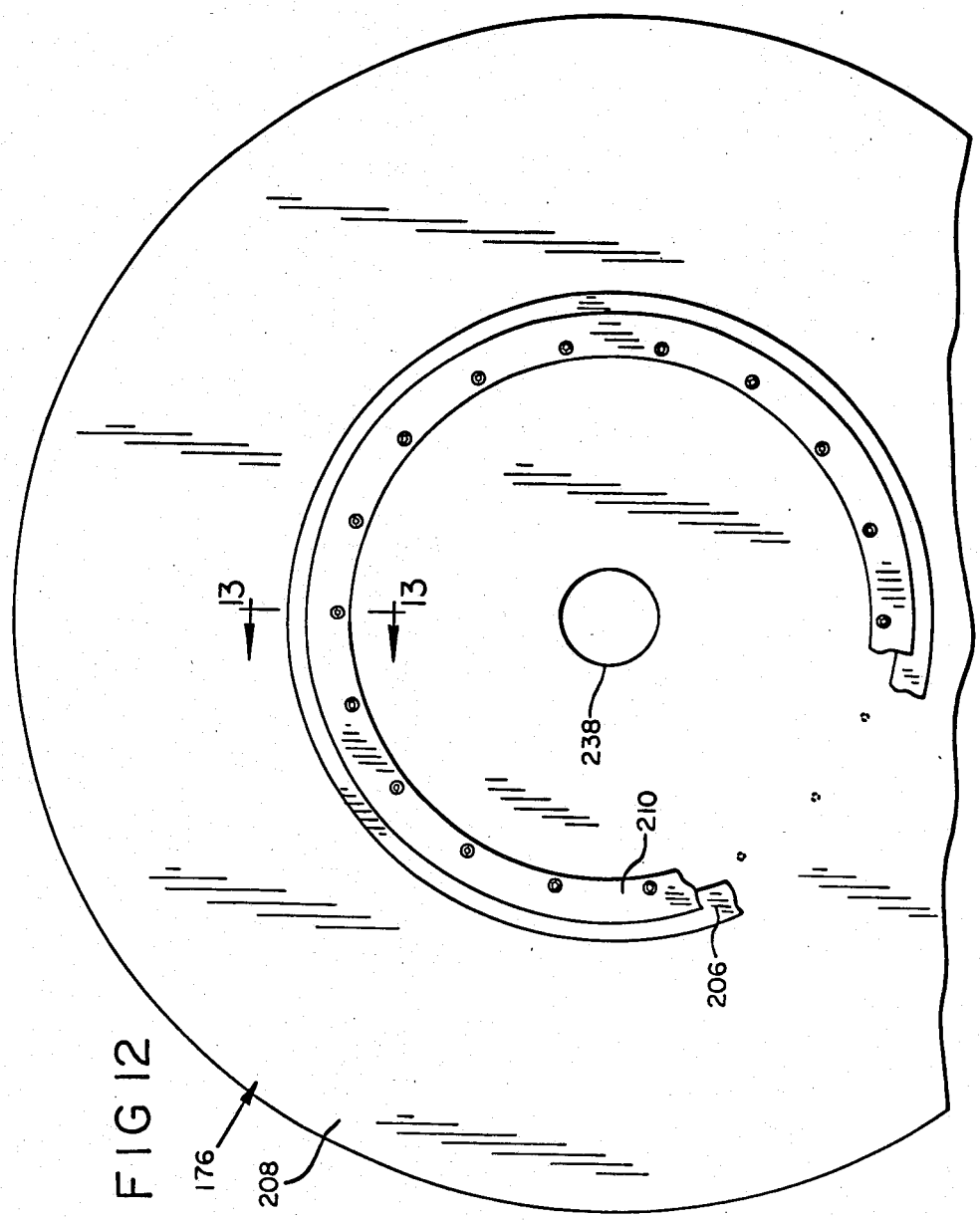

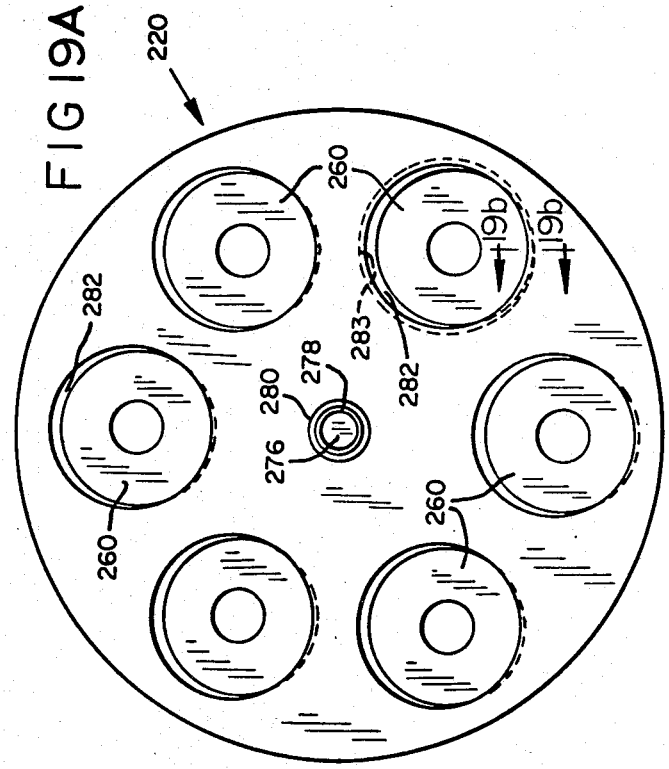
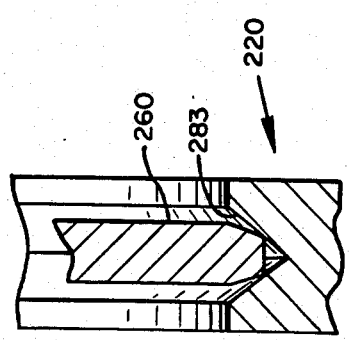

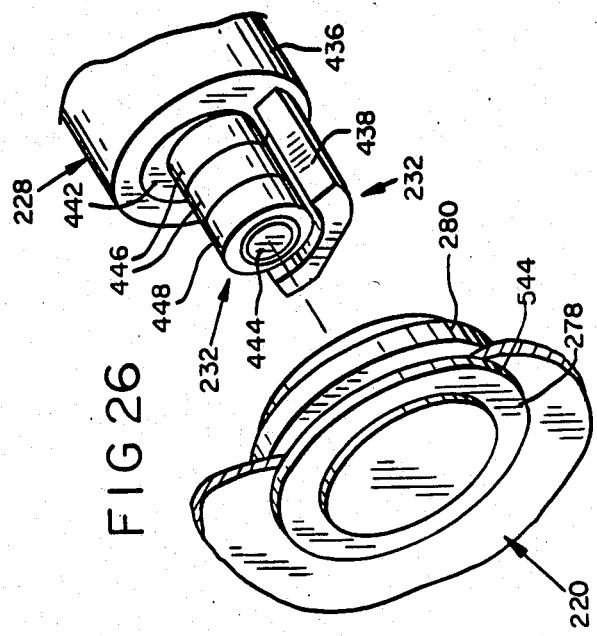
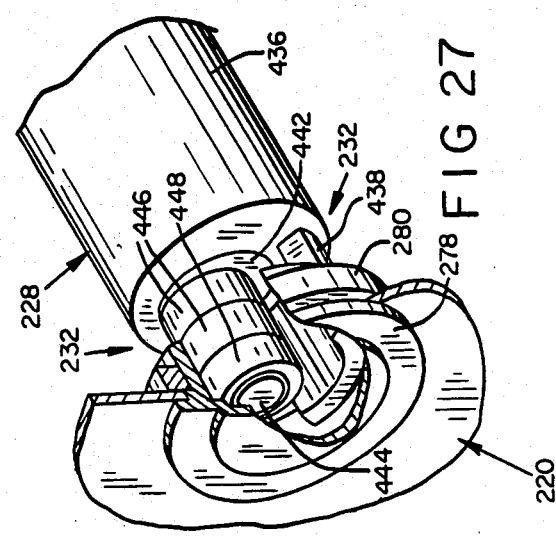

SYSTEM AND METHOD FOR DEPOSITING PLURAL THIN FILM LAYERS ON A SUBSTRATE

BACKGROUND OF THE INVENTION

The present invention relates to a system and method for vacuum depositing thin film layers on a substrate and more specifically to such a system and method in which plural layers are deposited on a substrate by sputtering to produce thin film magnetic recording discs and other products.

The deposition of films by sputtering is well-known in the art. Two exemplary types of sputtering are direct current sputtering, commonly designated as DC sputtering, and radio frequency sputtering, commonly designated as RF sputtering. DC sputtering is usually restricted to the deposition of conductive films. However, RF sputtering may be used to deposit conductive, dielectric or insulating materials. Sputter depositing of films is finding increasing applications. For example, in the fabrication of thin film magnetic recording discs for computers and in the manufacturing of semi-conductor devices.

One early approach for manufacturing multi-layer thin film magnetic discs involves plating aluminum substrates with a first layer of nickel phosphorus and with a second magnetic layer of cobalt phosphorus. These plated substrates are then placed in a deposition chamber and this chamber is evacuated. Thereafter, a layer of carbon, a wear resistant substance, is sputtered onto the substrates. The pressure in the chamber is then returned to ambient conditions and the substrates are removed.

The above approach suffers from a number of significant drawbacks. For example, with this procedure, the manufacture of discs is relatively time consuming. Furthermore, when the substrates are transferred to the deposition chamber, it is difficult to prevent contamination of the partially processed substrates. Contaminates such as oxygen and water vapor present serious corrosion and other problems. Moreover, with the above approach, it is difficult to produce thin film magnetic discs with consistently uniform magnetic properties from disc to disc. Therefore, the performance of such discs is somewhat unpredictable, particularly when used in high density data recording applications.

Another prior art thin film magnetic disc manufacturing apparatus has a single large vacuum deposition chamber within which a number of separate sputtering targets are provided. In this device, substrates are carried in a linear direction and at a constant speed through the deposition chamber. As the substrates travel through the chamber, they pass between successive pairs of sputtering targets which each sputter a layer of material onto the passing substrate. The thickness of the various sputtered layers is varied by adjusting the power delivered to the respective sputtering targets.

This apparatus, although somewhat faster than the previously described approach, also has a number of disadvantages. As one example, this apparatus has limitations in its capacity to optimize parameters which affect the effectiveness of sputtering of each particular layer. Such parameters include factors such as sputtering gas pressure, sputtering gas mixture, and the duration of sputtering. In addition, such prior art devices do not compensate for non-uniform sputtering by a target. For example, if a sputtering target is sputtering at a different rate from its upper region than from its lower region, a substrate traveling in a linear direction past the target is sputtered with a layer of uneven thickness.

Furthermore, maintenance of such devices is difficult and time consuming. That is, the entire deposition chamber is exposed to the ambient environment whenever a particular sputtering target is repaired or replaced. This exposes all of the sputtering targets to contamination. In addition, due to the size of the chamber, significant time is required to reestablish a high vacuum in the chamber following maintenance.

Therefore, a need exists for an improved system and method for vacuum depositing plural thin film layers on substrates and also for such a system and method which employs sputtering to produce thin film magnetic recording discs and other products.

SUMMARY OF THE INVENTION

In accordance with the method and system of the present invention, a substrate processing path is provided with plural deposition chambers along the path. The path is sealed from ambient conditions and the deposition chambers are selectively isolatable from one another. As substrates travel along the path and reach a particular deposition chamber, they may be isolated within the chamber from adjoining chambers. A vacuum deposition means is provided in each deposition chamber for depositing a layer of material on substrates positioned in the chamber. Each deposition chamber may be isolated from other chambers during deposition therein. Furthermore, the deposition process performed within each chamber is independently controllable relative to the deposition processes performed in the other chambers. This enables optimization of parameters affecting deposition within each chamber. The substrates travel between successive deposition chambers until all of the desired depositions have been performed.

In accordance with one feature of the present invention, each deposition chamber is adapted to accomplish a particular deposition process by sputtering.

As another feature of the present invention, each deposition chamber has a sputtering apparatus and the deposition process performed in each chamber is independently controllable to provide optimal operating parameters such as sputtering power, sputtering time, sputtering gas composition, sputtering gas flow rate, and sputtering gas pressure within the sputtering chamber.

As another feature of the present invention, the sputtering targets, target configuration, and type of sputtering devices in each deposition chamber are easily changeable to accomplish the desired sputtering, with DC magnetron and RF sputtering being exemplary of the types of sputtering which may be performed in the deposition chambers. In addition, as different sputtering devices are installed in a deposition chamber, the sputtering parameters are readily adjustable to enhance the effectiveness of sputtering with such different sputtering devices.

As another feature of the present invention, the sputtering targets are constructed and positioned, and the substrates are supported for movement during sputtering, so as to sputter layers onto substrates in a manner which results in a substrate with a coercivity which varies in a radial direction.

As a further feature of the present invention, each such deposition chamber is provided with an independent vacuum system.

As still another feature of the present invention, each chamber is isolated from the other chambers by a high vacuum valve which permits substrates to be transferred from an evacuated first chamber to an evacuated second chamber without losing the vacuum in either the first or second chambers.

As another feature of the present invention, both sides of a substrate are simultaneously sputtered within the deposition chambers.

As a further feature of the invention, plural substrate discs are supported by carriers which are transported along the processing pathway from chamber to chamber by one or more driven transporters.

As still another feature of the present invention, the deposition chambers are provided with plunger mechanisms which rotate the carriers during sputtering.

As still another feature of the present invention, the carriers comprise means which impart planetary motion to the supported substrates as the carriers are rotated.

As a still further feature of the present invention, in addition to the deposition chambers, the processing path includes an isolatable load chamber means and an isolatable unload chamber means. In addition, a loader is provided in the load chamber means for placing substrate carriers onto a transporter in the load chamber means and an unloader is provided in the unload chamber means for removing substrate carriers from a transporter in the unload chamber means.

As another feature of the present invention, the load chamber means comprises first and second load chambers coupled through an interface chamber to a first deposition chamber. Substrates are loaded into one load chamber while substrates are delivered from the other load chamber to the first deposition chamber for processing, and vice versa.

A further feature of the present invention is to provide optional substrate heaters, ion guns and/or sputter etching mechanisms in a chamber, such as in the interface chamber. Such mechanisms perform substrate cleaning and other pre-deposition operations.

In accordance with one specific embodiment of the present invention, the processing path includes six chambers connected in series. The first and last of these chambers comprise respective load and unload chambers and the four intermediate chambers comprise deposition chambers. The deposition chambers contain sputtering devices for successively sputtering materials such as a layer of chromium, a magnetic layer of cobalt platinum, a layer of chromium and a carbon wear layer on substrates transported from the load chamber, through the deposition chambers, and to the unload chamber. Substrates are loaded from a load chamber to a first deposition chamber while a vacuum is maintained in the first and load chambers. Substrates are transferred from a last deposition chamber to an unload chamber while a vacuum is maintained in the last and unload chambers. Substrates are placed in the load chamber while the load and first chambers are isolated from each other and are removed from the unload chamber while the last and unload chambers are isolated from each other.

In accordance with another specific embodiment of the present invention, five such chambers are provided. These chambers include a load chamber, a first deposition chamber having a sputtering device for depositing a first layer of a first substance such as chromium, a second deposition chamber having a sputtering device for depositing a second layer of a second substance such as a magnetic layer of cobalt platinum, a third deposition chamber having a sputtering device for depositing a third substance such as a wear layer of carbon, and an unload chamber. The substrates are transported in this embodiment from the load chamber to the first deposition chamber for deposition of the first layer. Then the substrates are transported to the second deposition chamber for deposition of the second layer and returned to the first deposition chamber for deposition of another layer of the first substance. From the first deposition chamber, the substrates are transported to the third deposition chamber for deposition of a wear layer. From the third deposition chamber, the substrates are transported to the unload chamber. The load and unload chambers are operated as in the first embodiment.

In still another specific embodiment of the invention, the load chamber of the first and second embodiments is replaced with first and second load chambers and an interface chamber. Substrates are delivered from the first load chamber to the interface chamber and then to the first deposition chamber while the second load chamber is isolated and is being loaded with additional substrates. After all of the substrates have been transmitted from the first load chamber to the first deposition chamber, substrates are then transferred from the second load chamber through the interface chamber to the first deposition chamber. At this time, additional substrates are loaded into the first load chamber and the first load chamber is isolated.

It is accordingly an overall object of the present invention to provide an improved system and method for depositing plural thin film layers onto a substrate.

It is still another object of the present invention to provide such a system and method for depositing plural thin film layers onto a substrate with parameters affecting deposition of the various layers being independently controllable for optimization of the deposition of each of the layers.

A further object of the present invention is to provide such a system and method of producing substrates having plural thin film layers and with uniform properties from substrate to substrate.

Another object of the present invention is to provide such a system and method in which the properties of the deposited layers are independently controllable.

It is a more specific object of the present invention to provide an improved system and method for producing thin film magnetic recording discs.

Another object of the present invention is to provide a system and method which enhances the speed of production of substrates with plural deposited layers, such as thin film magnetic recording discs.

Still another object of the present invention is to provide a system and method of producing substrates with plural deposited layers, such as thin film magnetic recording discs, and which minimizes the risk of contamination of the discs during processing.

A still further object of the present invention is to provide such a system which is easy to maintain and which reduces system down time during maintenance.

These and other features, objects and advantages of the present invention will become apparent with reference to the following description and drawings.

BRIEF DESCRIPTION OF THE DRAWINGS

FIG. 2 is a front isometric view of a load chamber of FIG. 1;

FIG. 5 is an isometric view of a valve assembly used to interconnect the chambers of the system of FIG. 1;

FIG. 11 is a front elevational view of a water cooling jacket portion of one form of a radio frequency sputtering target assembly utilized in the radio frequency deposition chamber of FIG. 9;

FIG. 12 is a front elevational view of the surface of the target of one form of a radio frequency deposition target assembly utilized in the radio frequency deposition chamber of FIG. 9;

FIG. 13 is a sectional view of a portion of the target of FIG. 12, taken along lines 13—13 of FIG. 12;

FIG. 19a is an isometric view of an alternate form of substrate carrier utilized in the system of FIG. 1 to support substrates as they are processed by the system;

FIG. 19b is a vertical sectional view of the substrate supporting portion of the carrier of FIG. 19a, taken along lines 19b—19b of FIG. 19a;

FIG. 26 is an isometric view of an end portion of a plunger which lifts the substrate carriers from the transporter and rotates the substrate carriers during deposition, the plunger being shown in FIG. 26 in position for insertion into a hub of a substrate carrier;

FIG. 27 is an isometric view of an end portion of the plunger of FIG. 26, the plunger being shown in engagement with the hub of the substrate carrier;

DETAILED DESCRIPTION OF PREFERRED EMBODIMENTS

General Description of First Embodiment

By way of a specific example, the system and method of the present invention will be described with respect to several preferred embodiments in an application in which plural layers of materials are deposited by vacuum deposition in a low pressure gas environment upon a substrate to form a thin film magnetic recording disc. However, it is to be understood that the system and method is not limited to this exemplary application. That is, the method and system is useful generally when it is desired to vacuum deposit successive layers of materials upon a substrate. By way of additional examples, such applications include the manufacture of thin film optical recording discs, integrated circuit manufacture, and the manufacture of other products.

In general, vacuum deposition, within the meaning of this application, employs a mechanism for ejecting atoms of coating material from a source or target in a low pressure gas environment. The coating material atoms are ejected with sufficient energy to travel to the surface of a substrate for deposition thereon. Vacuum deposition thereby includes techniques such as sputtering, (including DC sputtering, RF sputtering, reactive sputtering, etc.), evaporative deposition, ion plating, and neutralized ion beam coating. It does not ordinarily include chemical vapor deposition, electroplating, or rapid solidification coating techniques. Ion plating is a variation of both sputtering and evaporative deposition which involves the ionization of atoms in the vapor followed by attraction of some portion of the ionized atoms to the substrate with an electric field. Since sputtering is the most important vacuum deposition method used in the present invention, and is representative of the other methods, the remainder of this description will concentrate on sputter deposition. However, the principles discussed hereinafter are to be considered as equally applicable to all vacuum deposition techniques.

Figure 1:
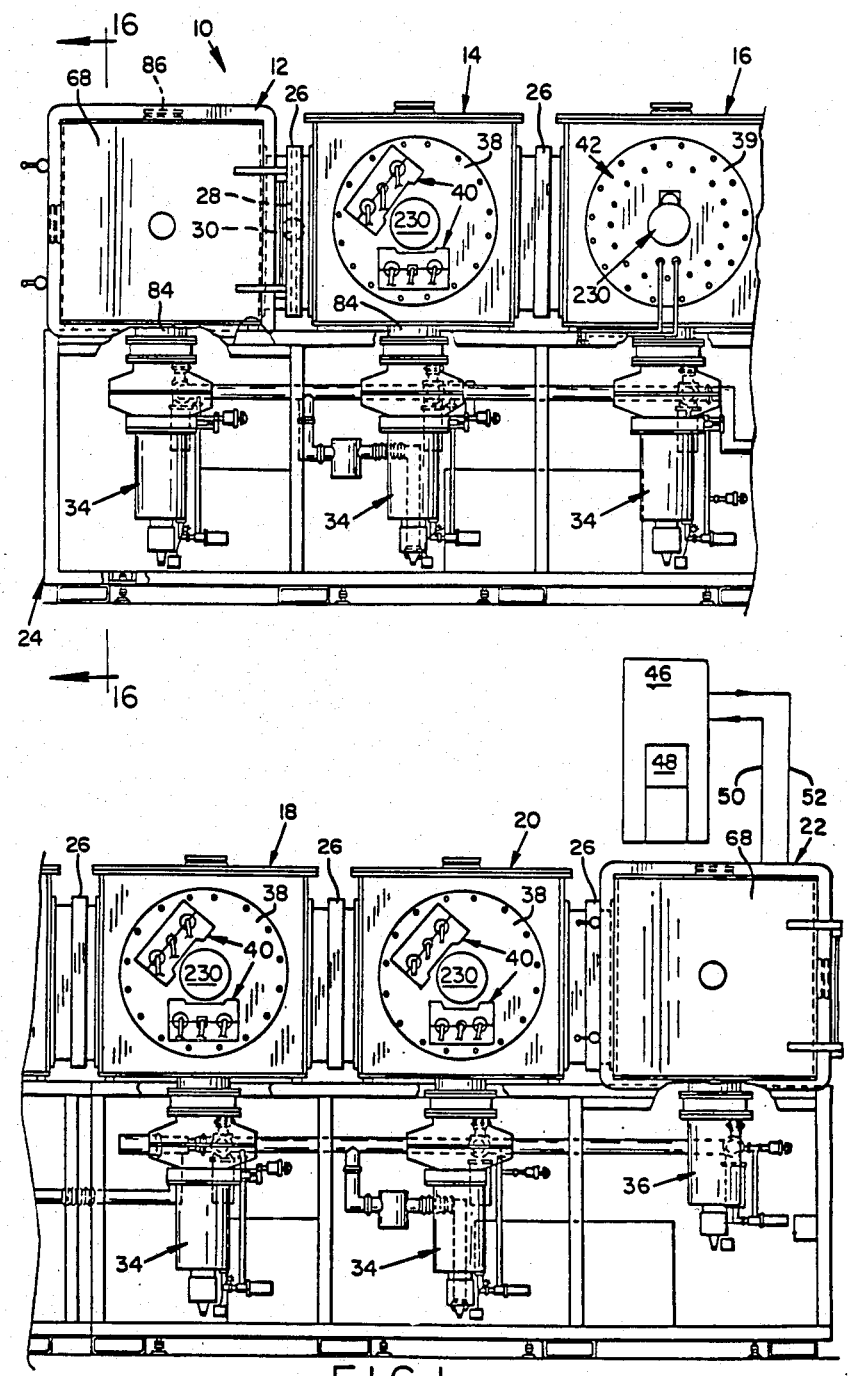
FIG. 1 is a front elevational view of one embodiment of a system for making thin film magnetic discs and other products in accordance with the present invention.

With reference to FIG. 1, a first embodiment of the system 10 includes plural vacuum chambers, which in this form includes six such chambers 12 through 22. These chambers are supported by a frame 24 in a side-by-side relationship. Adjacent chambers are connected together by, and communicate with one another through, a transfer passageway such as valve containing housings 26. Each of these valve housings 26 includes a valve 28, one being shown in dashed lines in FIG. 1. When a valve 28 between two adjacent chambers is open, the adjacent chambers communicate with one another through the valve housing 26. This permits the transfer of substrates through the valve housing and between the chambers. Conversely, when the valve 28 is closed, the adjacent chambers are isolated and sealed by the valve from one another. Valve 28 is operated between its open and closed positions by a solenoid controlled pneumatic cylinder 30, one of which is also shown in dashed lines in FIG. 1.

Each of the chambers 12 through 20 is provided with an independently controllable separate similar high vacuum pumping stack 34 for drawing a vacuum in the associated chamber. An independently controllable vacuum pumping stack 36 is also provided for establishing a vacuum in the chamber 22. Therefore, whenever the valves 28 associated with a particular chamber are closed, the vacuum pumping stack associated with that chamber is capable of adjusting the pressure within such chamber to a desired magnitude. Furthermore, this adjustment may be made independently of the pressure which exists in other chambers of the system. Of course, a single pumping stack may alternately be used for drawing a vacuum in more than one chamber.

In the system of FIG. 1, chamber 12 comprises a substrate load chamber means into which substrates are loaded for processing by the system. Also, chamber 22 comprises a substrate unload chamber means from which processed substrates are removed from the system. In addition, the chambers 14 through 20 comprise processing or deposition chamber means within which layers of material are deposited onto substrates while positioned therein. More specifically, each of the chambers 14 through 20 comprises a sputtering chamber within which material from sputtering targets is sputtered onto the substrates. Furthermore, in the specific illustrated embodiment, because of the type of material being sputtered therein, chambers 14, 18 and 20 comprise DC sputtering chambers while chamber 16 comprises an RF sputtering chamber. A pair of DC sputtering cathode assemblies 40 are mounted by a circular support plate 38 to the front of each of the chambers 14, 18 and 20. In addition, an RF sputtering cathode assembly 42 is mounted by a circular support plate 39 to the front of the chamber 16. Similar assemblies are mounted to the rear of these chambers. These assemblies may be readily replaced by simply removing the support plates 38, 39 and replacing the assemblies with other assemblies mounted to similar plates 38, 39.

During processing, substrates pass along a processing pathway through the chambers and are positioned between the front and rear sputtering assemblies in the deposition chambers 14–20. When in such chambers, both sides of the substrates are simultaneously deposited. That is, the front cathode sputtering assemblies deposit a layer on a front surface of each substrate and the rear cathode sputtering assemblies deposit a layer on a rear surface of each substrate.

As explained in greater detail below, in general, chambers 14 through 22 are evacuated with the valve 28 isolating chamber 12 from chamber 14. Substrates to be processed are loaded in chamber 12 and then this chamber is evacuated. Thereafter, the substrates are transported from chamber to chamber for processing. Because the chambers are isolatable from one another by the valves 28, the desired operating parameters may be established within each chamber for the deposition to be performed therein. At the same time, other parameters may be established in other chambers to optimize the deposition being performed in such other chambers. Furthermore, because of the isolation capabilities of the system, two adjacent evacuated chambers may be isolated from the other chambers. In this case, the substrates may be transported through an open valve 28 between these chambers without losing the vacuum in either of the two chambers.

The isolation capabilities of the chambers facilitates maintenance of the system. During the repair or replacement of cathode assemblies in one or more chambers, such chamber or chambers may be isolated from the other chambers by the valve 28 and then exposed to the ambient environment during the maintenance procedures. As a result, the cathode assemblies in the other chambers are isolated from the ambient environment and are therefore not exposed to contaminants such as water vapor and oxygen. In addition, because of the isolation, a high vacuum can be maintained in all of the chambers except those being repaired. Following repair, less system down time is required because one does not have to reestablish a high vacuum in all chambers of the system, but only in those chambers affected by the maintenance.

After a batch of substrates have been processed, they are removed from the unload chamber 22. During such removal, the unload chamber is isolated from the adjacent processing chamber 20 so that processing may continue during the unloading operation.

The performance of the deposition process is monitored and controlled utilizing a control subsystem including a programmed digital computer 46 in conjunction with one or more terminals 48. Line 50 schematically represents data lines along which signals are transmitted from system sensors and other system components to the control subsystem. In addition, line 52 schematically represents control lines along which control signals are transmitted to the system for controlling the operation of valves and other components of the system during system operation. The programming of computer 46 is explained below.

Load, Unload, and Deposition Chambers

Figure 3:
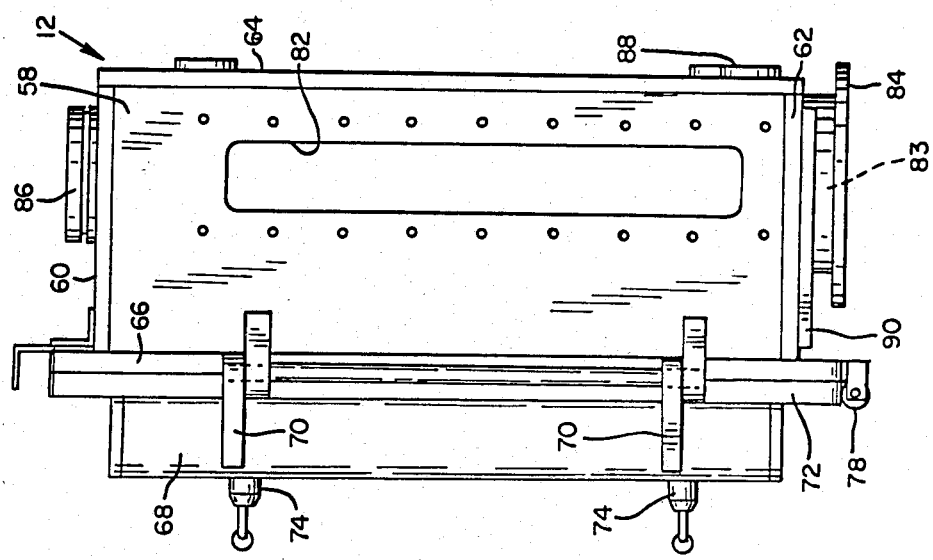
FIG. 3 is a side elevational view of a load chamber of FIG. 2, taken in the direction of lines 3—3 of FIG. 2 to show a substrate pass through opening through which substrates are transferred to an adjoining chamber of the system.

With reference to FIGS. 1 through 3, the housing for load chamber 12 is generally of a rectangular box-like construction having first and second vertical side walls 56, 58, horizontal top and bottom walls 60, 62, and a rear wall 64. In addition, a perimeter flange 66 is attached to the front edges of the top, bottom and side walls and surrounds an opening leading to the interior of the chamber. A door 68 is mounted at one side by hinges 70 to the flange 66. The door includes a perimeter flange 72 which abuts the flange 66 when the door is closed. A seal 67 (FIGS. 16, 18) is provided between the flanges 66 and 72 to tightly seal the door 68 against the chamber flange 66 when the door is closed. A pair of latches 74 are pivotally mounted to the free edge of the door. When pivoted to a latched position, as shown in FIG. 2, latch rollers 76 of these latches abut the rear surface of the flange 66 and secure the door closed. The lower edge of the door is guided to its closed position by a roller 78 supported by a bracket so as to project forwardly from the lower edge of the perimeter flange 66. Therefore, the door is guided to its closed position and tightly held in place when latched.

As best shown in FIG. 3, the wall 58 is provided with a vertically elongated substrate pass through opening 82. Opening 82 communicates with the interior of the valve housing 26 when the system is assembled as shown in FIG. 1. A similar pass through opening is provided through the adjacent side wall of the adjoining deposition chamber, as explained below. Therefore, when the valve 28 is open, the two chambers communicate with one another through these pass through openings and the valve housing. As a result, when the valve 28 is open, the transfer of substrates between adjacent chambers is permitted.

The bottom wall 62 of chamber 12 is provided with an opening 83 (FIG. 3) through which a vacuum is established by the pumping stack 34 (FIG. 1). A cylindrical pumping stack attachment flange 84 surrounds opening 83. Flange 84 projects downwardly from the bottom wall 62 and, as shown in FIG. 1, the pumping stack 34 is attached to flange 84.

Sealed view ports 86 are provided through the top wall 60 and side wall 56 to enable an operator of the system to visually inspect the interior of chamber 12. Ports, one being indicated at 88, through the rear wall 64 of chamber 12, are provided for passage of system components such as transporter drive mechanisms and loader drive mechanisms into the chamber. In addition, other openings, not shown, are provided for pressure guages, air supplies and the like.

When the chamber 12 is mounted to the frame 24, a pair of support bars 90, connected to the underside of chamber bottom wall 62, rest on a horizontal plate portion of the frame 24. This provides a stable support for the chamber. The frame itself is leveled so that the chambers are aligned vertically and the pass through openings 82 are in a straight line.

The unload chamber 22 is a mirror image of the chamber 12 and for this reason will not be described in detail.

Figure 4:
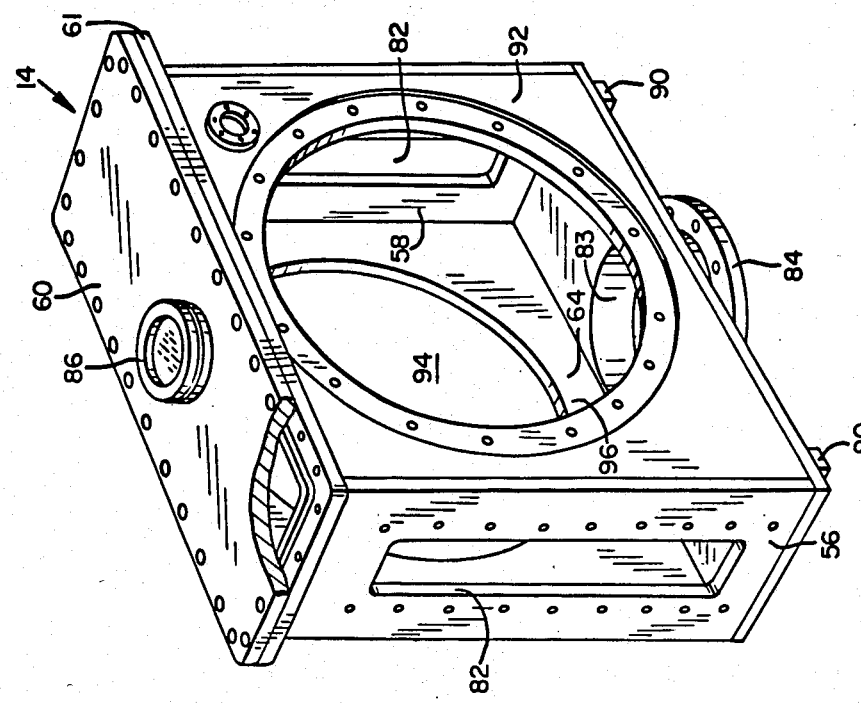
FIG. 4 is a front isometric view of a deposition chamber housing of the system.

With reference to FIGS. 1 and 4, each of the deposition chamber housings is of similar construction. For this reason, the deposition chamber housings will be described with reference to the housing for chamber 14 shown in FIG. 4. Furthermore, the deposition chambers are similar to the load and unload chambers 12, 22. Therefore, components of chamber 14 which correspond to similar components of the unload and load chambers are correspondingly numbered.

Deposition chamber 14 differs from the load chamber 12 in that it lacks a hinged door and a perimeter flange 66. Instead, a front plate 92 is provided at the front of the deposition chamber. The front and rear walls 64, 92 of chamber 14 are provided with circular openings 94, 96. The sputtering assembly support plates 38 and 39 are secured to walls 64, 92 to close these openings and mount the sputtering assemblies 40, 42 in position for deposition within the chambers. Also, because the chambers 14 through 20 are each intermediate to chambers adjacent to each side wall thereof, substrate pass through openings 82 are provided through each of the side walls of these chambers Consequently, substrates may be passed from one chamber to the next during operation of the system 10. The top wall 60 of the deposition chambers is detachably mounted to a flange 61 provided at the upper edges of the chamber front, rear and side walls. A seal is positioned between these components 60, 61. Access to the interior of the deposition chambers is thereby provided from above.

Each of the chambers 12 through 22 are of rigid durable construction and are formed of a strong material such as, for example, stainless steel or aluminum.

Isolation Valves

The valve assemblies for selectively isolating the respective chambers 12 through 22 from each other are illustrated in FIGS. 5 through 8. As previously mentioned, each valve assembly includes a valve housing 26 within which a valve 28 is positioned and operated by a pneumatic cylinder 30 to selectively open and close the valve housing. When the valve is open, a pathway is provided through the valve housing and between adjacent chambers. Conversely, when the valve is closed, the adjacent chambers are isolated, that is sealed, from one another.

Figure 7:
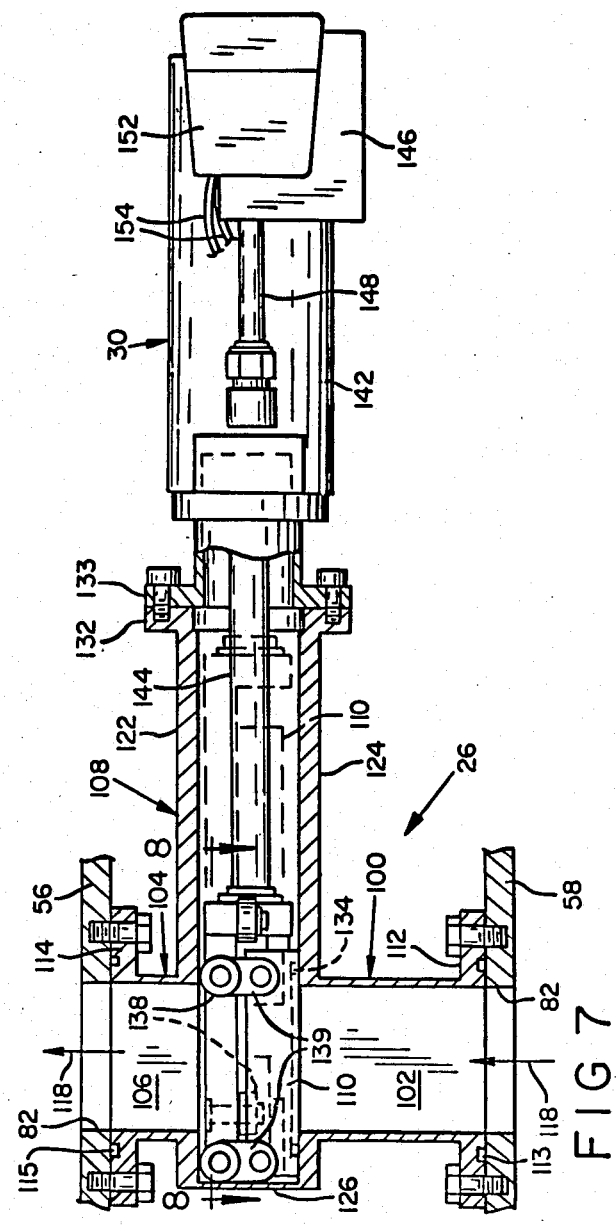
FIG. 7 is a cross sectional view of the valve assembly of FIG. 5, taken along lines 7—7 of FIG. 5.
Figure 8:
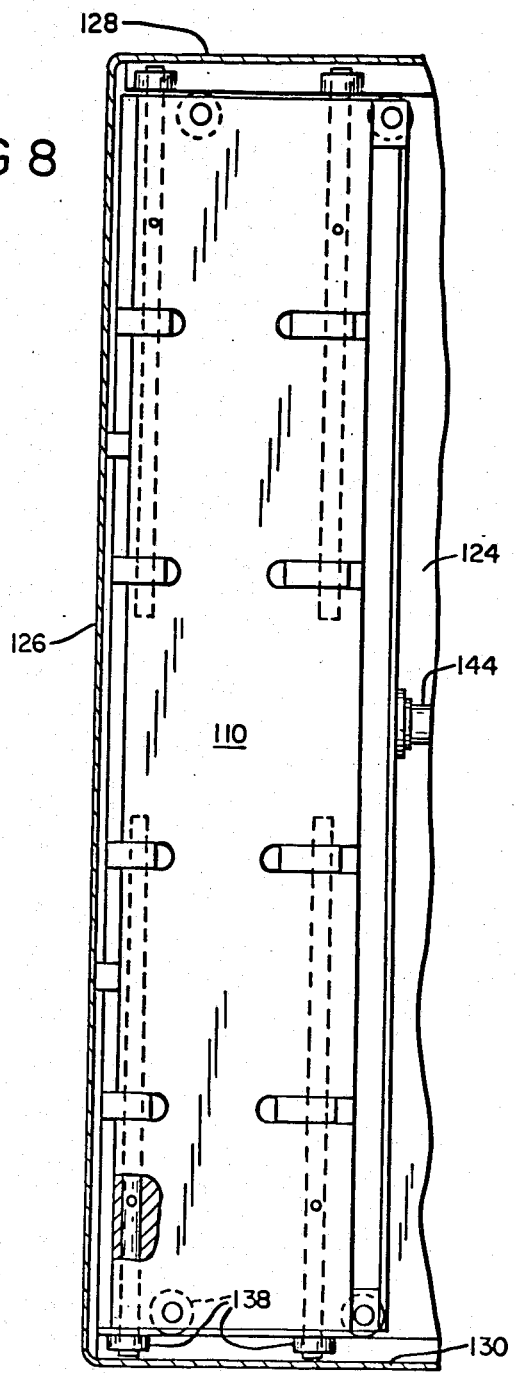
FIG. 8 is a vertical sectional view of a portion of the valve assembly of FIG. 5, taken along lines 8—8 of FIG. 7 to show a gate portion of the valve assembly.
Figure 9:
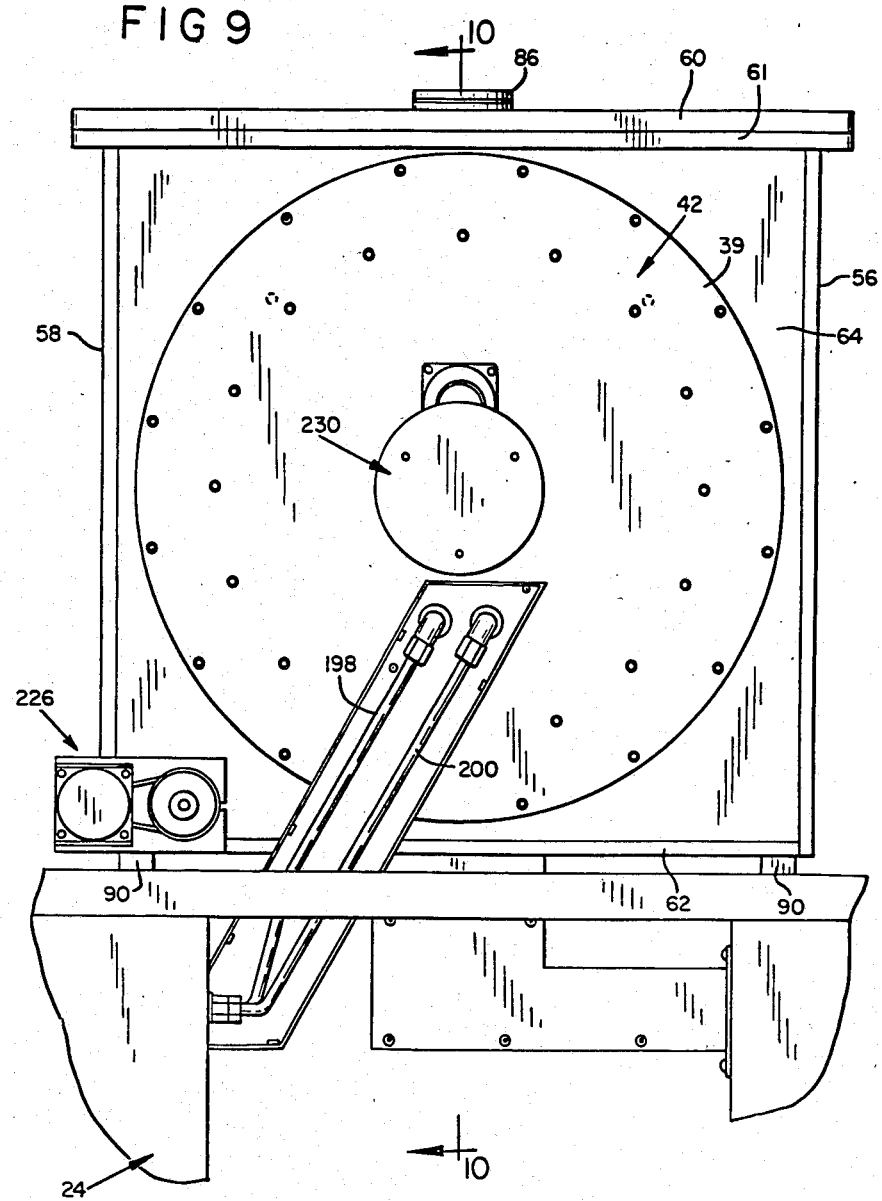
FIG. 9 is a rear elevational view of a radio frequency sputter deposition chamber of the system of FIG. 1.

More specifically, the valve housing 26 includes a first hollow box section 100 which defines an internal first valve passageway 102 and a second hollow box section 104 which defines an internal second valve passageway 106. The valve housing also includes a hollow bonnet 108 intermediate the sections 100 and 104. The valve passageways 102 and 106 communicate with one another through the the valve bonnet except when a valve 28 comprising a gate valve 110 is shifted to a closed position, as shown in FIG. 7. When closed, the valve 110 seals first valve passageway 102 from the second valve passageway 106.

The first and second valve passageways 102 and 106 are of the same cross sectional size and shape as the chamber side wall pass through openings 82. For that matter, in the illustrated embodiment, the openings 82 are sized to permit the passage of components which are three inches wide and twenty-two inches high. The valve section 100 is provided with an attachment flange 112 which is secured to a wall 58 of one of the chambers with the chamber pass through opening 82 aligned with the first valve passageway 102. Also, the valve section 104 is provided with an attachment flange 114. Flange 114 is secured to a wall 56 of an adjacent chamber with the chamber pass through opening 82 aligned with the valve passageway 106. Seals 113 and 115 seal the connection between the respective flanges 112, 114 and walls 58, 56.

Therefore, with the valve 110 moved to its open position shown in dashed lines in FIG. 7, substrates may be transferred through the valve housing 26 between adjacent chambers such as in the direction indicated by the arrows 118. Conversely, when the valve is in the closed position shown in FIG. 7, the adjacent chambers are sealed from one another by the valve. When sealed, substrate transfer between the chambers is blocked and different gas pressure environments may be maintained in the chambers. The valve 110 provides effective sealing between the chambers. The illustrated valve has a maximum leak rate of $1 \times 10^{-9}$ atmospheres per cubic centimeter per second when sealed against a one atmosphere differential in either direction across the valve.

The bonnet section 108 is of rectangular box-like construction with parallel spaced apart vertical side walls 122, 124 and an end wall 126. The other end of the bonnet section is closed by a cover 133 mounted to a flange 132. A top wall 128 and bottom wall 130 complete the bonnet. One surface of the valve 110 engages the interior surface of wall 124 as the valve is moved between open and closed positions. A valve seal 134 carried by valve 110 is positioned between the valve and wall 124. Seal 134 surrounds the valve passageway 102 for sealing purposes when the valve is closed. Rollers, for example, 138 in FIGS. 7 and 8, bear against interior surfaces of the bonnet wall 122 and urge the valve 110 against the wall 124. More specifically, the rollers 138 are pivoted to valve 110 by links 139 (FIG. 7). As the valve approaches a closed position, the rollers 138 which lead the motion abut the end wall 126. Continued motion of the valve 110 causes the links 139 coupled to such rollers to pivot so that rollers 138 bear against wall 122 and urge valve 110 against wall 124.

Figure 6:
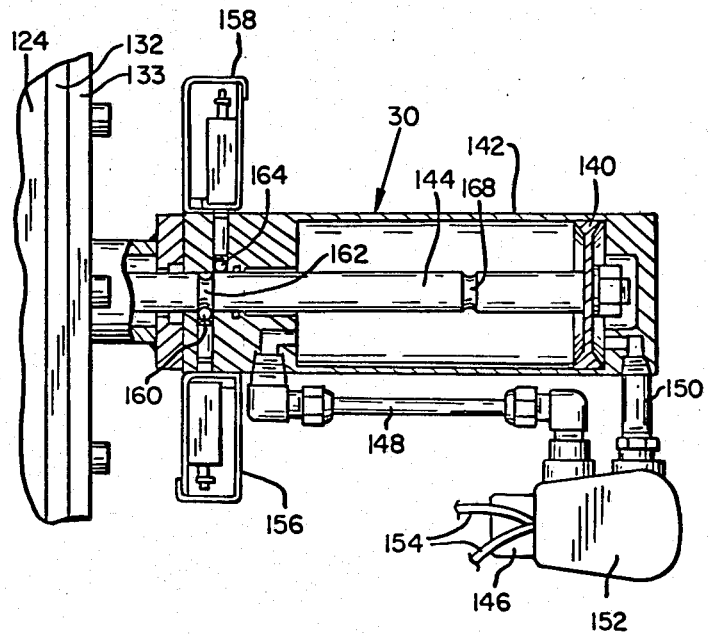
FIG. 6 is a vertical sectional view of a portion of the valve assembly of FIG. 5, taken along lines 6—6 of FIG. 5.

As previously mentioned, a cylinder 30 is utilized to shift the valve between its open and closed positions. Cylinder 30 is pneumatically operated and, as shown in FIG. 6, has a piston 140 positioned within a cylinder housing 142. A piston rod 144 extends from piston 140, through a seal, and into the bonnet 108 wherein the end of the piston rod engages the valve 110. An airflow valve 146, controlled by a solenoid 152, directs air either through a conduit 148 or a conduit 150. With air directed through conduit 148, the piston 140 is shifted to the right as shown in FIG. 6 and the valve 110 is open. Conversely, with air directed through conduit 150, the piston 140 is shifted to the left in FIG. 6 and the valve 110 is closed. Solenoid 152 controls the position of the valve 110 in response to control signals generated by the computer 46 (FIG. 1). Conductors 154 deliver power to the solenoid.

First and second valve position sensing limit switches 156, 158 are provided for detecting the respective open and closed positions of the valve and transmitting a signal indicating the valve position to the computer. With reference to FIG. 6, when the valve is in an open position as shown in this figure, a spring biased stem 160 of sensor 156 is positioned in an annular groove 162 formed in the piston rod 144. When the stem 160 is in this position, a valve open indicating signal is transmitted by the sensor 156 to the computer. At the same time, the stem 164 of the sensor 158 is held in a retracted position by the piston rod 144. In contrast, when the valve is in a closed position, the stem 164 is positioned in an annular groove 168 formed in the piston rod. When stem 164 is in groove 168, a valve closed indicating signal is sent from the sensor 158 to the computer. At the same time, the piston rod 144 holds the stem 160 in a retracted position. In this manner, the position of each valve is monitored and controlled by the computer.

Thus, valve housings 26 provide one form of a transfer passageway through which chambers of the system 10 may communicate with one another. Furthermore, the illustrated valve structure provides one form of effective means for selectively isolating the respective chambers from one another.

Deposition Processing Chambers

The processing chambers 14, 16, 18 and 20 are shown in FIGS. 9 through 15. During substrate processing, as explained below, substrates are first transported from the load chamber 12 to the deposition chamber 14. Sputtering is performed in chamber 14 to simultaneously deposit each side of substrates positioned therein with an underlayer, such as of chrome. Thereafter, the substrates are transported to chamber 16 wherein a second layer is simultaneously sputtered onto each side of the substrate. The second layer may comprise a magnetic material, such as a cobalt platinum layer. From chamber 16, the substrates are transported to chamber 18 wherein a third layer is sputtered simultaneously onto both sides of the substrates. This third layer may be of chrome and comprises an oxidation barrier which minimizes diffusion of potentially corrosive oxygen through the third layer to the magnetic layer. The partially processed substrates are then transferred to processing chamber 20. In chamber 20, a wear layer, such as of carbon, is simultaneously sputtered onto both sides of the substrates to complete the processing. From chamber 20, the substrates are transferred to the unload chamber 22 for subsequent removal from the system.

Radio Frequency Sputtering Chamber

In the illustrated embodiment, chamber 16 comprises a radio frequency deposition chamber and can be readily understood with reference to FIGS. 9 through 12. First and second vertically oriented radio frequency cathode assemblies 42 are supported within the chamber 16 along the front and rear walls of the chamber. Inasmuch as these assemblies are similar, only the front assembly will be described in detail. As previously mentioned, assembly 42 is mounted to support plate 39 which is in turn mounted to the front wall 92 of the deposition chamber. An optional central cylindrical view port may be used to provide visual access to the interior of the chamber through plate 39. An annular target insulator 172 is secured to the support plate 39. The insulator supports a water cooling jacket to which a sputtering target 174 is mounted. The sputtering surface 176 of target 174 is parallel to the front wall of the chamber and also to the front surface of substrates positioned in the deposition chamber.

Figure 10:
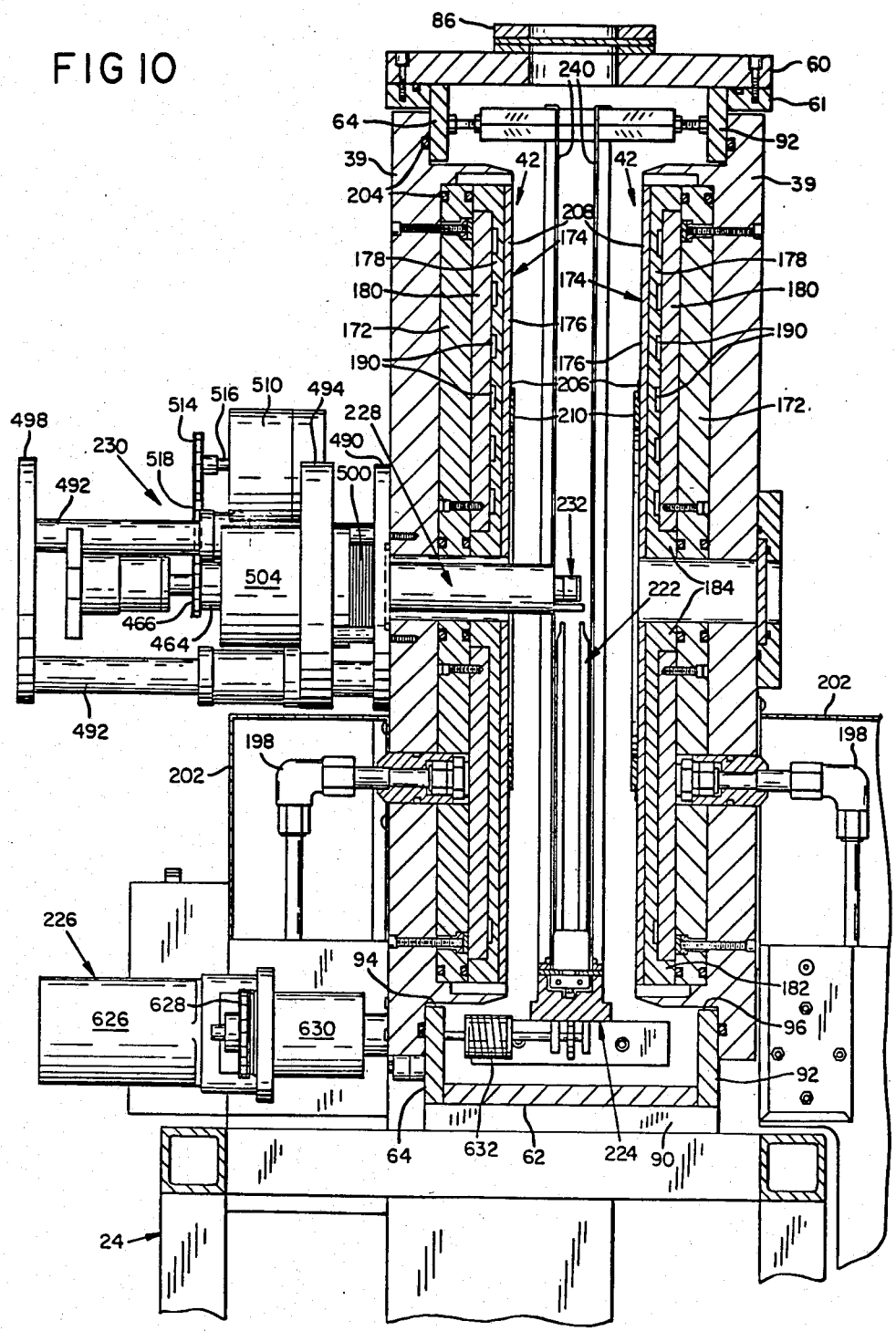
FIG. 10 is a vertical sectional view of the radio frequency deposition chamber of FIG. 9, taken along lines 10—10 of FIG. 9.
Figure 12A:
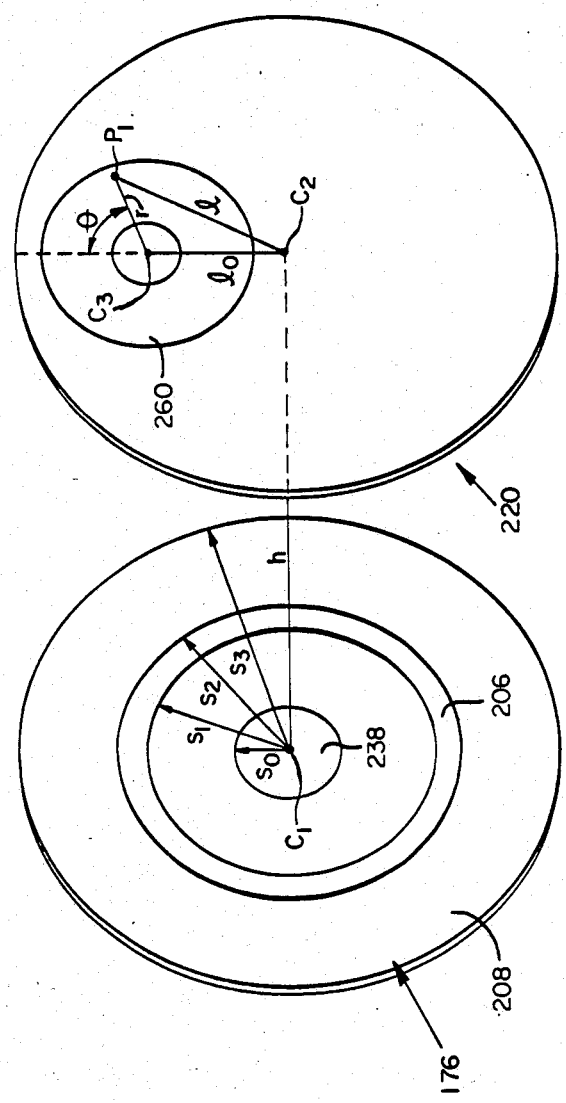
FIG. 12a is a diagram showing variables in a mathematical model for calculating the percentage concentration of two substances, sputtered by the target of FIG. 12, at a point on the surface of a substrate.

The water cooling jacket includes a jacket front 178 to which a jacket back plate 180 is secured. The jacket front 178 and the jacket back plate 180 are formed of an electrically conductive material such as copper. As shown in FIG. 11, the jacket front 178 is annular and includes an outer circular rib or wall portion 182 and an inner annular hub 184. The jacket back plate 180 is annular and when mounted to jacket front 178, as shown in FIG. 10, has its outer surface flush with the outer surfaces of wall 182 and hub 184. Channels 190 are formed in the surface of jacket front 178. These channels are separated by channel defining walls which abut the inner surface of back plate 180 to close the channels when the jacket back plate and jacket front are assembled. Thus, together with the back plate 180, these channels provide a circuitous cooling water flow path through the cooling jacket. Thus, cooling water enters an inlet 192 and flows in the channels in the direction of arrows 194 to an outlet 196. This cooling water maintains the operating temperatures of the sputtering targets 174 at desired levels.

Water supply and return lines 198, 200 (FIG. 9) are respectively connected to inlet 192 and outlet 194 to circulate cooling water to and from the cooling jacket. The conduits 198, 200 may be electrically conductive and used to supply RF power to the target structure as well as the coolant fluid. Typically, however, RF power is supplied along water supply line 198 while water return line 200 is of an insulating material, such as plastic. A water line shield 202 is mounted to the support plate 39 and protects the water supply and return lines at the location where they enter chamber 16. Seals, some being numbered at 204, seal the chamber 16 so that a high vacuum may be drawn by the vacuum pumping stack 34.

In the FIG. 1 system, chamber 16 is the chamber within which deposition of the working magnetic layer of a thin film magnetic disc is accomplished. In the illustrated embodiment, this magnetic layer is formed by sputtering a target 174 composed of cobalt and platinum.

To understand the sputtering process, basic information concerning the materials transport system described in detail below is needed. In general, substrates 260 to be processed are supported by a carrier 220 (FIG. 19) with the carrier and substrates being transported from chamber to chamber by robots or transporters 222 (FIG. 10). The transporter 222 is supported on a track 224 and driven by a transporter drive mechanism 226. During sputtering, the carriers 220 are supported in a vertical plane with the substrates 260 centered between the two target assemblies 42 of the deposition chamber. More specifically, the transporter 222 positions the carrier in the center of the deposition chamber 16. When so positioned, a plunger 228 is operated by a plunger drive mechanism 230 to first shift the plunger axially to insert a carrier gripping tip portion 232 of the plunger into a hub 278 (FIG. 19) of the carrier. The plunger tip then grips the carrier and lifts it upwardly from the transporter 222. The transporter 222 is then driven to a parked position within the chamber, but out of the way of the cathode assemblies 42 and the deposition process. Additionally, the plunger 228 is rotated to thereby rotate the carrier. The discs 260 are supported (i.e., by sheaves 288 (FIG. 19) or in grooves 283 (FIG. 19a)) such that rotation of the plunger causes the discs to move in a planetary manner past the sputtering targets 174. An opening 238 (FIG. 12) is provided through the target 174 to permit passage of the plunger 228 through the target and into the deposition chamber.

Referring again to the target 174 used in depositing the magnetic working layer, the target may be a homogeneous cast mixture of platinum and cobalt with the percentage of the platinum being controlled to establish the magnetic properties of the resulting sputtered layer.

As one example, a ninety-six percent cobalt to four percent platinum target is suitable. However, because of the expense and difficulties of casting a homogeneous target, in the illustrated embodiment, the target 174 is formed by mounting a platinum ring 206 concentrically to the surface of an annular cobalt plate 208. A concentric cobalt ring 210, with an outside diameter which is less than the diameter of the platinum ring, holds the platinum in place. The ring 210 has an annular recess 212 for receiving the inner margin of the platinum ring. Threaded fasteners 214, recessed into cobalt ring 210, secure the cobalt ring 210 to the plate 208 and thereby clamp the platinum ring 206 in place. Cobalt plugs 216 overlie the fasteners 214. Plugs 216 are press fit into the fastener receiving recesses of ring 210. Thus, the sputtering surface 176 of the target 174 is entirely of cobalt, except for the exposed portion of the platinum ring.

The area or width of the platinum ring which is exposed determines the platinum to cobalt ratio which is sputtered onto a substrate. Moreover, over a limited range (i.e., from approximately a zero to a twenty percent platinum concentration), the higher the platinum concentration, the higher the coercivity of the resulting magnetic layer. Therefore, by adjusting the magnitude of the exposed area of the platinum ring, a degree of control of the coercivity of the resulting disc is achieved.

In general, to obtain a film of a desired platinum concentration percentage, the ratio of the exposed area of the platinum ring to the total target area should equal this desired percentage. Thus, to form a magnetic layer having a platinum concentration of three percent, the exposed area of the platinum ring should constitute about three percent of the total target sputtering surface area, the remaining ninety-seven percent being cobalt. The area of the platinum ring 206 which is exposed, and thereby the platinum concentration, is readily controlled by controlling the outside diameter of the cobalt cover ring 210. The diameter of cover ring 210 may be varied as desired to expose the desired area of the platinum ring. Therefore, the percentage content of platinum in the sputtered magnetic layer is readily adjustable, controllable and predetermined as desired.

Figure 17:
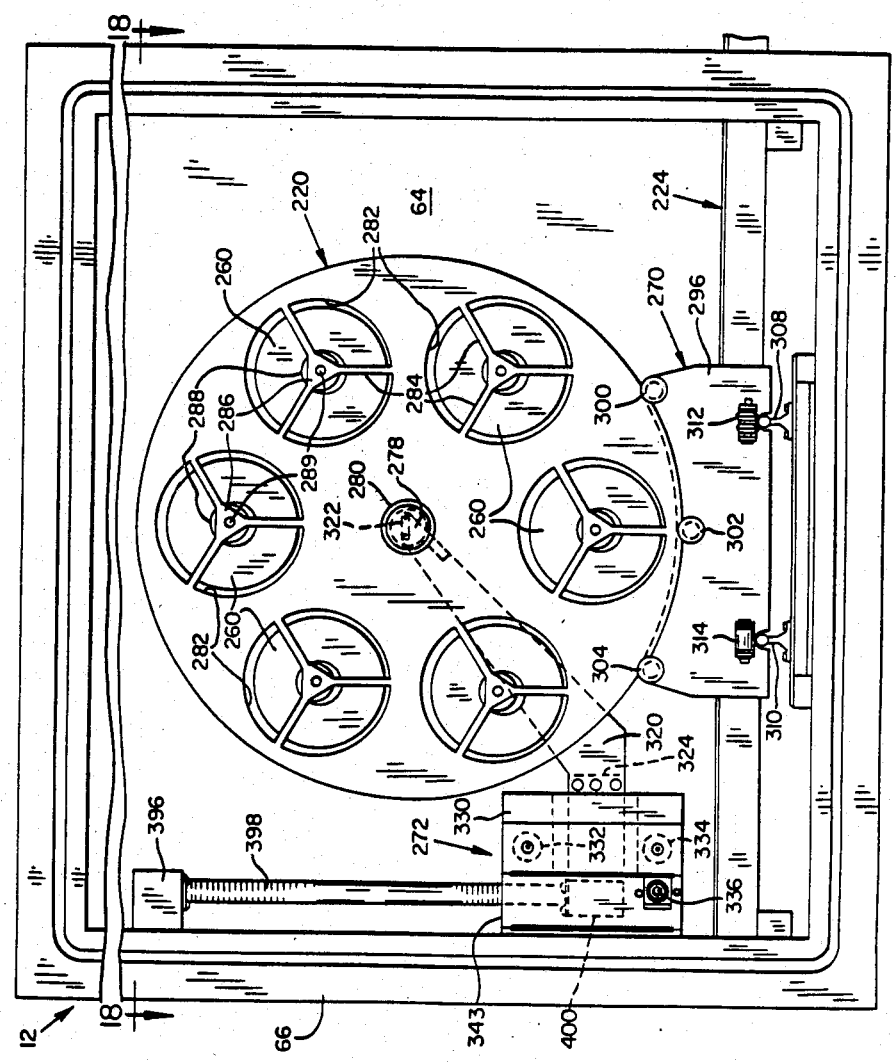
FIG. 17 is a vertical sectional view of the chamber of FIG. 16, taken along lines 17—17 of FIG. 16.

As a more specific example, assume plural ninety-five millimeter discs are supported (as shown in FIG. 17) on sheaves 288 mounted on a circular carrier 220 and spaced at a radius of 7.28 inches from the center of the carrier to the center of the sheaves. In this example, also assume that, when in deposition chamber 16, a two inch horizontal spacing exists between the front and rear sputtering surfaces 176 and the adjacent surfaces of substrates 260. In addition, assume the target 174 has a cobalt plate 208 which is about 0.25 inches thick and is about twenty-four inches in outside diameter. Also, assume the platinum ring 206 is about 0.30 inches thick, 12.6 inches in outside diameter and 11.6 inches in inside diameter. In addition, assume the cobalt cover ring 210 has an inside diameter of about 10.5 inches and an outside diameter of 12.28 inches. Also, assume the thickness of the cover ring 210, where it contacts the cobalt plate 208, is about 0.096 inches. Thus, the inner diameter of the exposed portion of the platinum ring is 12.28 inches. When planetary motion is imparted to the substrates as explained in connection with a description of carrier 220 below, and sputtering is performed as explained below, the resulting magnetic layer has approximately a three to four percent platinum concentration. Also, when this specific platinum ring is substantially totally exposed, the resulting platinum concentration is about ten percent, although this varies with different substrate sizes. Also, a zero percent platinum concentration results when the platinum ring is totally covered by cobalt. Other results are obtained for other disc sizes and geometries.

Each of the cathode sputtering assemblies 42 is powered by a commercially available source, such as a three kilowatt radio frequency diode source produced by Plasma Products, Inc. and designated model number HFS-3000D. In addition, commercially available radio frequency automatic matching networks 674 (FIG. 30), such as network model number AMN-300E available from Plasma-Therm, Inc., are employed in a conventional manner.

During sputtering in chamber 16, substrates 260 are placed in the previously evacuated chamber. The chamber is then pressurized with approximately seven microns of argon sputtering gas. The sputtering gas is ignited in a conventional manner to provide a plasma in the chamber. Also, power is delivered to the target 174 to cause sputtering. The carrier and substrates are grounded through the plunger 228. As the plunger rotates, planetary motion is imparted to the substrates and the targets deposit cobalt and platinum on the substrates supported by the carrier. With 1800 watts of power delivered to each target 174, in approximately two and one-half minutes, a four hundred angstrom magnetic layer is produced. Although the thickness may be varied and still result in a satisfactory magnetic thin film recording disc, a four hundred angstrom layer is highly satisfactory.

Also, when supported for planetary motion, the substrates move relative to the sputtering surface 176 during sputtering. Moreover, any given point on the substrate is continuously shifted relative to points on the target sputtering surface 176 which are intersected or mapped by a horizontal line projecting from the given point to the sputtering surface. More specifically, any given point on the substrate maps inwardly and outwardly spiraling paths on the sputtering surface 176. Thus, the given point and other points on the substrate surfaces are not constantly sputtered by the same region or regions of the sputtering surface 176 during deposition. As a result, any non-uniformities in sputtering from particular regions of the target 174 tend to be averaged so that a layer of consistent thickness is sputtered onto the substrates. That is, substrate motion relative to the target is such that non-uniformities in sputtering from particular regions of the target are uniformly integrated or averaged over the sputtered surface of the substrate.

Furthermore, the deposition rate is uniform to within five percent at the substrate plane at locations from approximately three and one-half inches to ten inches from the center of the plunger 228. Thus, the system is usable in producing various sized thin film magnetic discs by supporting such discs at locations on the carrier where uniform deposition occurs. Common disc sizes processed by the system include ninety-five millimeter (three and one-half inch) diameter discs, one hundred thirty millimeter (five and one-fourth inch) diameter discs, and two hundred ten millimeter (eight inch) diameter discs. Magnetic coercivity is affected by the thickness of the sputtered magnetic layer and also by the thickness of the underlying chromium layer. Therefore, by controlling these thicknesses from disc to disc, the resulting discs have a consistent coercivity. For example, the coercivity may be controlled to within twenty oersteds from disc to disc.

Furthermore, the use of a target 174 with a platinum ring 206, enables the establishment of a radial coercivity gradient in the resultant disc. When discs are used in typical magnetic recording disc drive applications, the disc is annular, is rotated, and a read-write head is positioned to fly over and read or write on concentric tracks on the disc. The speed of travel of the head, relative to the disc, is greater and the head flies higher over the disc when the head is reading or writing onto outer tracks at outer diameters of the disc in comparison to inner tracks at inner diameters. Also, in magnetic recording discs, the recording density is much higher on tracks approaching the inner diameter of the disc in comparison to the density on tracks toward the outer diameter.

Assuming a disc has a magnetic layer with a constant radial coercivity, writing in tracks near the outer diameter of the disc is impossible or unreliable unless the writing current is increased at such outer diameter tracks. Increased writing current is required because the head flies higher above the disc surface as the head moves outwardly from inner to outer tracks of the disc. In order to write with a constant current, which in many applications is highly desirable, the radial coercivity of the magnetic layer must be adjusted so as to decrease as the flying height of the head increases. In other words, the coercivity of the disc should decrease with increasing radial distance from the center of the disc.

Therefore, discs with a radial coercivity gradient are desirable, with the radial coercivity decreasing in a radial outward direction from inner to outer diameters on the disc. In the present system such a gradient is established by progressively decreasing the concentration of the platinum in the cobalt of the magnetic layer from inner to outer diameters of the disc. As the platinum concentration decreases, the coercivity decreases. The gradient is also enhanced by varying the thickness of the first sputtered chromium under layer as explained below.

In the illustrated embodiment, by sizing the platinum ring 206 such that the center of the exposed portion of the ring is nearly centered on the center of the sheaves 288 (FIG. 19) of the carrier 220, a radial coercivity gradient is produced which is about fifty oersteds from inner to outer diameters of the discs. As the platinum ring size is changed to shift the center of the ring away from the center of the sheaves 288, the radial coercivity gradient approaches zero and then reverses.

The percentage platinum concentration at locations on a substrate, and thereby the radial coercivity gradient, which results from a particular platinum cobalt target configuration may be experimentally measured. In addition, the percentage platinum concentration resulting from sputtering with a target 174 comprised of a platinum ring 206 concentrically mounted on an annular or circular cobalt plate 208 may be predicted with some accuracy by the following mathematical model, which is described with reference to FIG. 12a.

In this model, the following definitions are used:

Target Plane: The plane 176 defined by the surface of the cobalt plate 208.

Substrate Plane: The plane which is parallel to the target plane and which contains the surfaces of the disc substrates 260 being sputtered from the target as the substrates rotate on the substrate carrier 220.

An equation (Equation A) describing sputtering from a single infinitely narrow ring of a homogeneous target to any arbitrary point in the substrate plane is given in a prior art publication, entitled *Handbook of Thin Film Technology*, edited by Maissel and Glang, published 1970, at page 1-58, as follows:

$$\dot{N} = \frac{Cs[1 + (l/h)^2 + (s/h)^2]ds}{h^2[[1 - (l/h)^2 + (s/h)^2]^2 + 4(l/h)^2]^{3/2}} \quad (A)$$

Where:

N = the deposition rate (atoms per unit time) at a point P$_1$ at radius l in the substrate plane.

C = a constant proportional to the sputter rate or yield of the target material.

s = a variable representing the radius of the target ring, from the origin C$_1$ of the target, in the target plane.

l = a variable representing the radius from the origin C$_2$ of the substrate plane to the point P$_1$. The origin C$_2$ of the substrate plane being on a line normal to the target plane and passing through the origin C$_1$ of the target plane.

h = a variable representing the distance separating the target plane and the substrate plane (i.e., the distance from C$_1$ to C$_2$).

For a ring 206 of platinum exposed on a cobalt plate 208, the ring 206 having an inside radius of S$_1$ and an outside radius of S$_2$ (each radius being measured from center C$_1$), the equation (Equation B) can be integrated as follows:

$$\dot{N}_{Pt}(l) = \frac{C_{Pt}}{h^2} \int_{S_1}^{S_2} \frac{s[1 + (l/h)^2 + (s/h)^2]ds}{[[1 - (l/h)^2 + (s/h)^2]^2 + 4(l/h)^2]^{3/2}} \quad (B)$$

Similarly, for a target surface 176 with an outside radius of S$_3$ extending to an inside radius of S$_o$, and which is entirely of cobalt except for the above described platinum ring 206, the following equation (Equation C) can be written:

$$\dot{N}_{Co}(l) = \frac{C_{Co}}{h^2} \left[ \int_{S_0}^{S_1} \frac{s[1 + (l/h)^2 + (s/h)^2]ds}{[[1 - (l/h)^2 + (s/h)^2]^2 + 4(l/h)^2]^{3/2}} + \right.$$

$$\left. \int_{S_2}^{S_3} \frac{s[1 + (l/h)^2 + (s/h)^2]ds}{[[1 - (l/h)^2 + (s/h)^2]^2 + 4(l/h)^2]^{3/2}} \right] \quad (C)$$

In the above equations, the subscripts Pt and Co refer respectively to platinum and cobalt. For a point P$_1$ on a disc 260 located on a carrier 220:

$$l = l_o + r\cos\phi$$

where l$_o$ = the radius from the center C$_3$ of the disc substrate 260 to the center C$_2$ of the substrate plane; and r, $\phi$ = coordinates of a point P$_1$ on the substrate disc 260 relative to its geometric center C$_3$.

Note: As an approximation, the center C$_3$ of the substrate is assumed to be at the center of the supporting sheave 288. This is valid when the sheave diameter is similar to the diameter of the center hole in the disc 260. Equations (B) and (C) become:

$$N_{Pt}(r,\phi) = N_{Pt}(l_o + r\cos\phi)$$

$$N_{Co}(r,\phi) = N_{Co}(l_o + r\cos\phi)$$

where N$_{Pt}$(l$_o$ + r cos$\phi$) and N$_{Co}$(l + r cos$\phi$) imply the same functional dependence described in equations (B) and (C) with l$_o$ + r cos$\phi$ substituted for l.

The motion of a point P$_1$ on the disc substrate 260 as it undergoes planetary motion during rotation of the substrate carrier 220 is accounted for by integrating over the angle $\phi$:

$$\overline{\dot{N}}_{Pt}(r) = \frac{1}{2\pi} \int_0^{2\pi} \dot{N}_{Pt}(l_o + r\cos\theta)d\theta$$

$$\overline{\dot{N}}_{Co}(r) = \frac{1}{2\pi} \int_0^{2\pi} \dot{N}_{Co}(l_o + r\cos\theta)d\theta$$

Then, the alloy composition (percentage platinum %Pt(r)) for a point P$_1$ at radius r on the disc substrate is given as:

$$\% \text{Pt}(r) = 100 \left[ \frac{\overline{\dot{N}}_{Pt}(r)}{\overline{\dot{N}}_{Co}(r) + \overline{\dot{N}}_{Pt}(r)} \right]$$

Also, the thickness of the deposition at a radius r$_1$ relative to the thickness at another radius r$_o$ is approximated as:

$$\frac{\text{Thickness}(r_1)}{\text{Thickness}(r_o)} \cong \frac{\overline{\dot{N}}_{Co}(r_1) + \overline{\dot{N}}_{Pt}(r_1)}{\overline{\dot{N}}_{Co}(r_o) + \overline{\dot{N}}_{Pt}(r_o)}$$

The above integrals are best evaluated using standard numerical techniques. From these integrals, the percentage concentration of platinum at specified radial distances from the center of the substrate may be calculated. In addition, the radial concentration gradient may also be calculated and used in predicting the performances of discs produced from a given target configuration.

As a specific example, the atomic percentage concentration of platinum at point P$_1$, was calculated to be 5.0% when the following parameter values were used:

| | |
|---|---|
| l$_o$ = | 7.28 inches |
| r = | 1 inch |
| S$_0$ = | 0 inches |
| S$_1$ = | 6.076 inches |
| S$_2$ = | 6.300 inches |
| S$_3$ = | 12.0 inches |
| h = | 2 inches |
| $\frac{C_{Pt}}{C_{Co}}$ = | 1.14 |

The relative sputter rate for cobalt and platinum can be estimated from published tables of sputter yields. For example, at table 2, page 4-40 of the above-mentioned *Handbook of Thin Film Technology*, the sputter yields for cobalt and platinum sputtered in Argon with an ion bombarding energy of 600 volts are given as 1.4 and 1.6 respectively. The ratio of C$_{Pt}$ to C$_{Co}$ is then 1.14, as set forth above.

The above calculated percentage concentration compares well with an average measured platinum concentration of 4.8% as measured by Rutherford Backscatter, for a sample which was sputtered using the geometry described by the parameter values listed above.

Sputtering shields 240 are also provided within the deposition chambers to focus the deposition on the substrate and to shield other areas of the chamber from undesired depositions.

The illustrated deposition chamber 20 is like chambers 14 and 18. However, it may be a radio frequency sputtering chamber like chamber 16. In this case, unlike chamber 16, chamber 20 deposits a wear resistant material on substrates positioned therein.

As an example, radio frequency reactive sputtering of a cobalt-oxide wear layer may be employed. In this example, a cobalt target is used and the chamber 20 is pressurized to approximately seven microns with a sputtering gas comprised of twenty percent oxygen and eighty percent argon. A typical sputtering time is 5.6 minutes at two kilowatts power to the sputtering targets. This results in a wear layer of approximately five hundred angstroms. Such a layer has provided satisfactory wear resistance when subjected to ten thousand computer disc drive head start/stop cycles. Alternately, as another example, DC sputtering may be employed in chamber 20 to deposit a carbon wear layer as explained below.

Such wear layers provide protection to the underlying layers deposited on the substrates. In connection with understanding this wear protection, assume the substrates comprise magnetic recording discs used in computer disc drives. Whenever the power is shut off to an operating disc drive, the rotating disc slows down and the head of the disc drive ceases to fly and begins to drag on the disc. The wear layer increases the life of the disc by minimizing wear from the head dragging on the disc when power is shut off.

Because the chambers are isolatable from one another as explained above, the parameters affecting sputtering, such as sputtering gas pressure, sputtering gas, sputtering time and power, in the individual chambers may be optimized for the particular sputtering deposition being performed.

Direct Current Sputtering Chambers

Figure 14:
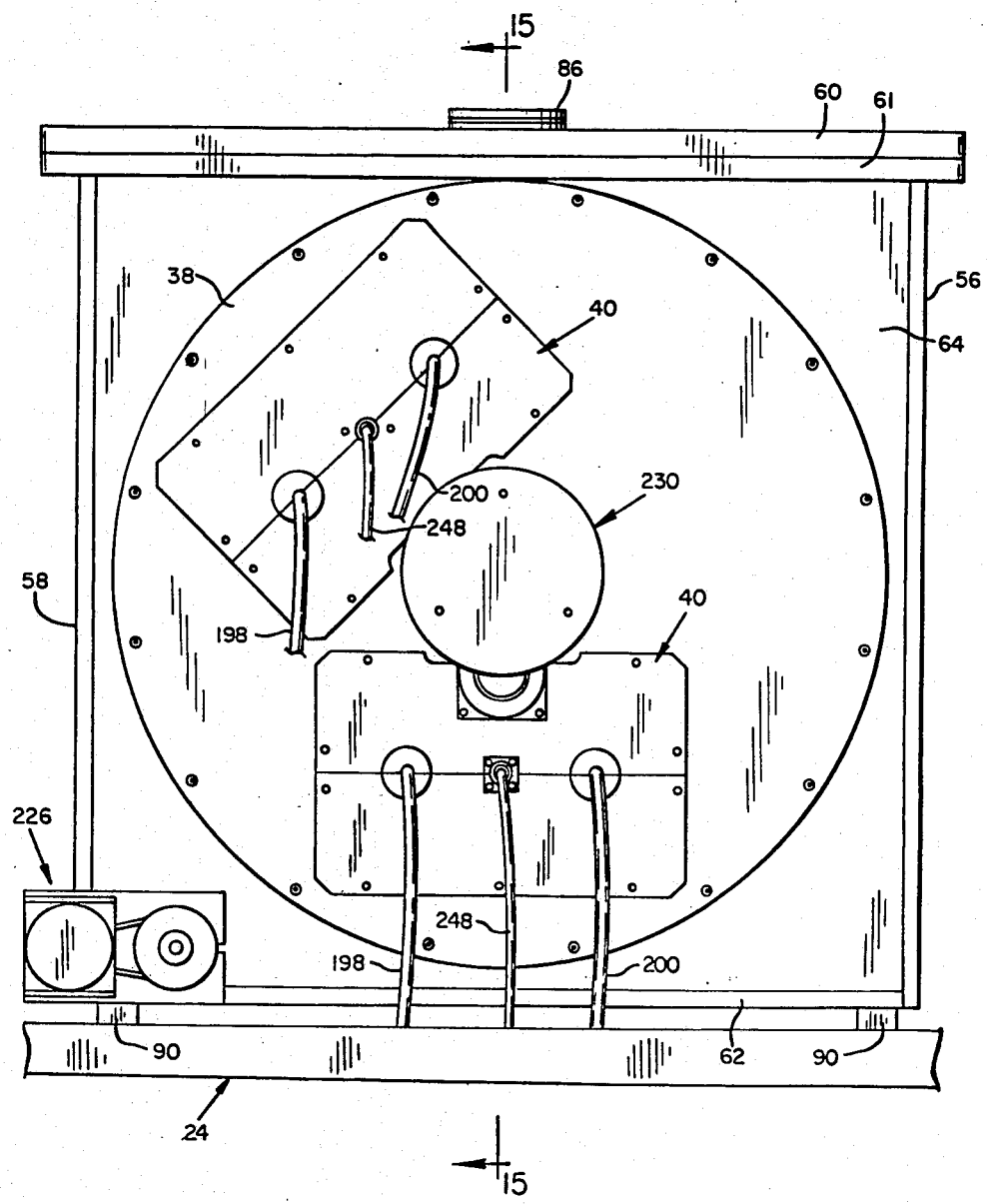
FIG. 14 is a rear elevational view of a direct current sputter deposition chamber of the system of FIG. 1.
Figure 15:
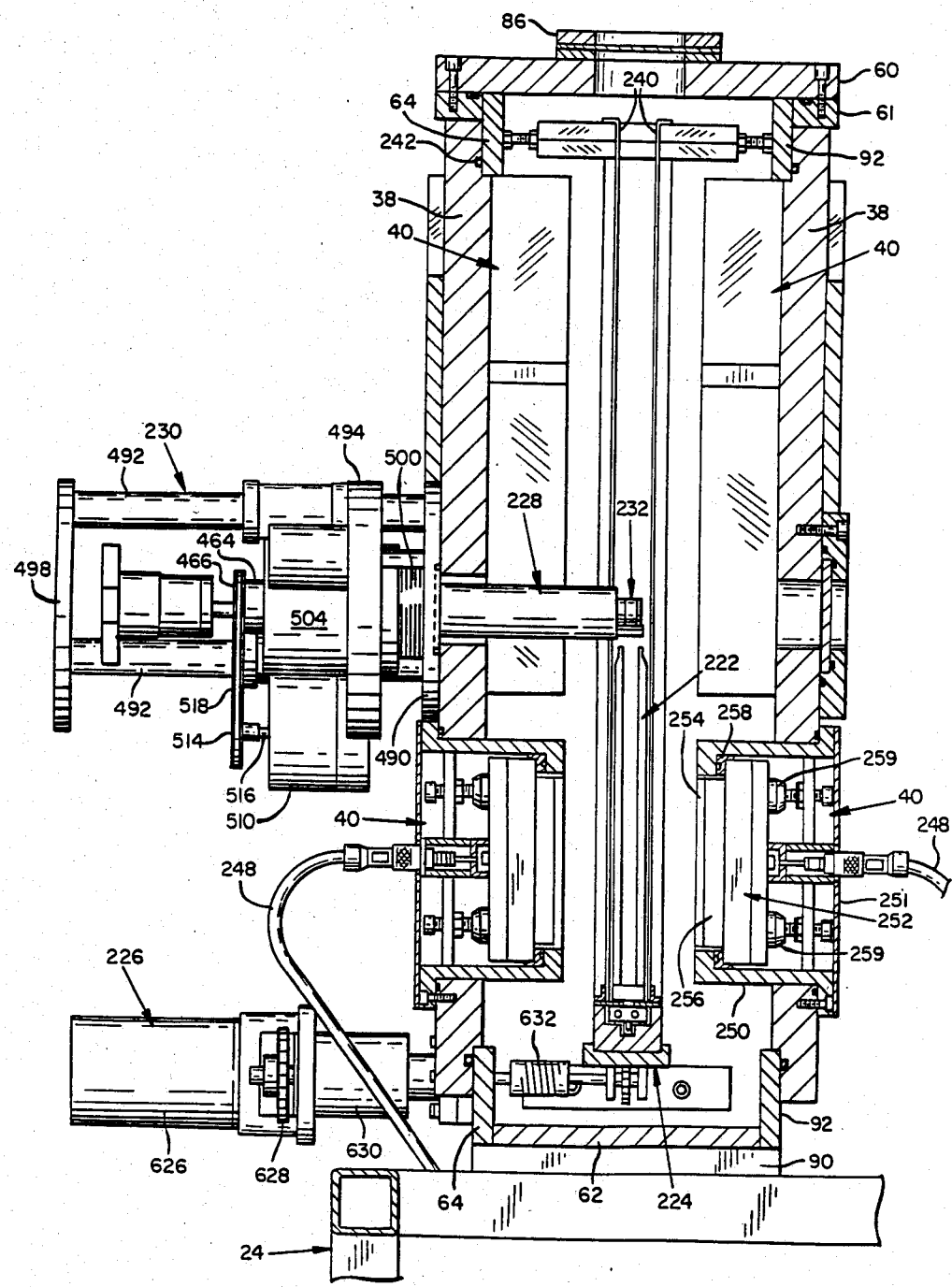
FIG. 15 is a vertical sectional view of the direct current deposition chamber of FIG. 14, taken along lines 15—15 of FIG. 14.

The deposition chambers 14, 18 and 20 are best understood with reference to FIGS. 14 and 15. Elements in these chambers which have counterparts in the previously described sputtering chamber 16 are numbered with corresponding numbers and therefore will not be described in detail.

In the illustrated FIG. 1 system, chambers 14 and 18 are each designed to deposit chromium layers, and chamber 20 is designed to deposit a carbon layer, on substrates positioned within the chambers. This deposition is accomplished by direct current sputtering. Commercially available cathode sputtering assemblies 40 may be utilized for this purpose. For example, one suitable assembly comprises a direct current planar magnetron sputtering cathode available from Vac-Tec Systems and sold under the trademark Fleximag. These cathodes have five inch by ten inch rectangular water cooled, five kilowatt rated targets. Such cathodes may be powered by commercially available five kilowatt sources, such as from Advanced Energy Systems.

Figure 19:
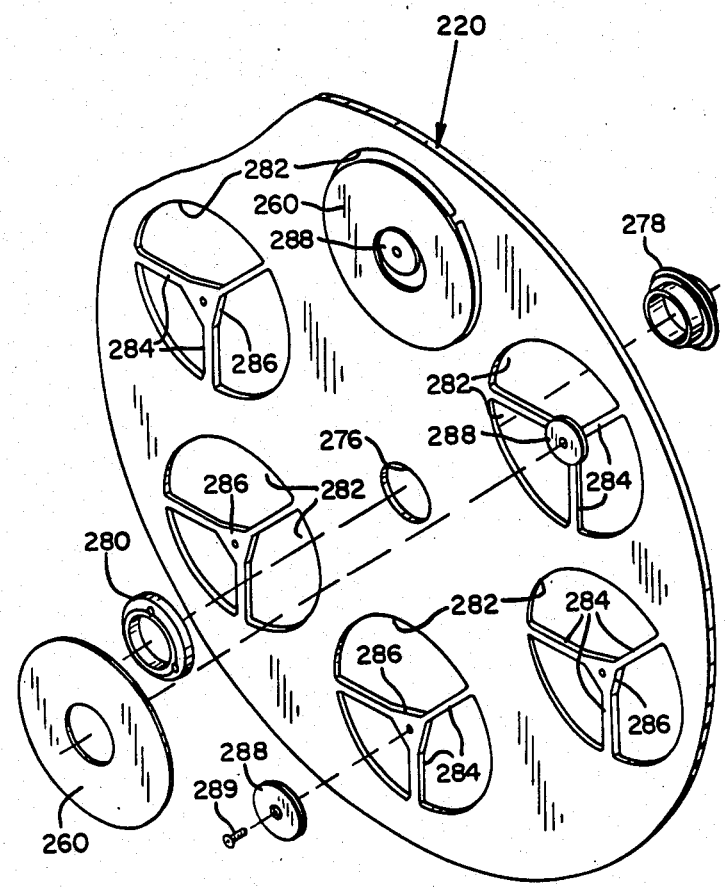
FIG. 19 is a partially exploded isometric view of one form of substrate carrier utilized in the system of FIG. 1 to support substrates as they are processed by the system.

As shown in FIGS. 14 and 15, two such cathode assemblies 40 may be provided at the front and two at the rear of the chambers. Also, the front and rear cathode assemblies are at equal distances from the plane containing substrates 260 in the chambers. Referring to the right hand portion of FIG. 15, the two front cathode assemblies 40 are secured to the circular support plate 38 which in turn is fastened to the front wall 92 of the deposition chamber. The cathode assemblies 40 are cooled in a conventional manner via water inlet and outlet lines 198, 200 (FIG. 14). In addition, power is delivered to the cathode assemblies via power cables 248. For purposes of clarity, the water lines, and the uppermost power cables, have been eliminated from the FIG. 15 view of these cathode assemblies. Each of the cathode assemblies 40 includes a cathode housing 250 inserted within a correspondingly shaped opening through the support plate 38. A DC sputtering target assembly 252, including a target 254 mounted to a water cooled jacket 256, is supported within the cathode housing 250. An insulator 258 separates the cathode housing from the target assembly. Clamps 259 hold assembly 252 in place. During sputtering, material is sputtered from the surface of target 254 to the substrates 260 as the substrates are carried past the target by a carrier 220 (FIG. 19). The targets 254 in chambers 14 and 18 are of chromium while the targets 254 in chamber 20 are of carbon. A cover plate 251 encloses the cathode housing 250 where it emerges from the support plate 38. Suitable seals, some being numbered as 242, seal the chambers 14, 18 and 20.

During a typical sputtering process in the FIG. 14 chamber, the substrates 260 on carrier 220 are moved in a planetary motion past the targets 254. The chamber is pressurized to approximately 7 microns with argon and a plasma is ignited. When the targets are sputtered at, for example, an applied power of approximately three hundred volts and two amps for approximately five minutes, a first chromium underlayer of approximately 3000 angstroms is deposited on the substrate.

It has been found that the thickness of the chromium underlayer has an effect on the coercivity of an overlying cobalt platinum magnetic layer. That is, with increasing thicknesses of the chromium underlayer, the coercivity of the magnetic layer is increased. This coercivity increases at a rate of about seven oersteds per one-hundred angstroms of chromium underlayer thickness. This increasing coercivity is probably due to an epitaxial effect between the underlayer and the cobalt platinum layer. By controlling the consistency of the thickness of the underlayer from disc to disc, additional control of the consistency of the coercivity of the thin film magnetic recording discs is maintained. Furthermore, by varying the thickness of the underlayer in the radial direction, a radial coercivity gradient may be established in the resulting disc. With the sputtering cathodes 40 positioned in the configuration illustrated in FIGS. 14 and 15, and with the substrates moved in a planetary manner during sputtering, the resulting chromium underlayer is somewhat thicker at inner than outer radial positions of the substrates. Therefore, this chrome underlayer deposition also contributes to the previously described desired higher to lower radial coercivity gradient moving from inner to outer positions on the discs. It has also been found that the coercivity of the resulting thin film magnetic recording discs is more predictable and more consistent from disc to disc, if the time between sputtering of the chromium underlayer and cobalt platinum layer is limited to no more than about five minutes. With the system of the present invention, this is easily accomplished because the substrates are readily transferred from chamber to chamber.

The chamber 18 in the preferred embodiment is also utilized to sputter a chrome outer layer onto the substrates. This chrome outer layer serves the function of providing an oxygen diffusion barrier to protect the cobalt platinum layer from oxidation or corrosion. A chrome outer layer of approximately 250 angstroms is suitable for this purpose. Consequently, in chamber 20, although shown with four cathode assemblies 40, only one front and one rear assembly 40 are typically used. With a two target chamber, this outer layer is deposited by sputtering the targets at, for example, an applied power of approximately 0.7 amps and three hundred volts for two and one-half minutes. A seven micron argon sputtering gas environment is suitable.

In sputtering a carbon wear layer in chamber 20, four carbon cathode assemblies 40 are used, two at the front and two at the rear of the chamber. To produce a 400 angstrom wear layer, the targets are sputtered at, for example, an applied power of approximately three amps and three hundred volts for three and one-half minutes. A seven micron argon sputtering gas environment is also suitable for this wear layer deposition.

Although described above with specific sputtering operations in the specific processing chambers, one can easily replace the previously described sputtering assemblies with other vacuum deposition assemblies as desired. This is readily accomplished by simply removing the plates 38, 39 and replacing them with plates containing differently configured targets. Also, fewer or more deposition chambers may be employed depending upon the number of layers to be deposited onto a substrate.

Materials Handling System

The materials handling system for transferring and handling the substrates during processing is shown in FIGS. 16 through 28. This system includes the planetary substrate carriers 220, one being shown in FIG. 19, for carrying substrates 260 during processing. Another component of the materials handling system comprises racks or trays 270, one positioned in load chamber 12 and one in unload chamber 22. The tray 270 in the load chamber 12 supports carriers 220 prior to processing while the tray in the unload chamber 22 supports carriers following processing. In addition, a load mechanism 272, and a similar unloading mechanism, are provided in the respective load and unload chambers. These latter mechanisms transfer carriers 220 to and from transporters 222. The transporters 222, tracks 224 and transporter drive assemblies 226 comprise further components of the materials handling system. In addition, the plungers 228 and plunger drive 230, are also included in the materials handling system.

Planetary Carriers and Carrier Support Tray

In the system of the present invention, a carrier means, such as carriers 220 (FIGS. 19, 19a) are provided for supporting the substrates for movement during deposition in the high vacuum, high temperature environment typically found in sputter deposition chambers. In addition, such carriers impart a planetary motion to substrates supported thereon while minimizing particle generation from frictional engagement of metal parts. This planetary motion enhances the uniformity of deposition on the substrates because the substrates are not continuously sputtered from the same region of a target. As a result, this motion compensates for and averages the effects of non-uniform sputtering from particular regions of the target. Moreover, these carriers permit simultaneous deposition of both sides of the substrates 260 without requiring complex mechanisms for turning the substrates over during deposition. Furthermore, the carriers 220 are readily adapted to support substrates of varying sizes.

With reference to FIG. 19, one form of planetary carrier 220 comprises a circular planar pallet or carrier chassis plate formed of aluminum or other electrically conductive material. A central opening 276 is provided through the carrier plate. A hub 278 is inserted through opening 276 and secured in place by a hub clamp ring 280. The hub is engaged by the load and unload mechanisms 272, as set forth below, to transport carriers 220 to and from the trays 270. In addition, the hub is engaged both by the plunger 228 and by the transporters 222 during various steps of the process, as explained below. Portions of the carrier plate 220 are removed to provide plural, generally circular, sputtering openings 282 through the carrier plate. A substrate supporting structure is provided for supporting the substrates 260 in the openings 282 so that one surface of the substrate is exposed to sputtering targets through the openings. As shown, the substrate support may be an integral part of the carrier plate and comprise plural thin spokes 284 extending from the perimeter of these openings to a central hub region 286. As shown, three such spokes may be employed and are spaced one-hundred and twenty degrees apart about the hub region. Substrate supporting sheaves 288 are rigidly secured by a fastener 289 to the hub regions 286 and support the substrates 260 as shown in FIGS. 17 and 19. The sheaves are positioned at equal radial distances from the center of opening 276.

The size of the openings 282 is varied depending upon the size of the discs being processed. Thus, larger and fewer openings 282 are provided when larger discs are handled by the system. For example, openings may be provided to handle nine ninety-five millimeter discs, six one-hundred and thirty millimeter discs, or three two-hundred and ten millimeter discs. The FIG. 19 carrier 220 can accommodate thin, planar substrates of various sizes and shapes. All that is required is that the substrate have a circular hole concentric with the center of gravity of the substrate and sized to fit onto a sheave 288. Thus, while round substrates with concentric holes are illustrated and preferred for the embodiment described, substrates of virtually any shape may be supported in this manner.

The sheaves 288 are grooved around their circumference much like the groove provided in pulley wheels. The grooves are formed to accommodate the thickness of the substrate to be processed. With the plane of the carrier plate in a vertical orientation as shown, the grooves of the sheaves are also in a common vertical plane. In addition, substrates 260, with interior holes of a diameter D2, hang from the groove of the sheaves and contact the circular surface at the base of the sheave groove. Since substrates 260 merely rest in the sheave grooves, loading and unloading of substrates 260 onto the carrier 220 is greatly simplified. This circular sheave surface is of a diameter D1 and is less than D2. Rotation of the planetary carrier 220 at a preselected speed about its center by the plunger 228, as explained below, causes a corresponding rolling of the substrates on the sheaves. For each revolution of the carrier, each substrate 260 completes a fraction of a revolution on its sheave given by the ratio D1 divided by D2. Therefore, the orientation of the substrate 260 relative to a fixed sputtering target is generally different after each revolution of the planetary. Similarly, the orientation of the substrates 260 relative to the spokes 284 continuously varies. As a result, sputtering of the back side of the substrates may be performed through the openings 282 without the spokes 284 leaving shadows on the substrates and interfering with the deposition. Consequently, simultaneous deposition of materials onto both sides of the disc substrate is possible and the resulting disc surfaces have substantially uniform properties.

Furthermore, circumferential uniformity of the deposited film on the substrate is enhanced by this planetary motion. That is, variations in sputtering by different portions of the sputtering targets tend to be averaged because of the planetary travel of the substrate during sputtering. In addition, as previously explained in connection with the deposition of the cobalt platinum layer, layers with radial film concentration gradients may be sputtered onto the substrates to vary the radial coercivity in a desired manner. Furthermore, the rolling of the substrates on the sheaves results in substantially no contaminating particle generation as each substrate simply rolls in a sheave groove as the sheave is rotated. In addition, such a substrate carrier requires no lubrication. Therefore, contamination from that source is eliminated.

In addition, such a carrier 220 is relatively inexpensive, is compatible with simple load and unload tooling mechanisms, and is unaffected by high temperatures and high vacuums encountered in typical sputtering operations. As mentioned, the carrier plate is typically of aluminum while the sheaves 288, hub components 278, 280, and fasteners 289 are typically of stainless steel. The carrier plate is also typically of stainless steel or other high temperature resistant material if the temperature of the deposition process exceeds about one-hundred and eighty degrees centigrade. The carrier 220 provides a ground plane for grounding the substrates 260 and electrically isolating the deposition environment, such as the sputtering plasma in a two-sided deposition process.

The carrier 220 shown in FIG. 19a also imparts planetary motion to substrates by supporting the substrate for rolling within an annular groove as the carrier is rotated. In this form of carrier, the spokes 284, central hubs 286 and sheaves 288 are eliminated. Instead, a circular groove 283 of a diameter D1 is provided at the circumference of each of the circular openings 282. As shown in FIG. 19b, each substrate 260, of a diameter D2 which is less than D1, contacts the groove 283 and thereby rolls in the groove as the carrier is rotated.

The FIG. 19a form of carrier is also suitable for substrates of various sizes. In addition, the substrates need not have a central opening. However, the outer perimeter of the substrate must be substantially circular for smooth rolling action.

For each revolution of the carrier 220, each substrate 260 completes a fraction of a revolution on its groove given by the ratio of D1 divided by D2. However, to provide stable support of a substrate supported in this manner in a groove 283, the ratio of D1 to D2 must be only slightly greater than one. This requirement does not exist for the FIG. 19 form of carrier because, in the FIG. 19 form with the center of the disc 260 supported on a sheave 288, D1 and D2 need not be close to unity for stable support. In general, the greater the difference between D1 and D2, the greater the randomness of exposure of the substrate surface to different regions of the target surface as the carrier is rotated. Furthermore, the greater the randomness, the better the compensation for non-uniform deposition from different regions of a target and the better the uniformity of the deposition. Thus, the FIG. 19 form of carrier has some advantages over the FIG. 19a form of carrier. Also, somewhat higher partial generation may result from the FIG. 19a carrier than the FIG. 19 carrier. Otherwise, the FIG. 19a carrier possesses the advantages and features previously explained in connection with the description of the FIG. 19 carrier.

Figure 16:
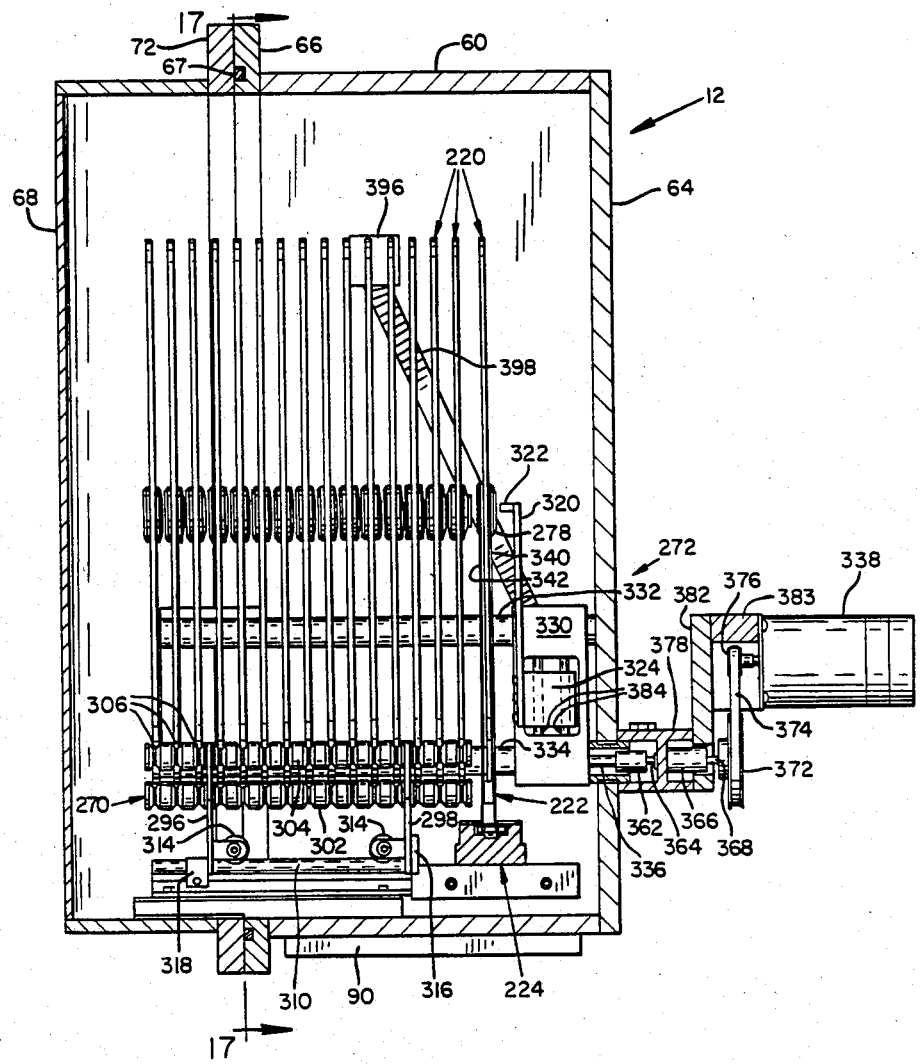
FIG. 16 is a vertical sectional view through the load chamber of FIG. 1, taken along lines 16—16 of FIG. 1, and showing the load chamber loaded with a rack or tray of substrate carriers.
Figure 18:
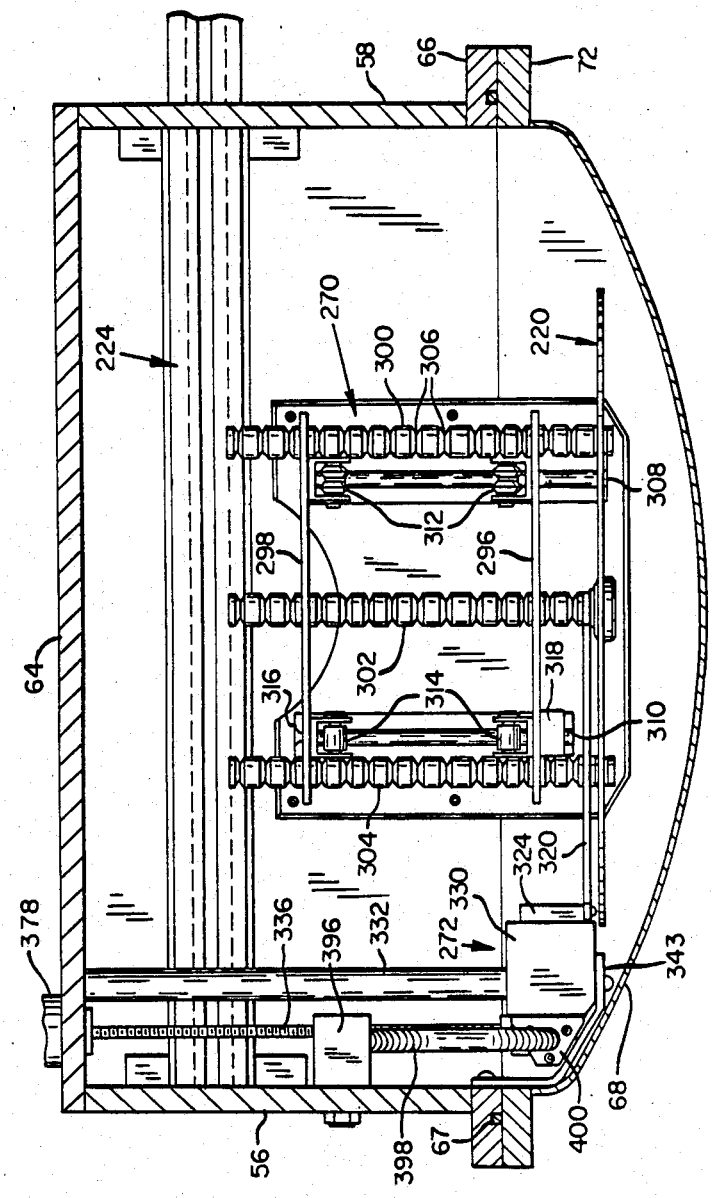
FIG. 18 is a cross sectional view of the chamber of FIG. 17, taken along lines 18—18 of FIG. 17, and with all but one of the substrate carriers removed.

Referring to FIGS. 16, 17 and 18, the rack or tray 270 has a frame which includes front and rear support plates 296, 298. Three horizontal planetary supporting rods 300, 302 and 304 are supported by the plates 296, 298. The rods 300, 302 and 304 are each provided with plural axially spaced apart annular grooves 306. Each groove of each rod is aligned in a vertical plane passing through a corresponding groove of each of the other rods. Furthermore, the plates 296, 298 support the rods so that corresponding grooves of the rods are positioned in an arc of a radius which equals the radius of the carriers 220. Consequently, as shown in FIG. 17, the carriers nest within the corresponding grooves and are supported at three locations by the rods. Because the rods are positioned beneath substrates 260 supported on the carriers 220, the possibility of contamination of the substrates by particles from the rods is minimized.

As shown in FIG. 17, a pair of parallel, horizontal, spaced apart rails 308, 310 are supported from the floor 62 of chamber 12 and extend substantially from front to rear of the chamber. These rails are parallel to chamber walls 56, 58 and have an upper tray engaging portion which is of circular cross section. Grooved rollers 312 are pivotally mounted to the tray 270 and each engage the upper portion of rail 308 at two locations. Flat rollers 314 are also pivotally mounted to the tray. Each roller 314 engages the upper portion of rail 310 at one point. Therefore, as the tray is slid on rails 308, 310 into and out of the chamber, the rollers 312, 314 and rails 308, 310 cooperate to establish a plane which supports the tray. Furthermore, rod 308 in cooperation with rollers 312 define a line along which the tray slides into and out of the chamber 12. Furthermore, a stop 316 (FIG. 16) limits the depth of insertion of the tray into the chamber to a particular point Consequently, the tray is easily and precisely positioned at the same location each time it is placed into the chamber. In addition, a stop 318 (FIG. 16) is mounted to the rail 310 following the positioning of the tray within the chamber 12. Stop 318 prevents the tray from rolling toward door 68 after it is in position. Note, for purposes of clarity, the substrates and sheaves have been omitted from the carriers 220 shown in FIGS. 16 and 18. An identical tray supporting structure is also provided in unload chamber 22.

Loader and Unloader Mechanisms

The loader 272 for loading carriers 220 from the tray 270 and onto the transporter 222 is shown in FIGS. 16–22. The unload chamber 22 is provided with an unloader which is a mirror image of the loader in chamber 12. Consequently, the unloader will not be described in detail.

In general, the loader 272 has an upwardly extending load arm 320 with a carrier handling finger 322 projecting outwardly from the free end of arm 320 in the direction of door 68. The arm 320 is supported at its lower end by a bellows block 324 which is capable of vertical upward and downward movement. A bellows assembly indicated generally at 326 (FIG. 21), and described in detail below, is supplied with air to shift the block 324, and thereby the arm 320 and finger 322, upwardly and downwardly. The bellows block 324 is mounted to a traveling body 330 which is slidably mounted to a pair of spaced apart upper and lower horizontal guide rails 332, 334. Rails 332, 334 are parallel to wall 56 and extend from the front to the rear of the chamber. A hex drive screw 336 is coupled to the traveling block 330, as explained below, and driven by a reversible step motor 338. When driven, the drive screw shifts the traveling block 330, and thus the arm 320, either forwardly toward the front of chamber 12 or rearwardly.

Electrical drive pulses are delivered to the step motor under the control of the computer 46. By monitoring the number of pulses, the position of the traveling block 330 and arm 320 along the guide rails is known. An optional shaft encoder is utilized to monitor the rotation of the motor and thus of drive screw 336. The shaft encoder provides feedback to the computer of the movement of the drive screw in response to the step motor pulses. In addition, as explained below, the computer controls the air which is supplied to a pair of bellows 392, 394 (FIG. 21) which operate as explained below to raise and lower bellows block 326. Therefore, the upward and downward movement of the arm 320 is controlled by the computer.

In operation, the loader is capable of automatically moving along a tray 270 of carriers 220 in chamber 12, retrieving a single carrier from the tray, and then loading the retrieved carrier onto a transporter 222. This operation is sequenced as follows. At the start of the sequence, a transporter 222 is positioned outside of the chamber 12. Also, the traveling block 330 is positioned at a home position adjacent the rear wall 64 of the chamber 12, such as shown in FIG. 16. The traveling block 330 is then driven forwardly by motor 338 until the finger 322 is inserted fully into the hub 278 of the rearmost carrier on the tray. The bellows block 326 is then raised to raise the arm 320. This causes the finger 322 to contact the hub 278 and lift the carrier out of the tray. The traveling body 330, and thus the arm 320 and supported carrier 220, is then driven rearwardly to a position which centers the carrier 220 over the center of the track 224. The transporter 222 is then driven into the chamber 12 until upwardly extending arms 340, 342 of the transporter 222 are positioned beneath the carrier hub 278. The arm 320 is then lowered by bellows 392, 394 as explained below, to cause the carrier 220 to rest on the arms 340, 342 of the transporter. The traveling body 330 is then driven to its home position adjacent to the rear wall 64. When the traveling body 330 is thus out of the way, transporter 222 is moved to the next chamber and carries the loaded carrier 220 with it. After the carrier 222 has exited from chamber 12, the sequence is again repeated so that, upon return of the transporter, the next carrier is in position for loading. This sequence is repeated until the last carrier is loaded onto the transporter and the tray 270 is empty. Then, the vacuum is removed from chamber 12 while chamber 14 is isolated, the door 68 is opened, another tray of carriers is inserted into chamber 12, and the door is closed. Following this, the vacuum is reestablished in chamber 12 and loading of carriers from the tray and onto the transporter is continued.

Figure 20:
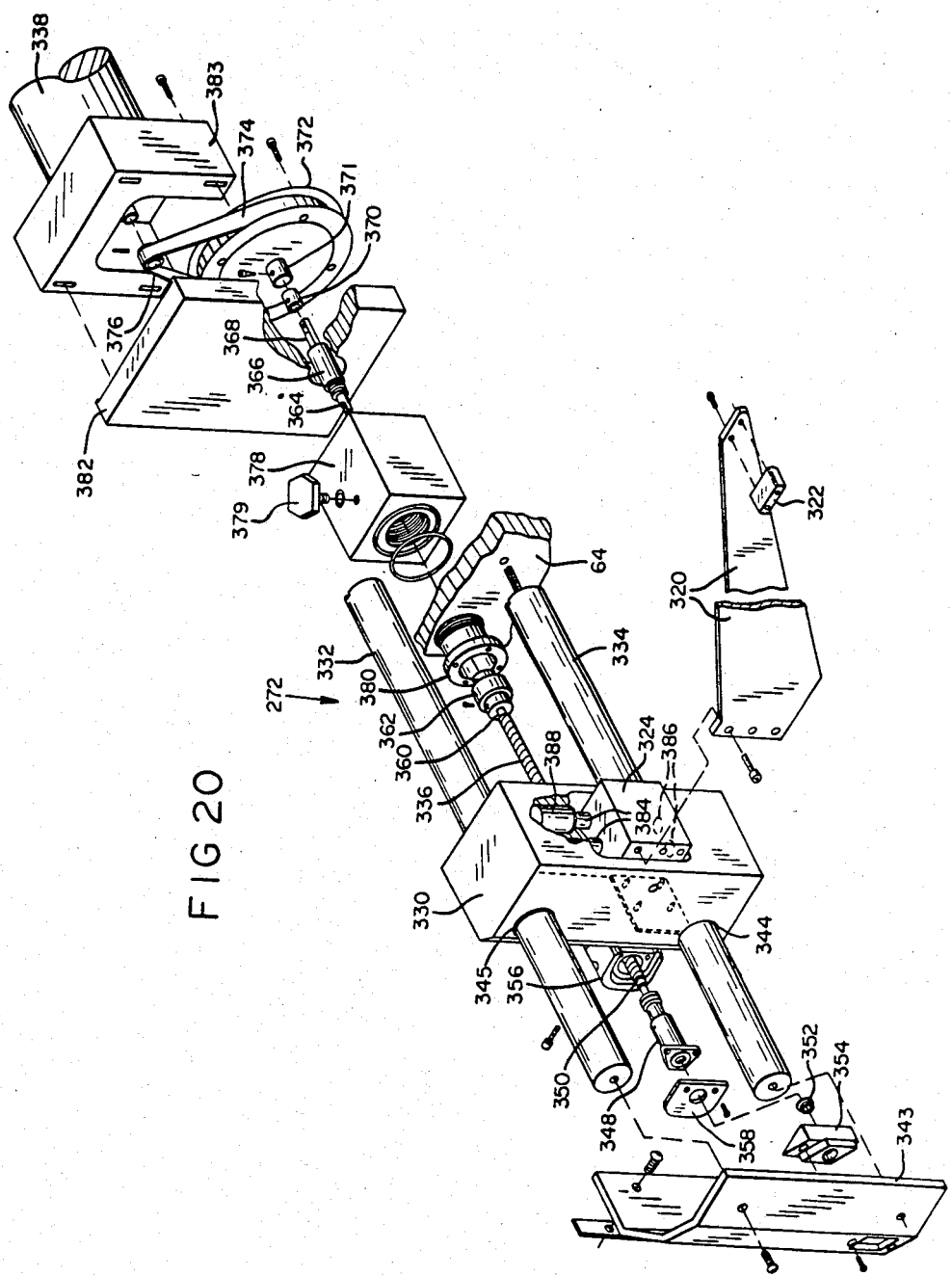
FIG. 20 is an exploded view of a carrier loader for transferring substrate carriers from a tray to a transporter which then transfers the carriers from the load chamber to the deposition chambers of the system of FIG. 1.

The details of the portion of the loader mechanism 272 utilized for shifting the traveling body 330 along the guide rods 332, 334 are shown in FIG. 20.

More specifically, a chamber wall mounting bracket 343 is mounted to the chamber side wall 56 as shown in FIG. 18. The forward end of each of the guide rods 332, 334 is fastened to the bracket 343 as indicated in FIG. 20 while the rearward end of these rods is fastened to the rear chamber wall 64. Upper and lower openings 345, 344 are provided through the traveling body 330. Ball bushings (not shown) within these openings slidably receive the respective upper and lower rods 332, 334. The hex drive screw 336 is threaded through an elongated nut 348 and has its forward end 350 supported by a bearing 352 in a bearing block 354 mounted to the bracket 343. The nut 348 is secured to a mount 356 and held in place by a cover 358. Mount 356 in turn is rigidly mounted to the traveling body 330. Consequently, when drive screw 336 is rotated in a first direction, the traveling block shifts in a forward direction along guide rails 332, 334. Conversely, when the screw 326 is rotated in the opposite direction, the traveling block shifts rearwardly.

The drive screw 336 is coupled to the step motor in the following manner. The rear end 360 of screw 336 is connected to a torsionally rigid flexible coupling 362. Coupling 362 is connected to and driven by a shaft end 364 projecting from one end of a commercially available sealed ferrofluidic rotary feed through coupler 366. Such seals are commerically available from Ferrofluidics Corporation under the trademark Ferrofluidic TM seals. A shaft end 368 projecting from the other end of coupler 366 supports a hub insert 370 which is connected to a hub 371 of a large diameter timing pulley 372. A timing belt 374 couples timing pulley 372 to a smaller timing pulley 376. Pulley 376 is driven by the step motor 338.

The coupler 366 is positioned within a sealed housing 378 (FIG. 16) secured to chamber wall 64 by a connector 380 (FIG. 20). Access to housing 378 is provided through a plug 379 for the purpose of permitting tightening of coupler 366. The drive screw 336 passes through the chamber wall 64 and engages the coupler 366 within housing 378. Because the coupler 366 is sealed, rotation is transmitted through the coupler while a high vacuum is maintained within chamber 12. Motor 338 is supported by a bracket 383 (FIG. 16) which is mounted to housing 378 by a motor mount 382.

Thus, step motor 338 is operatively coupled to the drive screw 336 for rotation of the screw in either direction. In addition, the position of the traveling block 330 along the guides 332, 334 relative to a reference location may be determined from the number of drive steps through which the screw 336 has been driven by the step motor. Furthermore, the steps are electrically controlled and monitored by the computer 46 so that the position of the traveling block is known.

The bellows block 324 is raised and lowered by alternately pressurizing bellows 392, 394 (FIG. 21) to thereby raise and lower the arm 320. The vertical motion of bellows block 324 is guided by a pair of vertical pins 384 (FIGS. 16, 20), mounted within the traveling body 330. These pins extend through vertical openings 386 through the bellows block 324. Pins 384 are slidably coupled to the bellows block by bushings 388, one being shown in FIG. 20.

Figure 21:
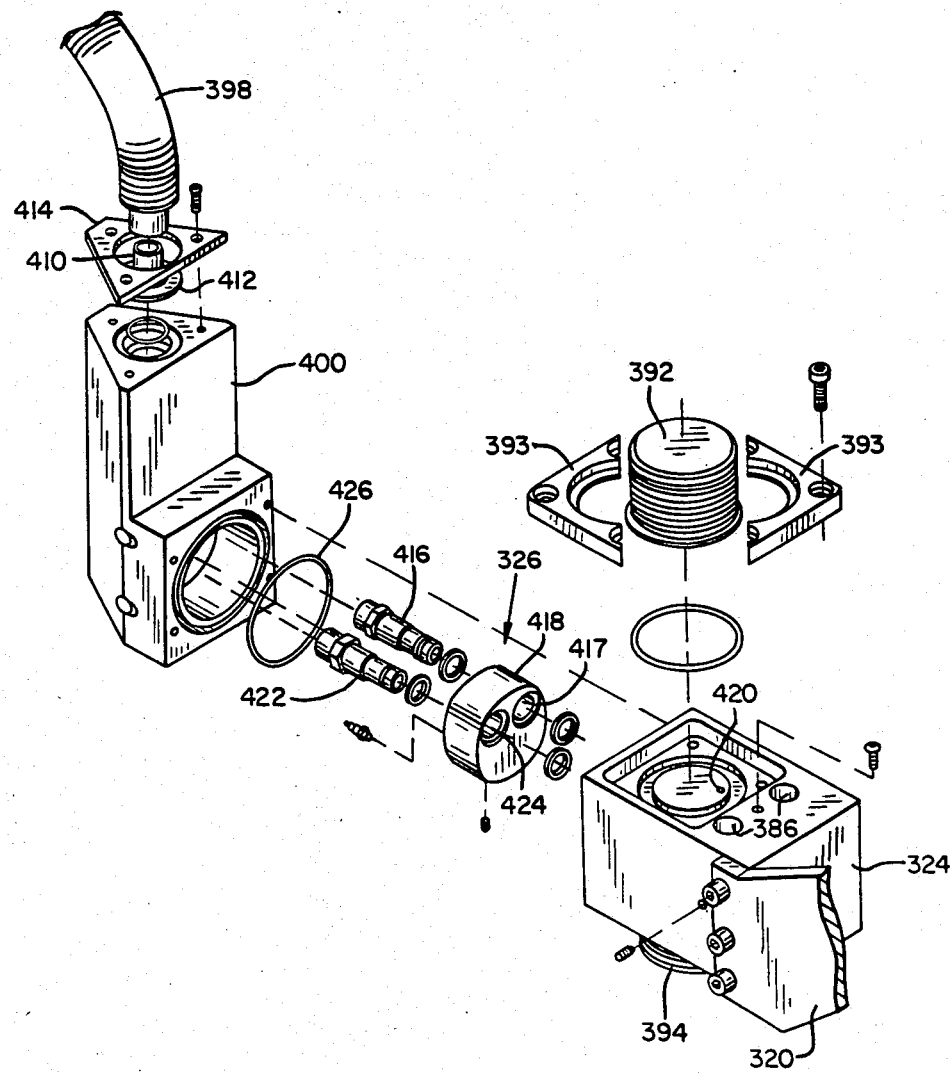
FIG. 21 is an exploded view of a lift-lower bellows mechanism of the loader of FIG. 20, which is utilized for lifting substrate carriers from, and for lowering substrate carriers to, the rack.

As shown in FIG. 21, the bellows assembly 326 includes an upper stainless steel bellows 392 mounted by bellows holding clamps 393 to an upper surface of the bellows block 324 with a sealing gasket positioned between the bellows and block. A similar lower bellows 394 is mounted in the same manner to the underside of the bellows block. These bellows are suitable for operation in a high vacuum environment without leaking gas from the bellows into the environment. When the bellows block 324 and traveling block 330 are assembled, the upper bellows contacts an upper surface of the traveling block while the lower bellows contacts a lower surface of the traveling block. Therefore, when the upper bellows is pressurized, the bellows block 324 and attached arm 320 are shifted downwardly. Conversely, when lower bellows 394 is pressurized, the arm 320 is raised.

Figure 22:
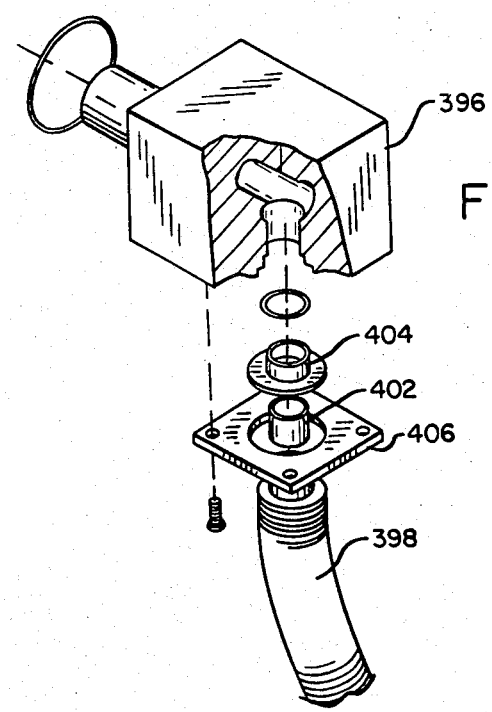
FIG. 22 is an exploded view of a feed through utilized to deliver operating fluid to the lift-lower bellows mechanism of FIG. 21.

Pressurized air for operating the bellows 392, 394 is delivered by a pair of air lines (not shown) which pass through an upper feed through housing 396 attached to the chamber wall 56 (FIGS. 17 and 22). A gasket seals housing 396 to the wall 56. A flexible stainless steel bellows conduit 398 is connected from the upper housing 396 to a lower bellows feed through housing 400 mounted to the bellows block 324 (FIGS. 17 and 21). A gasket 426 seals housing 400 to the bellows block 324. The air delivery lines pass through conduit 398 and enter housing 400.

To connect the conduit 398 to the feed through housing 396, a cylindrical insert 402 (FIG. 22) is inserted within the end of conduit 398 and a compression ring 404 is then forced over the outside of the conduit. A retainer plate 406 holds the compression ring, and thus the attached conduit, to the underside of the feed through housing 396 with a gasket seated between the housing and compression ring. The lower end of the conduit 398 (FIG. 21) is connected to the lower bellows feed through housing 400 in the same manner by a respective insert 410, compression ring 412, gasket, and retainer plate 414.

A first of the air lines entering housing 400 is connected to a flow controller 416 which extends into an opening 417 in an air flow block 418 and communicates through the block and an aperture 420 with the interior of upper bellows 392. The second of the air lines entering housing 400 is connected to a flow controller 422 which extends into an opening 424 in the air flow block and communicates through an aperture (not shown) leading to the interior of bellows 394. Flow controllers 416, 422 permit unrestricted flow into the bellows and restricted flow out of the bellows to smooth the lifting and lowering movement of the arm 320.

To lower the arm 320, a solenoid operated computer controlled air valve is opened to permit the flow of air through the first air line and into the upper bellows. To raise the arm 320, another computer controlled solenoid operated air valve is opened to permit the flow of air into the second air line and into the lower bellows.

Plunger and Plunger Drive Mechanism

The details of the plunger 228 and plunger drive mechanism 230 can be understood with reference to FIGS. 10 and 26-28. The plunger 228 is designed to accomplish three functions. First, it is movable axially to position the carrier gripping tip 232 of the plunger into the hubs 278 of the planetary carriers 220 (FIG. 19) when each carrier is positioned by a transporter 222 in alignment with the tip of the plunger. Following insertion, the plunger gripping tip 232 is operated to grip the hub of the planetary carrier and lift the carrier upwardly from the transporter. Lifting and clamping action is accomplished utilizing rolling contact between surfaces of the plunger tip and interior of the hub. That is, the plunger tip has a minor shaft with eccentrically mounted bearings which are rotated relative to a major shaft with a fixed protrusion. As this rotation occurs, the distance between the bearing and protrusion increases until these elements grip the interior of the hub and lift the hub from the transporter in one continuous motion. Then, the plunger is rotated by the plunger drive mechanism 230 during sputtering to thereby rotate the carrier 220 and move the substrate 260 as previously explained. After sputtering, rotation is stopped. The carrier 220 is then lowered onto a transporter 222, and the carrier 220 is released from the hub 278 in one motion and the plunger is withdrawn from the hub. Thereafter, the transporter transfers the carrier to the next chamber for further processing.

The clamping and lifting action of the plunger tip 232 is illustrated in FIGS. 26 and 27. Specifically, the plunger 228 includes a major outer shaft or spindle 436. A fixed protrusion 438 projects outwardly from a portion of the periphery of the front face of the end of major shaft 436. Thus, the protrusion 438 is offset from the central longitudinal axis of the shaft 436. More than one such protrusion may be utilized if desired. A rotatable minor shaft 440 (FIG. 28) extends within the shaft 436 and has its longitudinal axis parallel to, but off-center from, the longitudinal axis of the major shaft 436. The outer end of shaft 440 terminates in a head 442 from which an eccentric pin 444 projects. Bearings 446 and an outer bearing shield 448 are secured to this pin and thereby have centers which are eccentric to the longitudinal axis of the minor shaft.

An air actuated cylinder assembly 470 (FIG. 28) is operatively coupled, as explained below, to the minor shaft 440 for rotating this shaft. As the minor shaft is rotated relative to major shaft 436, the distance or separation between the center of the pin 444 and the outside surface of fixed projection 438 increases as shown moving from FIGS. 26 to 27. The spindle or plunger tip 232 has its longitudinal axis disposed in a horizontal line normal to the plane of carrier 220. Prior to insertion of the plunger tip into the hub 278, the minor shaft is first rotated relative to the major shaft to an orientation which minimizes the distance between the center of pin 444 and the outer surface of protrusion 438, as shown in FIG. 26. The tip 232 is also rotated, by a motor 510 as explained below, to position protrusion 438 in a down position, beneath pin 444. This provides maximum clearance for easy insertion of the tip 232 into the hub. Thus oriented, the tip 232, including projection 438 and pin 444, is inserted into the hub 278 of a carrier 220. After insertion, the minor shaft 440 is rotated relative to the major shaft 436 to bring the bearings 446 into rolling contact with the inner surface of the hub 278 and lift the carrier 220 from its supporting transporter 222. Additional rotation of the minor shaft 440 causes further lifting of the hub until eventually the carrier hub 278 is clamped and gripped by the bearings 446 and fixed projection 448. The eccentric bearings 446 are prevented from rotating over the center of the major shaft 436. That is, the interior surface of the hub 278 is sized to be gripped by projections 438 and bearings 446 before the bearings move to an over center position. When engaged in this manner, the hub prevents further rotation of the minor shaft 440.

After the clamping and lifting action is complete, and the transporter 222 is moved away from the sputtering targets in a chamber, the plunger drive mechanism 230 rotates the major shaft 436 and the supported carrier during the deposition process. Upon completion of processing, plunger tip 232 is stopped, with the protrusion 438 in its down position, in the same orientation as when the tip was inserted into the hub 278. In addition, transporter 222 is positioned under the hub 278 of the plunger supported carrier 220. The minor shaft 440 is then rotated in the opposite direction from that previously described to lower the hub onto the transporter and release the hub. The plunger tip 232 is then withdrawn from the hub so that the transporter 222 may transfer the carrier to another chamber.

There are a number of advantages to this type of plunger. First, there are less stringent requirements for positioning of a transporter 222 and its supported planetary carrier 220 in a chamber. That is, the hub 278 need not be perfectly aligned with the center of the plunger tip 232 in order for the plunger tip to be inserted into the hub. Moreover, because of the positive clamping action by the plunger tip, good electrical contact is made between the plunger 228 and the hub 278. During sputtering, as previously mentioned, grounding of the substrates is accomplished through the carrier and plunger. Also, because of the positive clamping action, the rotating carrier will be maintained in a vertical plane, perpendicular to the longitudinal plunger axis. This minimizes disc substrate wobbling, motion out of a vertical plane, in the sheave grooves and thus minimizes this potential source of undesirable particles. Also, such wobbling could modulate the sputtering by periodically moving certain areas of the substrates closer to the sputtering targets and thereby causing a variation in the thickness of the deposition on such substrate areas. Finally, this clamping action eliminates relative rotation between the hub 278 and plunger tip 232 during sputtering to thereby eliminate partial generation that could otherwise result from such relative rotation.

Figure 28:
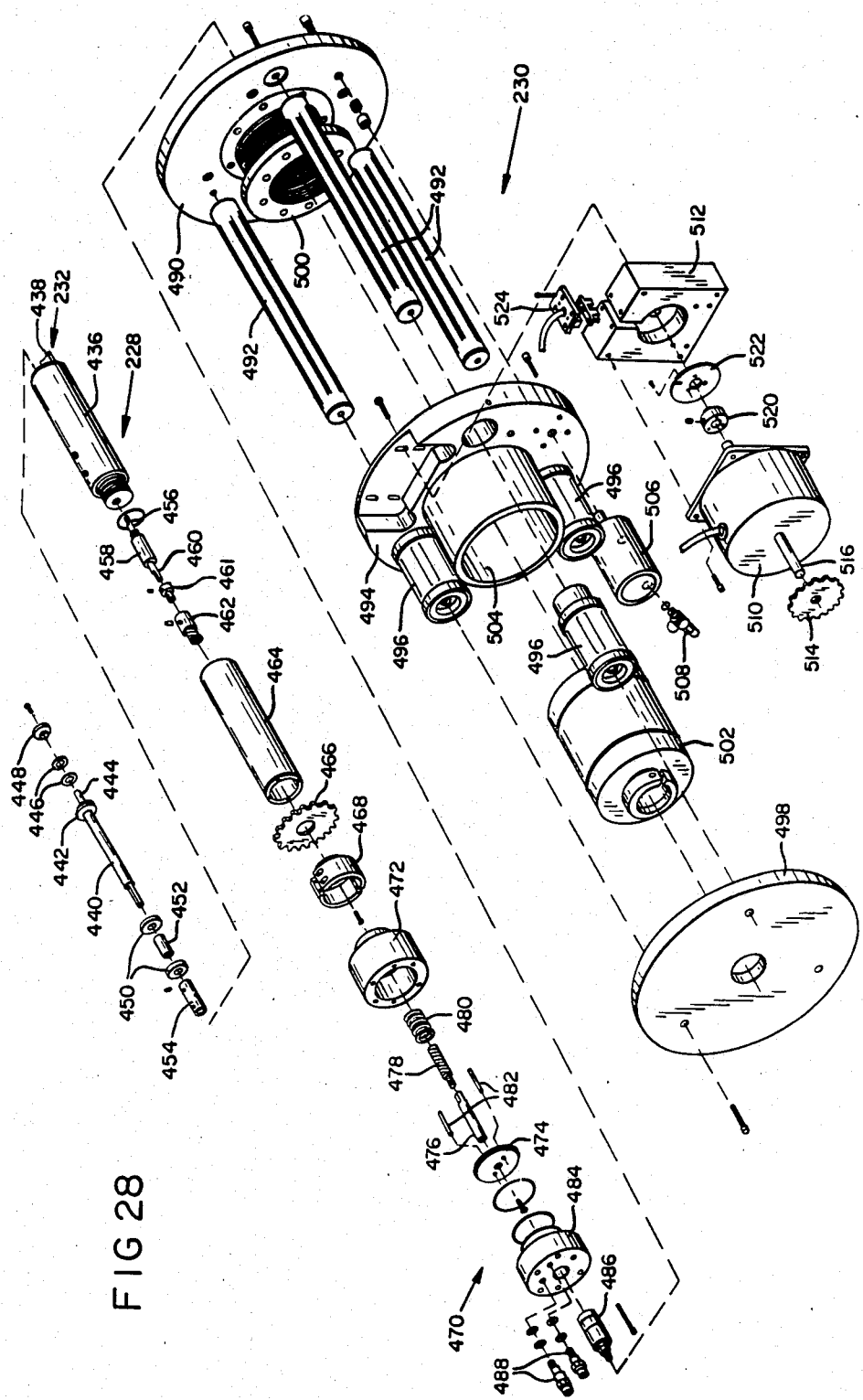
FIG. 28 is an exploded view of the plunger of FIG. 26 and of a plunger drive mechanism which operates the plunger.

Referring to FIG. 28, the minor shaft 440 is rotatably supported within the major shaft 436 by a pair of bearings 450 separated by a spacer 452. Major shaft 436 extends through the wall of the deposition chamber. A coupler 454 connects the inner end of the minor shaft to a stub shaft end 456 of a commercially available sealed rotary motion ferrofluidic feed through coupler 458. An O-ring seal, not shown, is provided to seal feed through 458 at its connection to shaft 436. The other stub shaft end 460 of the feed through is coupled by a bushing 461 to an elongated drive screw receiving helix nut 462. As a result, rotation of the helix nut 462 causes the stub shaft ends 460, 456 and the minor shaft 440 to rotate and thereby produces the previously described clamping action. The feed through 458 and helix nut 462 are positioned within a hollow external major shaft extension 464 (see also FIG. 10) to which a plunger rotating drive pulley 466 is fixedly mounted. A pneumatic actuator mounting collar 468 is fixedly connected to pulley 466. The shaft extension 464 is threadedly connected to major shaft 436. A gasket is provided between these two shaft components where they join together.

A computer controlled solenoid actuated pneumatic cylinder assembly 470 is coupled by collar 468 to the drive pulley. The pneumatic cylinder assembly 470, as explained below, is designed to selectively rotate the helix nut 462 to cause a corresponding rotation of the minor shaft and, thereby, the plunger lifting and clamping action. More specifically, the pneumatic cylinder assembly 470 includes an actuator or piston cylinder body 472 clamped in place by collar 468. A piston assembly is positioned within body 472 and includes a piston head 474 to which a piston rod, having a first extension section 476 and a second drive screw section 478, is mounted. A flat sided slot in the end of extension section 476 fits over the end of drive screw section 478 such that linear movement of piston head 474 results in linear movement of drive screw section 478. Drive screw section 478 comprises a non-rotatable high helix drive screw which is inserted into the rotatable helix nut 48 when the apparatus is assembled. As the piston head 474 slides within the body 472 toward the collar 468, the drive screw section 478 rotates helix nut 462 relative to major shaft 436 and also rotates the minor shaft 440 relative to the major shaft. This converts linear motion of the piston into pivoting motion of the minor shaft. A piston return spring 480 biases piston head 474 in the opposite direction away from collar 468. Guide pins 482, inserted through internal bores of the piston head, guide the sliding movement of the piston head. These guide pins 482 also prevent rotation of the piston head relative to the shaft portions 436, 464. The end of body 472 is closed by a valve body 484 to which a source of air is coupled by a rotary air union 486. A pair of flow controls 488, like controls 416, 422, control the flow of air through valve body 484 to the interior of the body 472.

A computer actuated solenoid controlled air valve is operated to deliver air to assembly 470 as required to shift drive screw section 478 forwardly toward the spindle tip. This rotates the minor shaft 440 so as to lift and clamp the carrier 220. The computer also controls this air valve to relieve air pressure from the piston head 474 as required to lower and release the carrier 220. When air pressure is relieved, spring 480 shifts drive screw section 478 rearwardly and causes the lowering and releasing of the carrier.

The plunger drive assembly 230 includes a chamber wall attachment plate 490 which is mounted to the rear wall of the deposition chamber as shown in FIG. 10. Three horizontal guide shafts 492 project outwardly from plate 490 and away from the deposition chamber. A motor carriage plate 494 is slidably mounted to the guide shafts 492 by ball bushings 496, two of them being shown in FIG. 28. A back plate 498 is mounted to the ends of the guide shafts 492 after the carriage plate 494 is positioned on the guide shafts.

The carriage plate 494 is sealed to the rear chamber wall by a flexible bellows 500. In addition, a rotary shaft vacuum seal 502 is positioned within an annular projection 504 of the carriage plate 494. Shaft extension 464 extends through the rotary seal 502. A pair of O-ring gaskets surround shaft extension 464 to seal the space between this shaft extension and the interior surface of seal 502. A pair of external O-ring gaskets (shown in FIG. 28, but unnumbered) surround seal 502 to seal the space between seal 502 and the carriage plate projection 504. Rotary seal 502 permits rotation of shaft 464 and thereby the rotation of the major shaft 436. This results in a corresponding rotation of a supported carrier 220 during sputtering. Because of the sealing accomplished by seal 502 and bellows 500, the deposition chamber is sealed against leakage through the plunger drive assembly.

Axial shifting of the plunger 228 to insert and withdraw the plunger tip 232 is accomplished by a pneumatic cylinder 506. Cylinder 506 has its housing connected to the carriage plate 494 and its piston rod connected to the plate 490. A computer controlled solenoid actuated valve delivers air through a flow controller 508, like controllers 416, 422, to cylinder 506 to extend and retract the piston rod as required. When the piston rod is retracted, the carriage 494 is shifted axially toward the deposition chamber and the plunger tip 232 is inserted into the hub of a carrier. In contrast, when the piston rod is extended, the carriage is shifted in the opposite direction and the plunger tip is withdrawn from the hub. Bellows 500 provides a vacuum seal while permitting the axial motion of the plunger tip.

A plunger rotation step motor 510 is mounted by a mounting block 512 to the carriage plate 494. When the motor 510 is energized by electrical pulses, a drive pulley 514, mounted to the motor shaft 516, rotates in steps. Drive pulley 514 is coupled by a timing belt 518 (see FIG. 10) to the pulley 466 mounted to the shaft 464. Consequently, when the motor 510 is operated, the extension shaft 464 and its connected major shaft 436 rotate. Consequently, when a carrier 220 is gripped by the plunger tip 232, motor 510 is operated to rotate the carrier and move substrates 260 on the carrier in a planetary fashion past sputtering targets in the chamber.

The computer 46 controls the electrical drive pulses transmitted to motor 510. These pulses are monitored and counted to determine the degree and rate of rotation. Also, feedback to the computer is provided by signals from an optional conventional shaft encoder. This shaft encoder includes a reflector 522 coupled by coupler 520 to the motor shaft. A conventional optical through beam sender 524 senses the position of reflector 522 and thus of the motor shaft. Signals from the sensor 524 are transmitted to the computer and used to track the shaft position and thus the rotational position of the plunger. Therefore, for example, the plunger may be rotated to always position protrusion 438 in its down position following processing so that the plunger tip 232 is in position for easy withdrawal from a carrier 220 and insertion into the nest carrier.

Transporter, Track and Track Drive Mechanisms

The transporter or robot 222, track 224, and track drives 226 are shown in FIGS. 15, 23, 24, 24a and 25. These mechanisms are designed to transfer carriers 220 from one chamber to the next chamber when the valve housing 26 between the chambers is open.

In general, a transporter 222 includes an elongated body 530 (FIGS. 23, 24, 25) supported at its front and rear ends by respective wheel supported trolleys 532, 534. These trolleys travel along the track 224 from chamber to chamber. The transporter arms 340, 342 are vertically extending, parallel, spaced apart, and are mounted at their bases to the respective sides of the body 530. Each of the arms is provided with a respective arcuate cradle or saddle 540, 542 at its upper end. The hub 278 rests in these cradles (FIGS. 23, 24) with the carrier 220 positioned between the arms, when the carrier is loaded onto the transporter 222. The hub ring 280 and a section 544 of hub 278 act as spacers to maintain the separation between the carrier 220 and the arms 340, 342.

Figure 23:
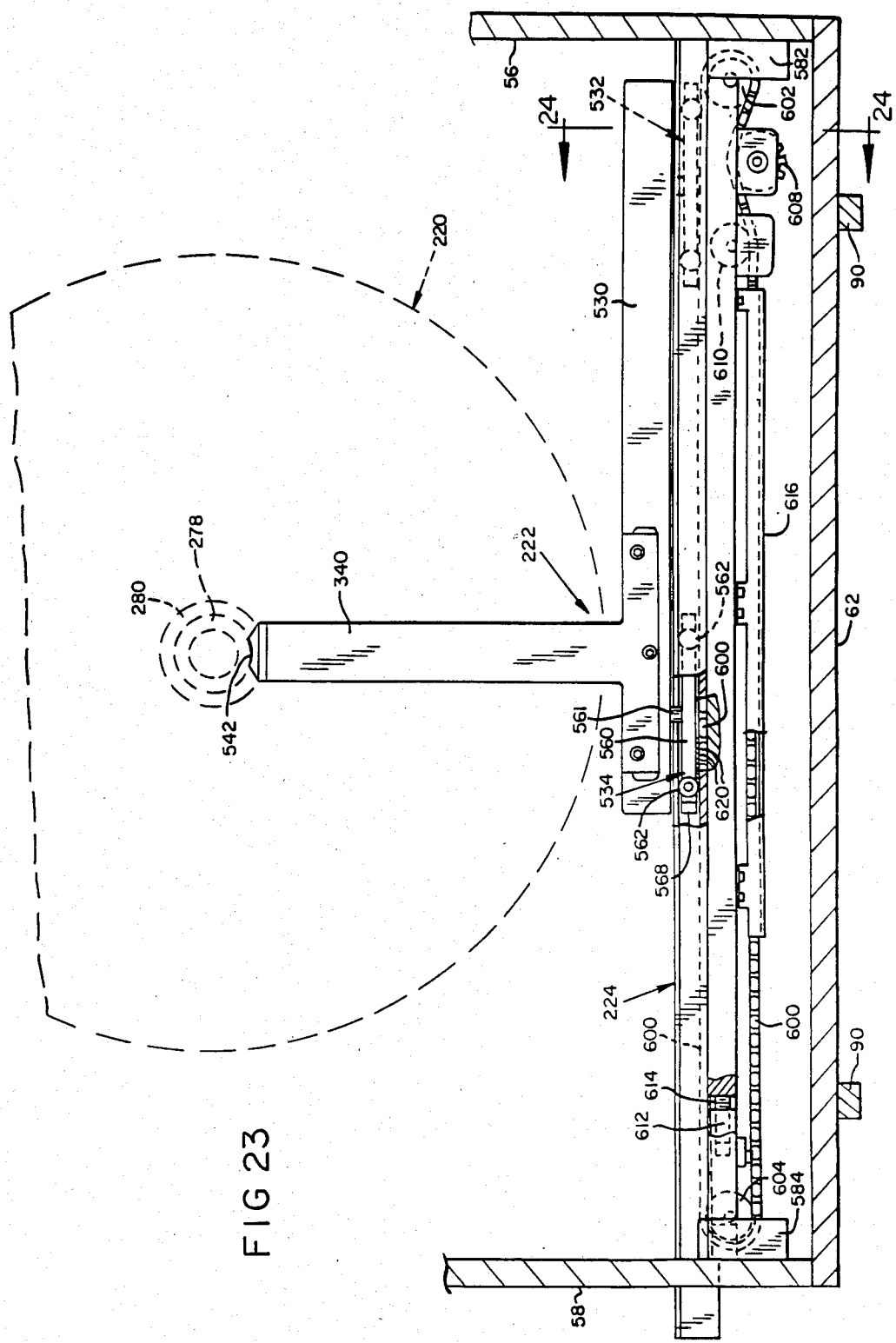
FIG. 23 is a side elevational view of one form of a transporter, transporter track, and transporter drive mechanism which transfers the substrate carriers, and thereby the substrates, between the chambers of the system of FIG. 1.
Figure 25:
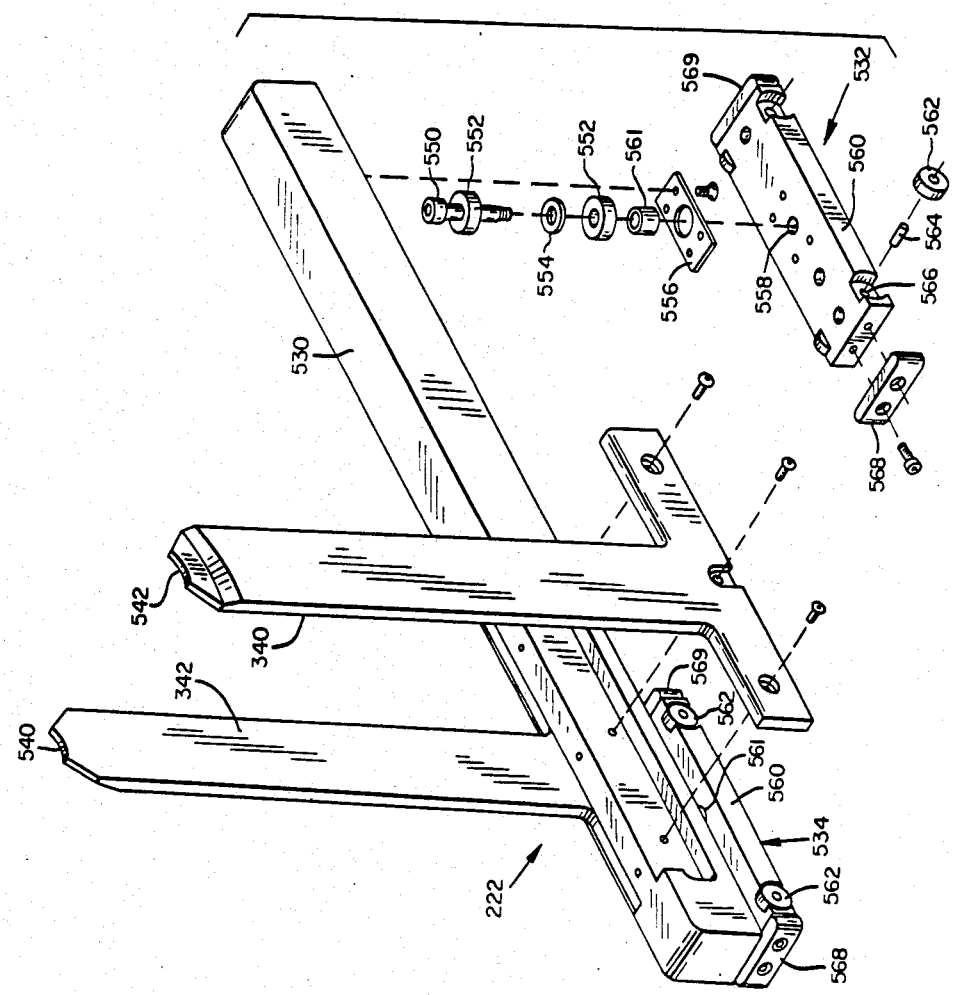
FIG. 25 is an exploded view of the transporter of FIG. 23.

As shown in FIGS. 23 and 25, the arms 340, 342 are displaced from the center of the trolley body 530 toward one end of the body. With this construction, following the loading of a carrier onto a plunger in a processing chamber, the transporter 222 is moved to a parked position adjacent wall 58. This moves the arms 340 and 342 out of the way of the sputtering targets so that there is no need to remove the transporter from the chamber prior to sputtering, if desired.

Each of the trolleys 532, 534 are pivotally mounted to the underside of the body 530 as shown in FIG. 25. That is, a shoulder screw 550, together with a pair of bearings 552 and a spacer 554 mounted thereon, are inserted into a recess at the underside of the trolley body. A cover plate 556 holds this assembly within the recess. The lower end of screw 550 is threaded into an opening 558 formed in the upper surface of a trolley body 560 of the trolley 532. An annular spacer 561 maintains a separation between the elements 530 and 560. Trolley wheels 562, which comprise bearings, are each press fit onto a dowel 564 which is then pressed into an opening 566 of the trolley body to secure the wheel to the trolley. This construction also allows for compliance along the plane of the track since each trolley pivots on its own center. The trolley also is provided with non-metallic bumpers 568, 569.

The ends of a track in a chamber are spaced from the respective ends of the tracks 224 in adjacent chambers. Thus, a gap exists in the tracks between the chambers. These gaps are located within the isolation valve housings 26 and the valves 110 (FIG. 7) slide in these gaps to close and isolate the chambers without interference by the tracks. This arrangement of two trolleys per transporter 222 enhances the smooth transfer of the transporter across these gaps between tracks 224 in adjacent chambers. Also, the distance between the front and rear sets of wheels of each trolley is greater than the distance across the gap. This facilitates travel of the trolleys across the gaps without skipping.

The track assembly 224 comprises an elongated straight rigid trolley supporting track 580 supported at walls 56 and 58 by track mounts 582, 584. A trolley receiving recess 586 is formed in the upper surface of the track 580 and is bounded by first and second track side walls 588, 590. The trolleys 532, 534 fit within this recess and are guided in a linear direction along the longitudinal axis of the track by the side walls 588, 590. The bumpers 568, 569 guide the trolleys along the track and prevent undesirable particulate generating metal-to-metal contact between the trolley 560 and track walls 588, 590. The track is positioned in the chambers to guide the transporter 222 and supported carrier 220, with the supported substrates positioned in a plane centered between the front and rear sputtering target assemblies 40 or 42. This enhances the uniform sputtering of the substrates 260 during the previously described deposition processes. First and second elongated cover strips 592, 594 are mounted to the upper surfaces of the respective walls 588 and 590. Covers 592, 594 prevent the trolleys from lifting upwardly out of the track. An elongated chain guiding slot 596 is provided in the floor of the recess 586. Another such chain guiding slot 598 is provided at the underside of the track 580 for purposes explained below.

The transporter 222 is driven along the track by a chain drive mechanism 226 as follows. Specifically, as shown in FIG. 23, a continuous loop of chain 600 spans the chamber and is supported at its respective ends by toothless pulleys 602, 604. From pulley 602, the lower section of the chain passes over and is drivenly engaged by a drive sprocket 608. An idler wheel 610, in cooperation with the pulley 602, maintains the chain 600 in contact with the drive sprocket. The slot 598 provides clearance for the chain 600 where it passes over the drive sprocket 608. The pulley 604 is mounted to a tensioning block 612. Block 612 is shiftable toward and away from wall 58 by a tension adjustment screw 614 to thereby adjust the tension in the chain 600. Other optional chain tension adjustment mechanisms are equally suitable. For example, pulley 604 may be stationary and idler wheel 610 may be movable to adjust the chain tension. A chain guard 616 mounted to the underside of the track 580 guides the travel of the lower section of the chain. In addition, the upper section of the chain 600 passes through the chain guiding slot 596 and underneath the respective trolleys 532, 534. Each of the trolley bodies 560, as shown in FIG. 24a has a row of downwardly projecting chain engaging teeth 620. These teeth travel in the slot 596 (FIG. 24) and are engaged by the upper section of the drive chain. Consequently, when the chain is driven in either direction, the transporter 222 is correspondingly driven.

The same link (i.e., 622 in FIG. 24a) always engages the same tooth of a transporter in the chamber. Therefore, by monitoring the position of this link, the position of the transporter in the chamber is known. The transporters have four positions within a chamber, corresponding to four positions of the link. These positions include a load position in which the hub 278 is centered on the plunger 228, a parked position in which the transporter is moved adjacent to a wall 58 to shift the arms 340, 342 out of the way of the sputtering targets, a rear crossing position in which the transporter is positioned for a transfer to the left, and a forward crossing position in which the transporter is positioned for a transfer to the right. In addition, two positions of the link are used when a transporter is not engaged on the chain containing the link. These additional link positions include a rear crossing offset, in which the chain is positioned for entry of a transporter from a chamber to the left (i.e. in FIG. 23), and a forward crossing offset, in which the chain is positioned for entry of a transporter from a chamber to the right.

In a left to right transfer (as shown in FIG. 24a), the track chain in the right chamber is shifted to its rear crossing offset. Then, the track chain in the left chamber is shifted to its forward crossing position which positions the forward tooth 620 to the point of contact with the chain link which is beyond the link 622. As shown in FIG. 24a, the receiving chain is in a proper position when the top of the roller link 622 is spaced just below (exaggerated in FIG. 24a) the lower edges of first tooth 620. This alignment reduces the wear and the potential binding of the chain. After the transporter is driven to the right, to the point of contact as previously described, the chain drive in the left chamber is halted. The chain drives in the left and right chambers are then driven simultaneously, in synchronization, in a direction which moves the transporter to the right and into the right chamber. In a right to left transfer, the track chain in the left chamber is positioned at its forward crossing offset. Then, the track in the right chamber is positioned at its rear crossing position. The chain drives are again simultaneously driven in synchronization to drive the transporter into the left chamber.

The same link (i.e., link 622 in FIG. 24a) always engages the same tooth of a transporter.

Figure 24:
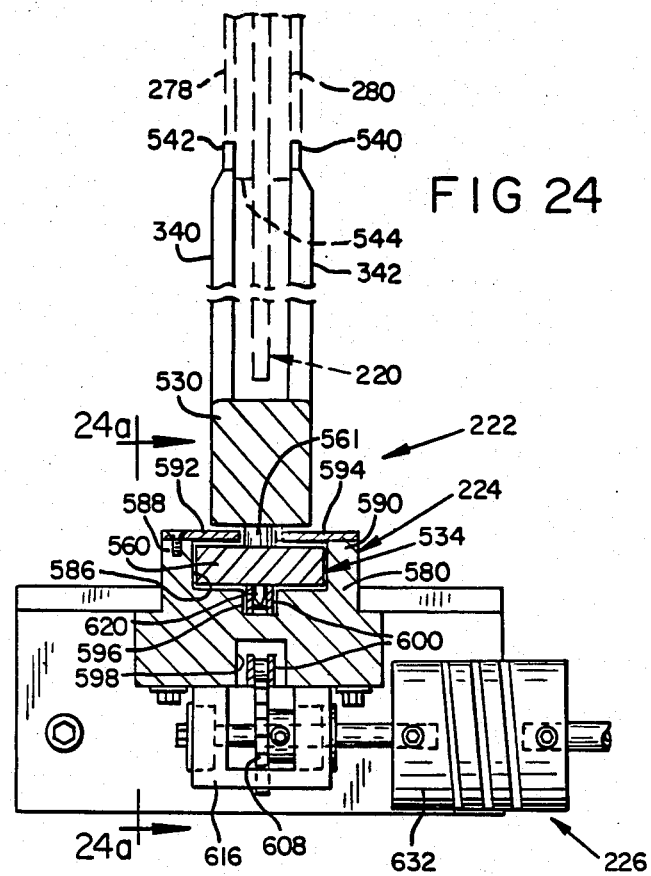
FIG. 24 is a vertical sectional view of the transporter, track, and transporter drive mechanism taken along lines 24—24 of FIG. 23.
Figure 24A:
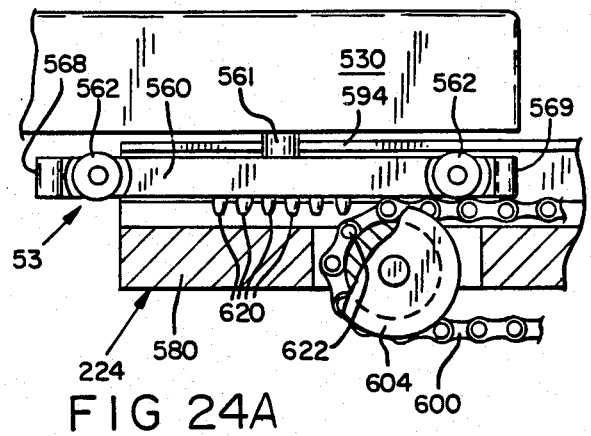
FIG. 24a is a side elevational view of a portion of the transporter, track, and transporter drive mechanism, taken along lines 24a—24a of FIG. 24, but with the transporter shifted to a position in which the transporter is ready to cross from the chamber in FIG. 23 to a chamber to the right of this chamber.

With reference to FIGS. 15 and 24, the drive mechanism 226 includes a step motor 626 drivenly connected by a belt to a drive pulley 628. This pulley is coupled through a rotary seal 630 to a flexible coupling 632 located within the chamber. As shown in FIG. 24, the flexible coupling 632 is connected to the drive sprocket 608. Therefore, when the motor 626 is operated to drive the drive sprocket either in the clockwise or counterclockwise directions, the chain is driven in the corresponding direction. The computer 46 controls the transmission of drive pulses to the motor 626. By counting these pulses, the computer tracks the position of the chain links 622 and thus the position of transporters 222 in the system. A shaft encoder (not shown, but integral with the motor) is utilized to monitor the movement of the motor drive shaft in a conventional manner. Signals from the shaft encoder are transmitted to the computer to provide feedback of the position of the chain within the chamber. Of course, limit switches or optical detectors may also be used to monitor the positions of the transporter.

A single transporter 222 may be utilized to transfer a carrier 220 from the load chamber 12 through the deposition chambers 14–20, and to the unload chamber 22. In this case, after the carrier is unloaded in chamber 22, this transporter is returned to chamber 12 to receive the next carrier. However, in the illustrated preferred embodiment, to speed the processing, three such transporters are employed. The first transporter travels between chambers 12, 14 and 16. The second transporter travels between chambers 14, 16 and 18. Finally, the third of these transporters travels between chambers 20 and 22. Therefore, under the control of computer 46, certain of the transporters are transporting carriers 220 in certain parts of the system while other transporters are transporting other carriers elsewhere in the system.

Water Cooling System

Figure 29A:
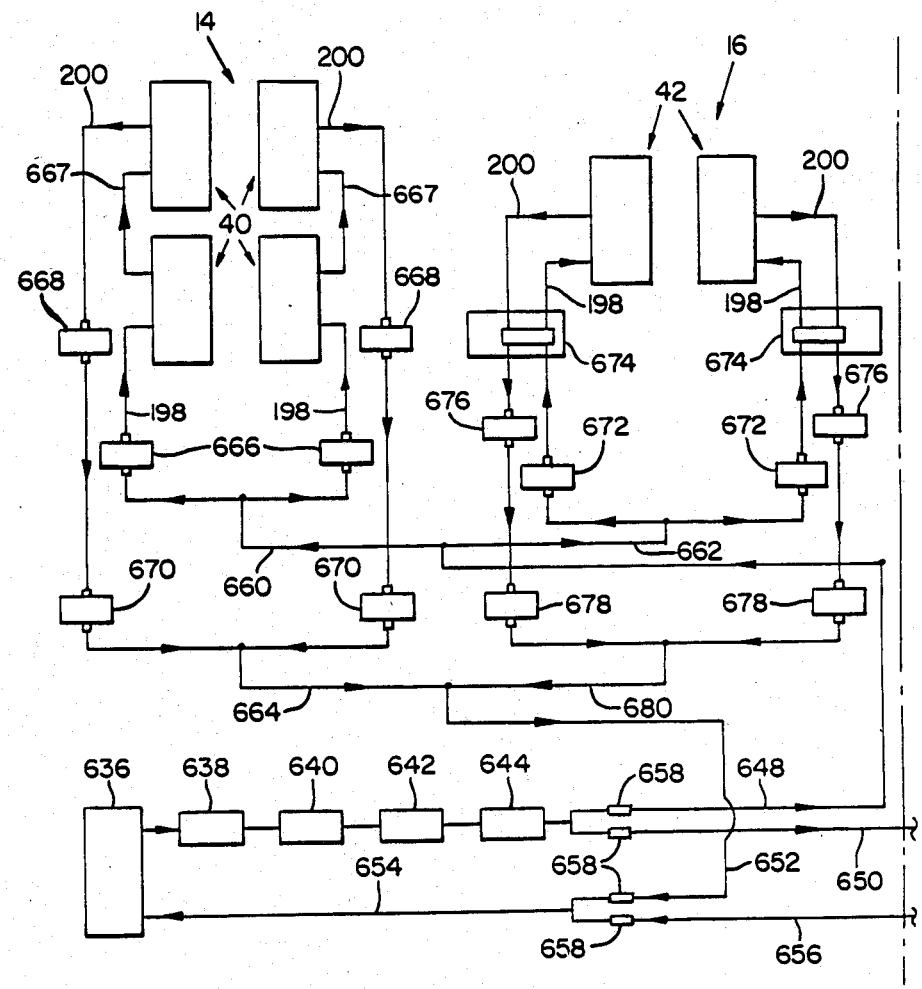
FIGS. 29A and 29B is a schematic diagram of a water cooling system utilized in the system of FIG. 1.
Figure 29B:
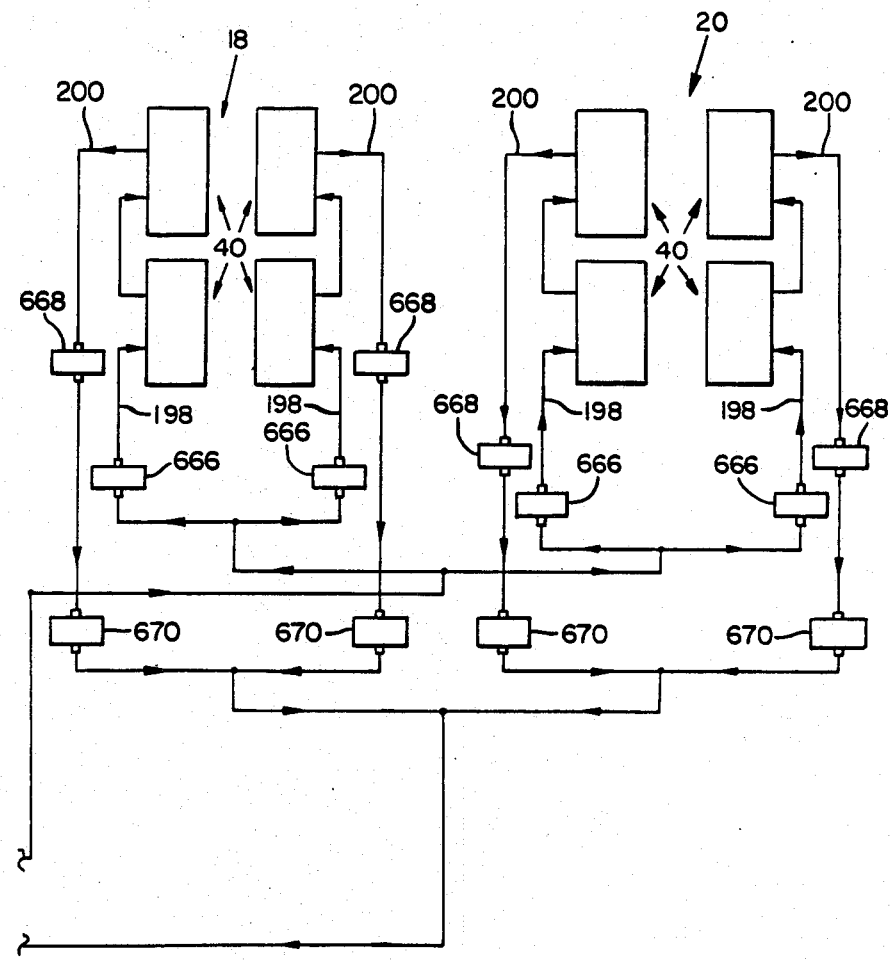
Figure 31:
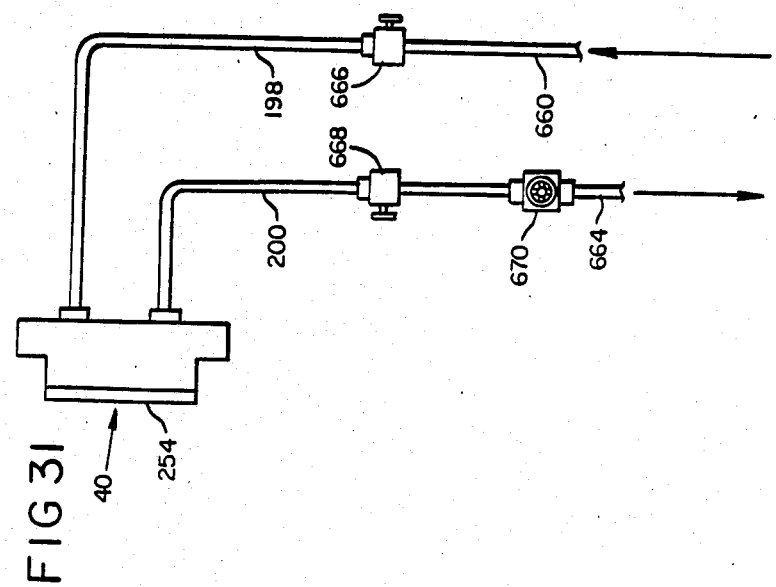
FIG. 31 is a schematic illustration of a portion of the water cooling system for direct current cathode sputtering targets of the type shown in FIGS. 14 and 15.
Figure 30:
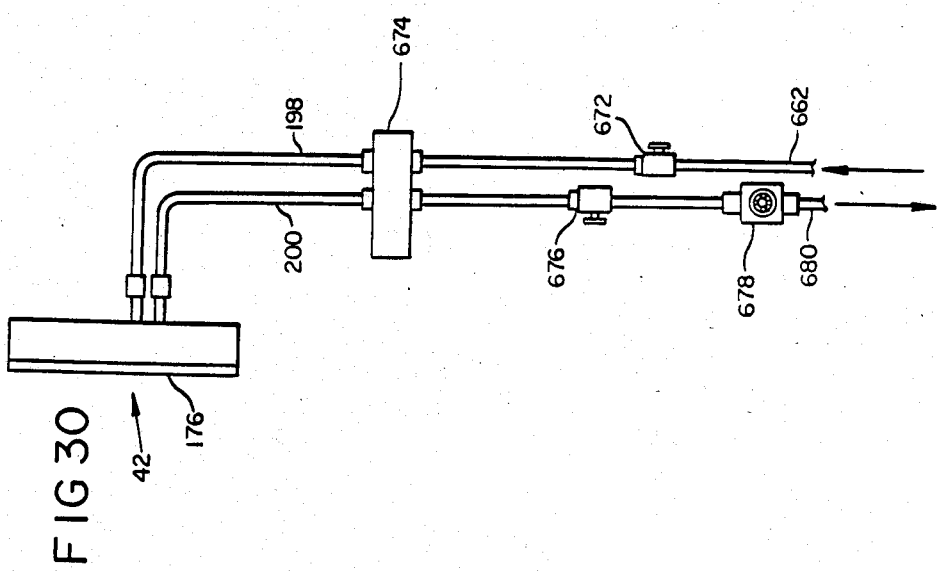
FIG. 30 is a schematic illustration of a portion of the water cooling system for radio frequency sputtering targets of the type shown in FIGS. 9-13.

The water cooling system for the cathode assemblies 40, 42 in the processing chambers 14 through 20 is shown in FIGS. 29–31. The FIG. 29 cooling system is a closed loop system. Alternately, water from a municipal water supply or other source may be utilized and returned to storm drains or a system sewer after use.

With reference to FIGS. 29–31, cool water from a refrigeration apparatus 636 is directed through a main shut-off valve 638, a filter 640, temperature and pressure switches 642, 644 and to branch lines 648 and 650. The temperature switch 642 is interlocked with a main shut-off valve for turning off water flow in the event the cooling water temperature exceeds a predetermined level, such as 70° fahrenheit. This shut-off valve is also closed and an alarm is triggered if the pressure sensed by pressure switch 644 exceeds a predetermined level, for example, sixty psig. Water entering line 648 is directed through the water jackets of the cathode assemblies 40, 42 of the chambers 14 and 16 and then returned via a line 652 to a main return line 654 and then to the cooling apparatus 636. Similarly, cooling water is fed through the water jackets of the cathode assemblies of chambers 18 and 20 and returned via a branch line 656 to the main return line 654. Manually operated shut-off valves 658 are provided for shutting off the water flow as desired. The cooling water supply system utilized for chambers 18 and 20 is identical to that utilized for chamber 14. Therefore, the cooling system for chambers 18 and 20 will not be described in detail.

Cooling water flowing along line 648 is directed as shown by the arrows to branch lines 660, 662 leading to the respective chambers 14, 16. From line 660, the cooling water is fed through lines 198 at the respective front and back sides of chamber 14. At each side of the chamber, water flows through one cathode assembly 40, through a coupling line 667, through another cathode assembly 40, and is returned via return line 200 to a branch line 664. From line 664, the water flows via lines 652 and line 654 to the cooling apparatus 636. Isolation valves 666 are positioned in the water supply lines between lines 660 and the respective lines 198. Similar isolation valves 668 are interposed between the lines 200 and the return line 664. When a set of valves 666, 668 associated with a flow path through a set of cathodes 40 at the front or rear of the chamber 14 are closed, the respective set of cathodes is isolated from the water supply system for repair or other purposes. Also, computer monitored water flow switches 670 are positioned between the lines 200 and 664. These switches enable the computer to detect water flowing through the front and rear sets of cathode assemblies 40 and to block energization of the cathode assemblies in the event cooling water is not being delivered to the assemblies.

In chamber 16, cooling water from the line 662 is directed through isolation valves 672 and through RF matching networks 674 to the respective cathode assemblies 42. The outlet lines 200 from these cathode assemblies pass through the RF networks 674, isolation valves 676 and water flow switches 678 to a water return branch line 680. From line 680, water is returned to line 652 and via line 654 to the cooling apparatus 636. The pairs of valves 672, 676 operate like the valves 666 and 668 to selectively isolate the cathode assemblies 42 from the water cooling system. In addition, the water flow switches 678 operate like the previously described switches 670.

Vacuum Pumping and Sputtering Gas Supply Systems

Figure 32:
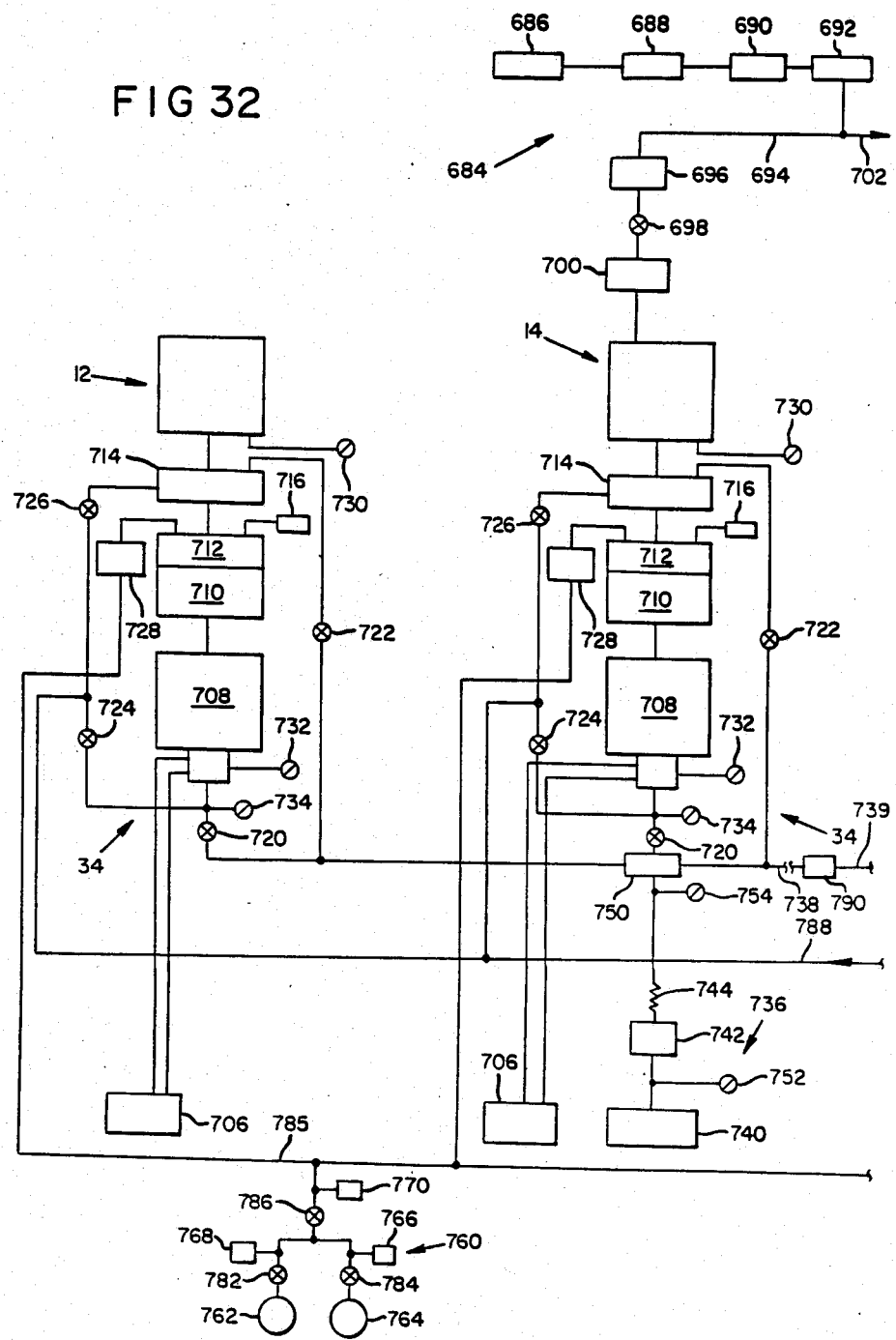
FIG. 32 is a schematic diagram of a vacuum system utilized in the system of FIG. 1.

The sputtering gas supply and vacuum pumping systems utilized in the embodiment of FIG. 1 are shown in FIG. 32.

Sputtering gas is supplied from one or more sputtering gas systems 684 to the chambers 14 through 20 for the sputtering processes. One such system is typically employed for each type of sputtering gas which is used. Argon or other sputtering gas from a source 686 is fed through a regulator 688, past a manually controlled shut-off valve 690, and through a two micron filter 692. From filter 692, the sputtering gas is delivered via a conduit 694 through a flow indicator 696, a computer actuated solenoid controlled valve 698, and through a needle valve 700 to the deposition chamber 14. Needle valve 700 is adjusted to provide the appropriate gas flow rate to the chamber. The solenoid controlled valve 698 is opened and closed in response to commands from the computer 46 to deliver sputtering gas to chamber 14 as required. A conduit 702 delivers the sputtering gas from filter 692 to other chambers utilizing the same type of gas. Each such chamber is provided with its own flow indicator, solenoid controlled valve and needle valve.

Each of the vacuum pumping stacks 34 are constructed from commercially available components. Furthermore, the pumping stacks 34 are identical and will be described in connection with the pumping stack used for chambers 12 and 14.

Each vacuum pumping stack 34 includes a cryo compressor 706 which is coupled to a cryo pump 708. The pump 708 is coupled to a variable speed orifice throttle valve 710 in communication with a cryo trap 712. The trap 712 is selectively coupled to the chamber 12 by a high vacuum valve 714. The cryo trap 712 is provided with a vent 716. Suitable solenoid actuated valves 720, 722, 724 and 726 are included in lines leading to the system for purposes explained below. However, in general, valve 720 comprises a cryo system regeneration valve, valve 722 comprises a rough vacuum valve, valve 724 comprises a vacuum system purging valve, and valve 726 comprises a chamber venting valve. In addition, a liquid nitrogen fill control valve 728 is also included. Furthermore, gauges numbered as 730, 732 and 734 are provided for monitoring the vacuum system.

The first three chambers 12, 14 and 16 are coupled by a rough vacuum line 738 to a mechanical rough vacuum pumping system 736. A similar rough pumping system is provided for the chambers 18, 20 and 22 and is coupled to these chambers by a rough vacuum line 739. A rough vacuum crossover valve 790 permits selective coupling of mechanical pumping system 736, via line 739, to chambers 18–22 and coupling of the other mechanical pumping system, via line 738, to chambers 12–16 as desired. The mechanical pumping system 736 includes a mechanical pump 740, a computer controlled solenoid operated shut-off valve 742, and a bellows 744. Also, a molecular sieve 750 is positioned in rough line 738 between the pump 740 and valves 720, 722 of each of the chambers 12, 14 and 16. A sieve heater (not shown) is provided within sieve 750. A similar sieve and heater is provided in rough line 739 for chambers 18, 20 and 22. In addition, pressure gauges 752 and 754 are provided for monitoring the status of the mechanical rough pumping system.

Liquid nitrogen is supplied to each of the cryo traps 712 via a line 785 from a liquid nitrogen supply system 760. The liquid nitrogen supply system includes first and second liquid nitrogen storage tanks 762, 764, pressure relief valves 766, 768, and 770, and computer controlled solenoid actuated flow valves 782, 784 and 786.

The gauges 730 monitor the chamber pressure and include a rough vacuum gauge for monitoring the establishment of the rough pressure in chamber 12. This rough vacuum gauge is of the commercially available type which transmits an electrical signal corresponding to the gauge pressure. This electrical signal is transmitted to the computer 46 for monitoring of the chamber pressure. Gauges 730 also include a high vacuum ion gauge for monitoring the vacuum in chamber 12 when a high vacuum is being established as explained below. In addition, gauges 730 include a thermistor gauge.

A suitable rough vacuum gauge is a series 275 Convectron gauge manufactured by the Granville-Phillips Company. Suitable ion and thermistor gauges are Perkin-Elmer DGC-III gauges. In addition, gauges 732 comprise cryo temperature gauges and gauges 734 may comprise Convectron gauges. The gauges 730 which monitor the chamber pressure are the same for chambers 12, 16 and 20 except that, in chamber 16, a capacitive monometer gauge is used as the rough pressure gauge. The gauges 730 for the chambers 14 and 18 comprise capacitive monometer gauges such as model 227 gauges produced by MKS Instruments. In addition, the gauges 730 for chamber 22 comprises a rough vacuum Convectron gauge. Also, although not shown in FIG. 32, the radio frequency sputtering chamber 16 includes a conventional hot filament for heating the sputtering gases as required.

Each of the above gauges, like the above described rough vacuum gauge, may be of the type which generates electrical signals corresponding to the parameter being measured. Such signals are transmitted to and monitored by the computer 46.

The vacuum pumping system 36 used in chamber 22 is like the pumping systems utilized in chambers 14, except that a throttle valve 710, cryo trap 712, liquid nitrogen fill valve 728, and source of liquid nitrogen is not used. Because fully processed substrates are received in chamber 22 and then unloaded, it is not as important to establish as high of vacuum in this latter chamber as in the other chambers. For that matter, by placing the components of the throttle valve in contact with the cryo pump, the cryo trap 712, liquid nitrogen supply, and nitrogen fill valves 728 may be eliminated from the other chambers as well.

The operation of the vacuum pumping system can be understood with reference to FIG. 32. Assume that a tray 270 of substrate containing carriers 220 have just been loaded in chamber 12 and the door to this chamber has been closed to seal the chamber. Also assume that a rough vacuum has been established in the cryo portion of the pumping system by the mechanical pump 740 via valves 720 and 724. In this case, valves 724 and 726 are closed. Also, the high vacuum valve 714 closes the path between the chamber 12 and the cryo trap 712. However, the rough valves 722 and roughing pump valve 742 are open. Pump 740 draws a rough vacuum from the chamber 12 via a path through valves 714, 722 and 742. After a rough vacuum has been established in the system, for example, one millitorr, valve 722 is closed. The high vacuum valve 714 is then opened and the cryo pump 708 is operated to continue the establishment of the desired vacuum in chamber 12.

Liquid nitrogen from sub-system 760 is delivered via liquid nitrogen fill control valve 728 to the cryo trap 712 to assist in the establishment of the high vacuum. After the high vacuum is established, it is maintained within chamber 12 due to the tightly sealed nature of this chamber. In addition, because the chamber 12 is selectively isolable by the isolation valves from the adjoining chamber, a vacuum may be established in this chamber without interfering with a previously established vacuum inside the adjoining chamber.

It is important to establish an extremely high vacuum in the chamber 12 prior to opening this chamber to the adjoining chamber. For example, a vacuum on the order of $1 \times 10^{-7}$ torr may be established in chamber 12. Otherwise, it has been found that some contamination, for example water vapor from fresh substrates loaded into chamber 12, remains when the carriers 220 are transported into chamber 14. This water vapor can interfere with the uniformity of discs produced by the process. Purging gas such as filtered nitrogen, is delivered along a line 788 through valves 724 and 726 at desired times to purge the vacuum pumping system and also to eliminate the vacuum within chamber 12 prior to opening the door and loading of additional substrates to be processed.

In the processing chambers 14 through 20, following the initial establishment of a high vacuum in these chambers, the chambers are pressurized to the desired pressure with sputtering gas from gas system 684.

A further understanding of the vacuum system will be apparent from the computer logic descriptions and algorithms set forth below.

Computer Control System

As previously mentioned in connection with FIG. 1, a programmed digital computer 46 in conjunction with terminals 48 are used to monitor and control the system. The computer 46 may comprise, for example, a Hewlett Packard Model 1000 Programmable Digital Computer. The control software used in the computer is designed to control the various sub-systems of the processing system of FIG. 1, including the vacuum pumping sub-system, the materials handling sub-system, and the sputtering sub-system.

In the control instrumentation, the positions of the drive shafts of the six track drive motors 626 are monitored via the track drive encoders. The track drive motors 626 are stepped by motor drive pulses under the control of computer 46. The computer monitors these drive pulses and, together with the drive pulse count and feedback from the encoders, the position of the transporters in the system is known. Similar step motors 338 and 510 control plunger rotation and the position of the traveling block 330 of the loader/unloader mechanisms. Encoder feedback is also provided for the loader and unloader drive mechanisms.

Thus, there are twelve step motor axes which are monitored by the computer. Each of the plunger axes, when the optional encoder feedback system is not used, employs a commercially available step motor controller having an indexer and driver card. One suitable step motor controller is available from Superior Electric Company and is designated the Modulynx control system. The indexer produces a timed series of pulses as required to sequence the windings of the step motor 510 and produce rotation of the motor shaft and plunger 228. The computer communicates with the step motor controller, as explained below, programs the indexer card with the desired velocity, acceleration and other parameters, and controls the operation of the indexer to produce the desired outputs for step motor operation. The driver card amplifies the indexer pulses to a level required to produce a useful amount of torque at the shaft of each of the step motors 510.

The instrumentation for controlling the chain drive motors 626 for the transporter drive mechanisms 226, and the loader/unloader motors 338, include an indexer card, a driver count card, and a count compare card. Such a count compare card is also available as a part of the Modulynx system. The function of the indexer and driver cards is the same as described above for the plunger motors 510. The count compare card is used to count pulses transmitted from the shaft encoders associated with each of the chain drive motors and the loader/unloader motors. This allows closed loop monitoring of the operation of the step motors so that the actual motor shaft rotation, and thus the distance traveled by the driven component, may be verified after a move is complete.

Communication between the step motor controllers and computer 46 is through commercially available interface cards in the step motor controllers. These interface cards link the computer to the indexer and the count compare cards. While a step motor is operating, the indexer cards generate motion busy signals which are sensed by a data acquisition control unit and fed through a conventional data acquisition control unit interface to the computer. The data acquisition control unit may comprise a Hewlett-Packard Model 3497A main frame computer which employs commercially available function cards. Two or more such units are typically used in the system.

The data acquisition control units interface the electrical hardware of the system of FIG. 1 to the computer. Four different types of function cards are used in the data acquisition control unit. The first type of function card is a sixteen channel digital input card used to sense motion busy signals from the indexer cards in the step motor controllers, and also the state of all of the limit switches of the system of FIG. 1. These digital cards produce signals corresponding to the state of the sensed components. These signals are then read by the computer through the data acquisition control unit.

A second type of function card is an eight channel high voltage actuator card used to control solenoids employed in the system of FIG. 1. Each card contains eight programmable relays. In response to signals from these cards, solenoids are operated to supply air pressure to control the valve cylinders 30, cylinders 470, 506 of the plungers 228, and other air controlled components of the system. In addition, other components are also controlled by such actuators, including the sputtering power supplies.

A third type of function card utilized in the data acquisition control unit is a twenty channel analog multiplexer card used to gate a selected analog voltage signal into an internal volt meter of the data acquisition control unit. Each card contains twenty relays suitable for gating of low level analog signals. The digital computer selects the analog signal of interest, by programming a corresponding multiplexer relay, from the multiplexer cards. The computer then reads the internal voltmeter through the data acquisition control unit interface. The voltage is then converted to a representation of the physical parameter, such as pressure, by the computer. As a result, the computer is interfaced between vacuum and other physical parameter monitoring instruments in the system.

A final type of function card is a dual voltage digital to analog output card. These cards are utilized to convert a number generated by the computer 46 to a corresponding control voltage level. Each card contains two channels of digital to analog capability for generating voltage signals of from plus to minus ten volts, at fifteen milliamps. The computer, via these digital to analog cards, directly controls devices which require voltage references. For example, the output power from the radio frequency generators, used in the radio frequency sputtering chamber 16 in the system of FIG. 1, is controlled in this way.

Each of the above data acquisition control units includes an internal clock which may be read by the computer when the system is energized to establish a system time.

The vacuum gauges described in FIG. 32, provide vacuum measurements used in controlling the operation of the vacuum pumping systems 34, 36. The vacuum gauges have analog outputs which interface to the computer 46 indirectly through the multiplexer cards described above. The computer monitors the signals, as explained above, to obtain a digital representation of the pressure sensed by the instrument. The instruments in this group include the convectron gauges, temperature sensors and capacitance monometers.

All computer control functions are implemented with software in the computer 46. The internal hard disc of the computer is used for general mass storage of data and programs. An internal micro-floppy disc is used for input and output of programs and data. In addition, the terminals 48 in FIG. 1 may comprise a system console and log for monitoring the performance of this system, an operator command entry terminal, and a color graphics terminal for displaying the status of the system. A printer may be employed to produce hard copy outputs from the control system.

The operation of the computer 46 to control the system of FIG. 1 will be readily apparent to one skilled in the art when considered in conjunction with the above information and the following logic descriptions. The description which follows explains the control algorithms implemented to accomplish the basic control processes in the system of FIG. 1. The control processes are categorized according to use.

Materials Handling System Control Processes

Load-Carrier Process

This process is used to transfer the next available carrier 220 from the planetary tray 270 to the finger 322 of the loader arm 320 in preparation for transferring the carrier to the transporter in the load chamber 12.
Algorithm:
(1) If a carrier 220 is on the loader finger 322, then skip to step 8.
(2) If the planetary tray 270 is empty, then terminate with error.
(3) If the first transporter 222 is in chamber 12, then open the chamber 12 to 14 gate valve 28 and move the first transporter from chamber 12 to chamber 14.
(4) Put loader arm 320 in a down position.
(5) Move the loader arm 320 to tray position of next available carrier 220 and insert finger 322 in hub 278.
(6) Put loader arm 320 in up position.
(7) Move loader arm 320 to load position with carrier 220 aligned with track.
(8) Finished.

Advance-Material Process

This process is used to transfer a carrier from a source chamber to a destination chamber, the destination chamber being the next chamber in the process. Three sub-processes are used in this process and will be described here before the main Advance-Material Process.

Advance-Material/Material-to-carrier sub-process

This sub-process is used to move a carrier 220 from a plunger 228 to a transporter 222 in a chamber.
Algorithm:
(1) If transporter 222 not in chamber, then terminate with error.
(2) If chamber is 12, or chamber is 22, or carrier 220 is on the transporter in the chamber, then skip to step 16.
(3) If carrier 220 is not on the plunger 228, then terminate with error.
(4) If plunger is inserted (in forward position in chamber), then skip to step 9.
(5) Check for operator requested pause.
(6) Move transporter 222 to park position.
(7) Check for operator requested pause.
(8) Insert the plunger (move forwardly).
(9) Check for operator requested pause.
(10) If transporter not at load position then move it to load position.
(11) Check for operator requested pause.
(12) Release the plunger grip.
(13) Check for operator requested pause.

(14) Withdraw the plunger 228 (move rearwardly).
(15) Check for operator requested pause.
(16) Finished.

Advance-Material/Material-to-Plunger sub-process

This sub-process is used to move a carrier 220 from a transporter 222 to a plunger 228 in a chamber.
Algorithm:
(1) If chamber is 12 or chamber is 22 or carrier 220 is on the plunger, then skip to step 14.
(2) If transporter 222 is not in the chamber, then terminate with error.
(3) If carrier 220 is not on the transporter 222, then terminate with error.
(4) Check for operator requested pause.
(5) If plunger 228 is inserted into the chamber, then withdraw the plunger (move rearwardly).
(6) If plunger tip 232 is in clamping position, release it.
(7) Check for operator requested pause.
(8) If transporter not at load position, then move transporter to load position.
(9) Check for operator requested pause.
(10) Insert the plunger (move forwardly) into hub 278.
(11) Check for operator requested pause.
(12) Clamp the plunger tip 232 onto hub 278.
(13) Check for operator requested pause.
(14) Finished.

Advance-Material/Loader-material-to-carrier sub-process

This sub-process is used to move a carrier 220 from the loader 272 to a transporter in load chamber 12.
Algorithm:
(1) If carrier 220 not on loader arm 320, then terminate with error.
(2) If loader arm 320 is in down position, then put it in up position.
(3) If loader arm 320 is at load position, then skip to step 6.
(4) If transporter 222 is in load chamber 12, then open chamber 12 to chamber 14 valve and move transporter to chamber 14.
(5) Move loader to load position.
(6) Move transporter to load position in chamber 12.
(7) Put loader arm 320 in down position.
(8) Move loader arm 320 to park position adjacent rear wall of chamber 12.

Main Advance-Material Process

Algorithm: (for main process)
(1) If carrier 220 not in source chamber, then terminate with error.
(2) If carrier 220 in destination chamber, then pause with error.
(3) Repeat step 2 until carrier 220 not in destination chamber or until process is aborted by operator.
(4) Determine which transporter will be used to transport the carrier as follows:

| Source Chamber | Carrier Used |
|---|---|
| 12 | 1 |
| 14 | 1 |
| 16 | 2 |
| 18 | 2 |
| 20 | 3 |

(5) Record current state of valve between source chamber and destination chamber (opened or closed).
(6) If valve closed then open it.
(7) If source chamber is chamber 12, then execute Loader-material-to-carrier sub-process or else execute the following two sub-steps:
 (7a) Move transporter selected in step 4 to load position in source chamber.
 (7b) Execute Material-to-carrier sub-process in source chamber.
(8) Move transporter selected in step 4 to load position in destination chamber.
(9) If source chamber is a transporter home chamber (chamber 14 for first transporter, chamber 18 for second transporter, or chamber 22 for third transporter) then execute the following two sub-steps:
 (9a) Execute Material-to-plunger sub-process in destination chamber.
 (9b) Move transporter selected in step 4 to source chamber.
(10) Close the gate valve between source and destination chambers.

Unload-Carrier Process

This process is used to transfer a carrier 220 from a transporter to the next available position in the planetary tray 270 in the unload chamber 22.
Algorithm:
(1) If transporter is not at load position then terminate with error.
(2) If loader arm 320 is not at park position in unload chamber 22, then terminate with error.
(3) If carrier 220 is on the loader arm, then terminate with error.
(4) If carrier 220 is not on the transporter, then skip to step 13.
(5) Put loader arm 320 in down position.
(6) Move loader arm 320 to load position.
(7) Put loader arm 320 in up position.
(8) Move transporter to park position.
(9) If planetary tray 270 is full, then skip to step 12.
(10) Move loader arm 320 to next available tray position.
(11) Put loader arm 320 in down position.
(12) Move loader arm 320 to park position.
(13) Finished.

Sputtering Processes

Process-Material

This process is used to perform a deposition in a selected chamber. Several sub-processes are used in this process and are described first before describing main sputtering process. Some sub-processes mentioned below are described above in the Materials Handling System Control Processes.

Sputtering Processes

Back-Fill-Chamber Sub-process

This sub-process is used to bring the pressure of sputtering gas in the chamber to the required level before igniting a plasma.

Algorithm:
(1) Check for operator requested pause.
(2) Close throttle valve 710.
(3) Open process gas valve 698.
(4) Wait for process gas stabilization time.
(5) Wait one second.
(6) Read chamber pressure.
(7) Repeat steps 5 and 6 until chamber pressure is within process gas pressure tolerance, or until a time out occurs.
(8) If timed out, then pause with error (an operator requested retry will cause execution of steps 5 through 8 again with another time out interval).
(9) Repeat steps 5 through 8 until the operator has continued or aborted the process when a time out occurs or until a time out does not occur.

Sputtering Process

Start-Sputter-Monitor Sub-process

This sub-process starts a sputter monitoring process, set forth below, which runs concurrently with the main sputtering process. The function of the sputter monitoring process is to monitor the deposition operation.
Algorithm:
(1) Set handshake flag to false.
(2) Start the sputter monitoring process.
(3) Wait for handshake flag to be set to true (this insures that the sputter monitoring process is running before continuing).

Sputter Processes

Ramp-power Sub-process

This sub-process is used to ramp up the power level of the RF power generators in a chamber to the desired sputtering power.
Algorithm:
(1) Calculate the power increment for front and rear power supplies as follows:
  front-increment: = front-power-level/steps-in-ramp
  rear-increment: = rear-power-level/steps-in-ramp.
(2) Set front-accumulation and rear-accumulation to 0.
(3) Increment front and rear accumulations as follows:
  front-accumulation: = front-accumulation + front-increment
  rear-accumulation: = rear-accumulation + rear-increment.
(4) Set front and rear power levels to the front and rear accumulations.
(5) Wait for time-per-step.
(6) Repeat steps 3 through 5 for 1 to (steps-in-ramp-1).
(7) Set front and rear power levels to the front-power-level and rear-power-level (this is the actual required power level).

Sputter Processes

Start-power Sub-process

This sub-process is used to ignite a plasma in a chamber.
Algorithm:
(1) If water flow not present in targets then pause with error.
(2) Close "power off" relay contacts for all sputtering power supplies in the chamber.
(3) Close "power on" relay contacts for all sputtering power supplies in the chamber.
(4) Turn on tesla coil.
(5) If power supplies are RF then execute the following two sub-steps:
  (5a) Wait for tesla pre-ignite time
  (5b) Execute Ramp-power sub-process.
(6) Set the plasma-on flag to true to indicate to the sputter monitoring process that deposition has started.

Sputter Processes

Stop-power Sub-process

This sub-process is used to terminate sputtering in a chamber.
Algorithm:
(1) If power supplies are RF then execute the following sub-steps:
  (1a) Set power output level of all supplies in the chamber to 0
  (1b) Wait for tesla pre-ignite time.
(2) Open "power off" relay contacts for all sputtering power supplies in the chamber.
(3) Set the plasma-on flag to false to indicate to the sputter monitoring process that the deposition is complete.

Sputter Processes

Sputter-in-chamber Sub-process

This sub-process is used to start plunger 228 rotating, to ignite a plasma, and to time the deposition process in a chamber.
Algorithm:
(1) Execute Start-sputter-monitor sub-process.
(2) Check for operator requested pause.
(3) Lock the process in its memory partition (for accurate timing of the deposition process).
(4) Calculate plunger 228 rotation time as follows:
  rotation-time: = process-time + 5 extra seconds
  If the sputtering power supply is an RF supply, then add an additional time to the plunger rotation for plasma ignition, power supply ramp up, and power supply ramp down.
  rotation-time: = rotation-time + tesla-pre-ignite-time + (steps-in-ramp * time-per-step) + tesla-post-ignite-time.
(5) Start plunger rotation.
(6) Execute Start-power sub-process.
(7) Wait for process time.
(8) Execute Stop-power sub-process.
(9) Unlock the process in its memory partition (so other processes can share the memory).
(10) Close the process gas valve 698.
(11) Open the throttle valve 710.
(12) Wait for plunger 228 to stop rotating.

Sputtering Processes

Process-Material

Algorithm:
(1) Check for operator requested pause.
(2) Execute Material-to-plunger sub-process in selected chamber.
(3) If a transporter is in the chamber, move it to park position.

(4) Close the chamber gate valves.
(5) Wait for the pre-deposition delay.
(6) Check for operator requested pause.
(7) Execute Backfill-chamber sub-process.
(8) Check for operator requested pause.
(9) Execute Sputter-in-chamber sub-process.
(10) Check for operator requested pause.
(11) Wait for the post-deposition delay.

Sputter Processes

Sputter Monitoring process

This process is used to monitor the deposition in the selected chamber. It is started automatically by the start-sputter-monitor sub-process described above.
Algorithm:
(1) Set handshake flag to true to indicate to the deposition process that the sputter monitoring process is running.
(2) Wait for the plasma-on flag to be set to true or until a time out occurs. A time out will occur after waiting for the process time for the deposition process.
(3) If time out has occurred then terminate.
(4) Wait for tesla post-ignite time.
(5) Open "power-on" relay contacts for all sputtering power supplies in the chamber.
(6) Turn off the tesla coil.
(7) Read chamber pressure.
(8) Calculate sum and sum of squares of pressure.
(9) Wait for 1 second.
(10) If no water flow in targets then turn off power supplies and terminate with error.
(11) Repeat steps 9 and 10 until deposition process is over or until time to sample the chamber pressure again.
(12) Repeat steps 7 through 11 until deposition process is over.
(13) Calculate mean and standard deviation of pressure samples.

Automatic Deposition Processes

This process is used to cycle a single carrier 220 from the load chamber 12, through all process chambers 14–20, and to the unload chamber 22, in an automatic mode run. The required number of repetitions of this process are invoked when an automatic run is started. Many of the previously defined sputtering processes are used by this process.
Algorithm:
(1) Execute Load-Carrier process.
(2) Execute Advance-Material process for chamber 12, set current chamber to chamber 14.
(3) If processing required in current chamber, then execute the Process-Material process for the current chamber.
(4) Execute Advance-Material process for the current chamber, and set the current chamber to the next chamber.
(5) Repeat steps 3 and 4 for current chambers of 14 through 20.
(6) Execute Unload-Carrier process.

Vacuum Pumping System Processes

These processes are used to draw a vacuum in a selected chamber. Several sub-processes are used and are described below.

Vacuum Pumping System Processes

Release-rough Lines Sub-process

This sub-process is used by the main vacuum processes in conjunction with a Get-rough lines sub-process to manage and share the use of the two rough pumping lines. It releases ownership of any rough lines owned by the main process making them available for use when not used by the main process. It also controls a rough cross valve 790 to couple the two rough pumps (742 and one not shown in FIG. 32) to either chambers 12, 14 and 16 or chambers 18, 20 and 22.
Algorithm:
(1) If both rough pumps are on line and at least one rough line is owned by the main process, then close the rough cross valve and skip to step 3.
(2) If at least one rough pump is on line and both rough lines are owned by the main process, then open the rough cross valve and skip to step 3.
(3) If the right rough line is owned by the main process, then release ownership.
(4) If the left rough line is owned by the main process, then release ownership.

Vacuum Pumping System Processes

Put-rough Pumps-on-line Sub-process

This sub-process is used by the main vacuum processes to put the rough pumps on line. This is normally required after a power failure.
Algorithm:
(1) If both rough pumps are on line then skip to step 6.
(2) Attempt to obtain ownership of both rough lines, try for no longer than 1 second each.
(3) If left rough pump is not on line AND the pressure at the pump is less than that required to put it on line AND the left rough line is owned AND (the right rough line is owned OR the rough cross valve is closed) then open the left rough pump cutoff valve.
(4) If right rough pump is not on line AND the pressure at the pump is less than that required to put it on line AND the right rough line is owned AND (the left rough line is owned OR the rough cross valve is closed) then open the right rough pump cutoff valve.
(5) Execute Release-rough lines sub-process.
(6) Finished.

Vacuum Pumping System Processes

Pump-rough Line-down Sub-process

This sub-process is used to verify that the specified rough line can be pumped to the pressure required by the main vacuum processes for use of the rough line. It assumes that the rough pump to be used is on line.
Algorithm:
(1) Wait for the rough line pressure to reach the proper pressure. Time out after the rough line time out value.
(2) If step 1 timed out, then execute the following sub-steps:
(2a) Close the rough pump valve
(2b) Pause with error
(2c) If a retry is requested by the operator, then open the rough pump valve and execute steps 1 and 2 again with a new time out interval.

(3) Repeat steps 1 and 2 until step 1 does not time out or until the process is continued or aborted by the operator.

Vacuum Pumping System Processes

Get-rough Lines Sub-process

This sub-process is used by the main processes in conjunction with the Release-rough lines sub-process to manage and share the use of the two rough lines. It obtains ownership of the specified rough line and also the other rough line if it is required by the main vacuum process. It verifies that the rough lines can be pumped down. It handles the case when only one rough pump is on line by opening the rough cross valve.
Algorithm:
 (1) Execute Put-rough pumps-on-line sub-process.
 (2) If both rough pumps are on line then execute steps 3 through 9 else skip to step 10.
 (3) Obtain ownership of the rough line.
 (4) Close all chamber rough and cryo regenerate valves for the rough line.
 (5) Close the rough cross valve.
 (6) Execute Pump-rough line-down sub-process for the rough line.
 (7) If the other rough line is required by the main vacuum process, then attempt to obtain ownership of the other rough line, but only try for 10 seconds.
 (8) If ownership is obtained in step 7, then execute the following sub-steps:
  (8a) Close all chamber rough and cryo regenerate valves for the other rough line
  (8b) Execute Pump-rough line-down sub-process for the other rough line
  (8c) Open the rough cross valve.
 (9) Skip to step 15.
 (10) If no rough pumps are on line then terminate with error.
 (11) Obtain ownership of both rough lines.
 (12) Close all chamber rough and cryo regenerate valves for both rough lines.
 (13) Open the rough cross valve.
 (14) Execute pump-rough line-down sub-process for the rough line. This has the effect of pumping both rough lines with one rough pump since only one pump is on line but the rough cross valve is open).
 (15) Finished.

Vacuum Pumping System Processes

High Vacuum Sub-Process

This sub-process is used to put a chamber of the system into a high vacuum mode. A rough-chamber sub-process is used in this main High Vacuum Sub-Process. It is documented here before the main process.

Vacuum Pumping System Processes

High Vacuum Sub-Process

Rough-Chamber Sub-Process

This sub-process is used to rough a chamber to a lower crossover pressure. The crossover pressure is at a predetermined level (i.e. one hundred microns) where the rough vacuum has been established to a low enough level for the high vacuum to be drawn by the high vacuum portions of the vacuum systems.
Algorithm:
 (1) If chamber pressure less than or equal to lower crossover pressure, then skip to step 10.
 (2) Execute Get-rough lines sub-process.
 (3) Close the associated chamber gate valves 28, process gas valve 698, vent valve 726, rough valve 722, and high-vacuum valve 710.
 (4) Check for operator requested pause.
 (5) Open chamber rough valve 722.
 (6) Wait for chamber pressure to reach lower crossover pressure, wait no longer than the chamber rough time out.
 (7) Close chamber rough valve 722.
 (8) If timed out then pause with error (an operator requested retry will cause steps 5 through 8 to be executed again with a new time out value).
 (9) Repeat steps 5 through 8 until not timed out or until operator has continued or aborted the process.
 (10) Finished.

Vacuum Pumping System Processes

High-Vacuum Sub-Process

Algorithm:
 (1) If high-vacuum valve 710 is opened then skip to step 10.
 (2) Check for operator requested pause.
 (3) Close the chamber gate valves.
 (4) Check for operator requested pause.
 (5) Execute Rough-chamber sub-process.
 (6) Wait for crossover delay.
 (7) Read chamber pressure.
 (8) Repeat steps 4 through 7 until chamber pressure is less than the upper crossover pressure, or until the number of allowed iterations has been exhausted.
 (9) Execute Release-rough lines sub-process.
 (10) If chamber pressure not less than upper crossover pressure, then pause with error (an operator requested retry will cause steps 4 through 10 to be executed again with a set of iterations).
 (11) Repeat steps 4 through 10 until chamber pressure is less than upper crossover pressure, or until process has been continued or aborted by the operator.
 (12) Check for operator requested pause.
 (13) Close the associated chamber isolation valves, process gas, vent, rough and high-vacuum valves.
 (14) Open the chamber high-vacuum valve 710.

Vacuum Pumping System Processes

Vent Process

This process is used to vent a chamber of the system to atmospheric pressure.
Algorithm:
 (1) Close the chamber isolation valves, process gas, vent, rough and high-vacuum valves.
 (2) Check for operator requested pause.
 (3) Open the chamber vent valve 726.
 (4) Wait for vent time.
 (5) Close chamber vent valve.

Vacuum Pumping System Processes

Rough and Chill Cryo Pump Process

This process is used to rough and chill a cryo pump. It is used by the Regeneration and Recover processes. Several sub-processes are used only in this process. These are documented here before the main process.

Vacuum Pumping System Processes

Rough and Chill Cryo Pump Process

Rough-cryo Sub-process

This rough-cryo sub-process is used to rough a cryo pump to the lower cryo crossover pressure.

Algorithm:
(1) If cryo pressure is less than or equal to lower cryo crossover pressure, then skip to step 12.
(2) Isolate the cryo pump from the rest of the vacuum pumping system.
(3) Execute Get-rough lines sub-process.
(4) Check for operator requested pause.
(5) Turn cryo compressor off.
(6) Set bakeout-complete flag(s) to false indicating that the molecular sieve(s) for the rough line(s) is being used and will require(s) baking out.
(7) Open the cryo regenerate valve 720.
(8) Wait for cryo pressure to reach the lower cryo crossover pressure, but wait no longer than the rough cryo time out value.
(9) Close the cryo regenerate valve 720.
(10) If step 8 timed out, then pause with error (an operator requested retry will cause steps 7 through 10 to executed again with a new time out interval).
(11) Repeat steps 7 through 10 until the cryo pressure is less than the lower cryo crossover pressure, or until the operator continues or aborts the process.
(12) Finished.

Vacuum Pumping System Processes

Rough and Chill Cryo Pump Process

Chill-cryo Sub-process

This sub-process is used to chill a cryo pump to a desired chill endpoint temperature.

Algorithm:
(1) If cryo temperature is less than or equal to the chill cryo endpoint temperature, then turn cryo compressor on and skip to step 7.
(2) Check for operator requested pause.
(3) Turn cryo compressor on.
(4) Wait for cryo temperature to reach chill cryo endpoint temperature, but wait no longer than the chill cryo time out.
(5) If step 4 timed out, then execute the following sub-steps:
(5a) Turn cryo compressor off
(5b) Pause with error (an operator retry will cause steps 3 through 5 to be executed again with a new time out interval).
(6) Repeat steps 3 through 5 until cryo temperature is less than or equal to the chill cryo endpoint temperature, or until operator continues or aborts the process.
(7) Finished.

Vacuum Pumping System Processes

Rough and Chill Cryo Pump Process (Main Process)

Algorithm:
(1) Check for operator requested pause.
(2) Execute the Rough-cryo sub-process.
(3) Wait for cryo crossover delay.
(4) Read cryo pressure.
(5) Repeat steps 2 through 4 until cryo pressure is less than upper cryo crossover pressure, or until the maximum allowed iterations have been executed.
(6) Execute the Release-rough lines sub-process.
(7) If cryo pressure is greater than the upper cryo crossover pressure, then pause with error (an operator requested retry will cause steps 2 through 7 to execute again with a new set of iterations).
(8) Repeat steps 2 through 7 until cryo pressure is less than the upper cross-over pressure, or until operator has continued or aborted the process.
(9) Execute Chill-cryo sub-process.

Vacuum Pumping System Processes

Sieve-Bakeout Process

This process is used to bake out one or both the molecular sieve traps 750 of the roughing pump system.

Algorithm:
(1) Execute Get-rough lines sub-process.
(2) If the bakeout-complete flag for the rough line is true, then skip to step 11.
(3) Determine if both sieves are to be baked out. Both sieves are to be baked out if both rough lines are owned by the main process.
(4) Turn on the sieve heater for the rough line.
(5) If both sieves are to be baked out, then turn on the sieve heater for the other rough line.
(6) Wait for the bakeout delay time.
(7) Execute Pump-rough line-down sub-process.
(8) Turn off the sieve heater for the rough line.
(9) Set the bakeout-complete flag for the rough line to true, indicating that the sieve for the rough line has been baked out.
(10) If both sieves were baked out, then execute the following sub-steps:
(10a) Turn off the sieve heater for the other rough line
(10b) Set the bakeout-complete flag for the other rough line to true.
(11) Execute Release-rough lines sub-process.

Vacuum Pumping System Processes

Regeneration Process

This process is used to regenerate a cryo pump of the system. Several sub-processes are used in this regeneration process and are described first.

Vacuum Pumping System Process

Regeneration Process

Start-bakeout Sub-process

This sub-process initiates the sieve-bakeout process.
Algorithm:
(1) Start the sieve-bakeout process.

Vacuum Pumping System Process

Regeneration Process

Purge-and-warm-cryo Sub-process

This purge-and-warm sub-process is used to bring the cryo pump to room temperature. The cryo pump is purged for an additional time after this temperature is achieved.

Algorithm:
(1) Execute Start-sieve-bakeout sub-process.
(2) Close the high-vacuum, purge and regenerate valves for the cryo pumping apparatus.
(3) Check for operator requested pause.
(4) Turn cryo compressor off.
(5) Open cryo purge valve.

(6) Wait for the cryo to reach room temperature, or for purge time out whichever comes first.
(7) If timed out, then pause with error (an operator requested retry will cause steps 6 and 7 to be executed again with a new time out value).
(8) Repeat steps 6 and 7 until room temperature is reached or until the operator has continued or aborted the process.
(9) Check for operator requested pause.
(10) Wait for the additional purge time.
(11) Check for operator requested pause.
(12) Wait for bakeout-complete flag to be set to true, but wait no longer than the bakeout delay plus the rough line time out (this flag indicates that the sieve bakeout started in step 1 is complete).
(13) Check for operator requested pause.
(14) Close cryo purge valve.
(15) If timed out in step 12 then terminate.

Vacuum Pumping System Process

Regeneration Process (Main Process)

Algorithm:
(1) Generate operator message to turn the cold trap fill controller 728 off.
(2) Record state of high-vacuum valve 710 (opened or closed).
(3) Close the high vacuum valve 710, purge valve 724, and regeneration valves 720 for the cryo.
(4) Check for operator requested pause.
(5) Execute Purge-and-warm-cryo sub-process.
(6) Check for operator requested pause.
(7) Execute rough and chill cryo pump process.
(8) Check for operator requested pause.
(9) If recorded state of high-vacuum valve is opened, then execute the high vacuum, sub-process.

Vacuum Pumping System Process

Recover Process

This process is used to recover the cryo pumps after a power failure. This process is automatically started after a power failure.

Algorithm:
(1) Determine if regeneration is allowed.
(2) Execute Put-rough pumps-on-line sub-process.
(3) Read cryo temperature and pressure.
(4) If cryo temperature is less than or equal to the chill cryo endpoint temperature OR cryo pressure is less than or equal to the lower cryo crossover pressure, then start the rough and chill cryo pump process for the current chamber and skip to step 6.
(5) If regeneration is allowed, then start the regeneration process for the current chamber, or else log a message indicating the cryo needs to be regenerated.
(6) Repeat steps 3 through 5 for chambers 12 through 22.

Operation of the First Embodiment

Substrates, such as electrolytic nickel plated aluminum substrates, are first suitably cleaned prior to processing. For example, the substrates may be sprayed with 1,1,1 trichloroethane which has been distilled and filtered through a 10 micron filter. This removes the majority of the polishing abrasives and residue from the substrates. Substrates are then ultrasonically cleaned in a degreaser bath containing 1,1,1 trichloroethane heated to 159°–162° C. and filtered to 10 microns. The substrates are raised through the vapor zone above this bath. Then, the substrates are lowered into a second bath containing 1,1,1 trichloroethane heated to 159°–162° C. and filtered to 10 microns and again ultrasonically cleaned. The substrates are raised through the vapor zone above this bath and lowered into still another bath containing 1,1,1 trichloroethane, which has been distilled from a boiling sump at 159°–162° C. From this last bath the substrates are raised into the vapor zone, allowed to drain, and then slowly raised at a slow rate to clear the vapor zone. These latter steps eliminate evaporation marks from the substrate surfaces. The cleaned substrates are stored in an enclosed box. Additional cleaning may be performed as needed.

After loading of a tray of substrates into chamber 12 (in a clean room), a vacuum is established in chamber 12. Also, a vacuum is established in chambers 14 through 22 as well. In addition, cathode assemblies 40, 42 may be pre-sputtered to bring these cathode assemblies to a steady state operation.

The loader 272 in chamber 12 then picks up the first of the carriers 220 from the tray and positions it in the center of the track in chamber 12. A transporter 222 then enters chamber 12 and is loaded with the carrier. The loaded transporter then travels to chamber 14, wherein the plunger 228 in this chamber is inserted into the hub 278 of the planetary carrier and grips and lifts the planetary from the transporter. The transporter is then shifted out of the way of the sputtering cathode assemblies 40 in chamber 14. The plunger 278 then rotates the planetary 220 and supported substrates and sputtering of a first layer (for example, of chrome) is performed. Following sputtering, the transporter 222 in chamber 14 transfers carrier 220 to chamber 16 and then returns to chamber 12 to fetch another carrier for chamber 14. A second transporter delivers substrates processed in chamber 16 to chamber 18 and also delivers substrates processed in chamber 18 to chamber 20. In this way, successive chrome, cobalt-platinum, chrome and carbon layers are sputtered onto the substrates. Finally, a third transporter transfers the processed substrates from chamber 20 to chamber 22. The carrier 220 is unloaded from this third transporter by an unloader mechanism 272 and placed onto a tray 270. In this manner, the processing continues.

After the last planetary 220 is lifted from the tray in chamber 12 and delivered to chamber 14, the vacuum in chamber 12 is relieved and the door 68 to this chamber is opened. The next tray of substrates is then loaded. Chamber 14 is isolated from chamber 12 during this loading operation. After the desired vacuum is reestablished in chamber 12, a first transporter from chamber 14 is returned to chamber 12 to obtain the first carrier 220 from this new tray.

In a similar manner, after the tray in chamber 22 is filled, chambers 20 and 22 are isolated and chamber 22 is opened to permit replacement of the filled tray with an empty tray. The vacuum is then reestablished in chamber 22. Thereafter, carriers are again transferred between chambers 20 and 22.

The isolation valves in housing 26 permit the isolation of the chambers from one another so that the parameters affecting sputtering may be optimized in each of these chambers. In addition, the processing speed is enhanced because processing may continue while additional trays of substrate containing planetaries are loaded and unloaded from the respective chambers 12 and 22.

Figure 33:
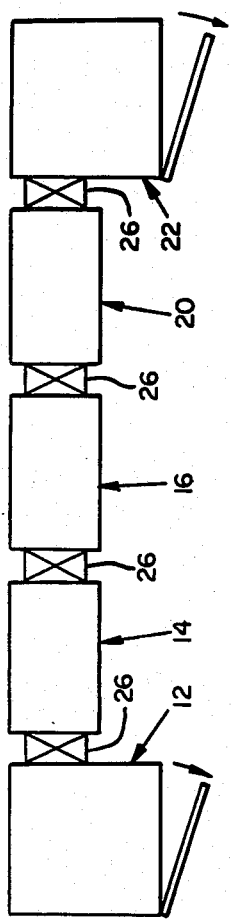
FIG. 33 is a block diagram of a second embodiment of a system for making thin film magnetic discs and other products in accordance with the invention.

Preferred Embodiment of FIG. 33

Another embodiment of the invention is shown in FIG. 33. This embodiment includes chambers 12, 14, 16, 20 and 22 like those shown in the embodiment of FIG. 1. In addition, isolation valves are also provided for selectively isolating these chambers from one another.

As can be seen from FIG. 33, this second embodiment of the invention eliminates the processing chamber 18. Therefore, during processing, the carriers 220 are transferred in the following sequence through the chambers of this embodiment. From load chamber 12, a carrier 220 is delivered to chamber 14 for sputtering of the underlayer onto the substrates. From chamber 14, the carrier 220 is transferred to chamber 16 for deposition of the second layer. From chamber 16, rather than travelling to a chamber 18, the carrier 220 is returned to chamber 14 for deposition of the third layer. In this case, both the first and third deposited layers are of the same material, such as chrome. The sputtering, power and other parameters are adjusted in chamber 14 to adjust the deposition of this third layer. For example, to make the third layer thinner than the first layer. From chamber 14, the substrates, now containing three deposited layers, are transferred to chamber 20 for deposition of the fourth layer. Finally, from chamber 20, the carriers are delivered to the unload chamber 22.

A single transporter 222 may be utilized to perform this sequence. However, three transporters are preferred, as in the case of the FIG. 1 embodiment. The first of these transporters travels from chamber 12 to chamber 14. The second of these transporters travels between chambers 14, 16 and 20. Finally, the third of these transporters travels between chambers 20 and 22.

The embodiment of FIG. 33 is slightly slower than the embodiment of FIG. 1, because of the fact that the chamber 14 is utilized for two depositions. Nevertheless, this embodiment illustrates the principle that the system does not require transportation of the carriers 220 in one direction from one end of the system to another.

Figure 34:
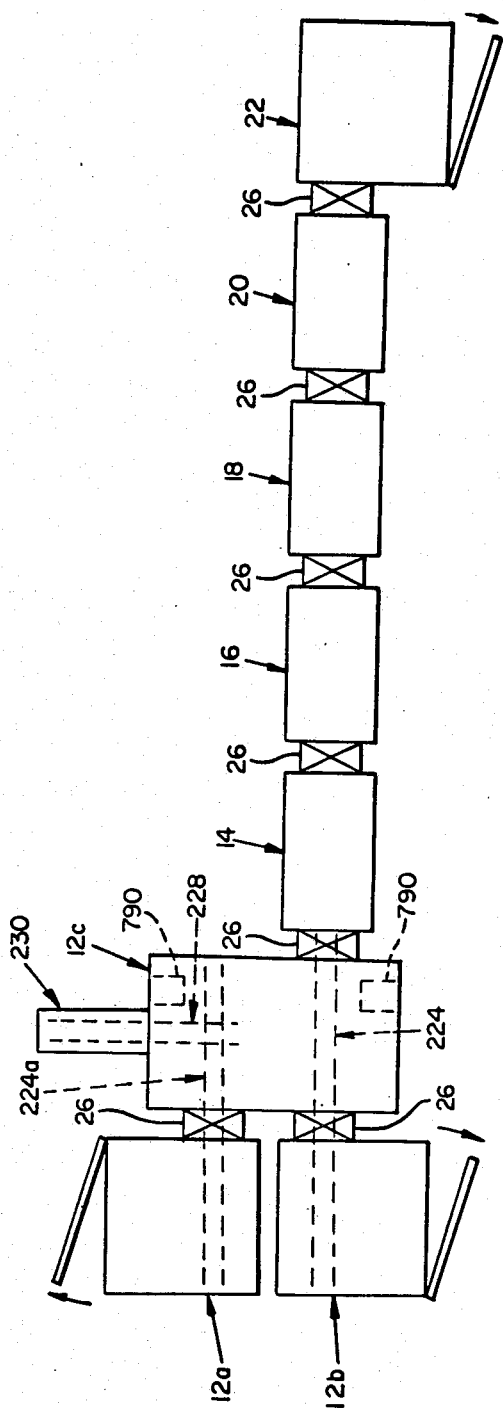
FIG. 34 is a block diagram of a third embodiment of a system for making thin film magnetic discs and other products in accordance with the present invention.

Preferred Embodiment of FIG. 34

Still another embodiment of the invention is shown in FIG. 34. This embodiment is like the embodiment of FIG. 1, except that the load chamber 12 has been modified to include a pair of load chambers 12a, 12b like the previously described chamber 12. In addition, an interface chamber 12c is also employed. The interface chamber 12c is positioned between the load chambers 12a, 12b and the first processing chamber 14.

Also, in the embodiment four transporters 222 are utilized. A first transporter travels between the chambers 12a and 12c on a track 224a located at the rear of chamber 12c. A second transporter travels between chambers 12b, 12c and 14. The third transporter travels between chambers 14, 16 and 18. Finally, the fourth transporter travels between chambers 18, 20, and 22.

In the FIG. 1 system, substantial time is required to establish a vacuum in chamber 12 to a desired high vacuum level before transfers between chambers 12 and 14 are permitted. In some cases, a delay in processing occurs because chamber 14 is empty for a period of time until the desired vacuum is established in chamber 12, and carriers 220 are again transferred from chamber 12 to chamber 14. The embodiment of FIG. 34 eliminates any such delay.

Specifically, a tray 270 of carriers 220 is positioned in chamber 12a and also in chamber 12b. A vacuum is established in these chambers. The carriers 220 are loaded from one of these chambers, for example chamber 12b, onto a transporter which carries the carriers through the interface chamber 12c and to the chamber 14 for processing as previously explained. When chamber 12b is emptied of carriers, processing continues by using carriers from chamber 12a. That is, the rear transporter 222 obtains a carrier from chamber 12a and carries it to interface chamber 12c. The plunger 228, which may be like those previously described, is then utilized to pick the planetary up from the transporter. This plunger carries the planetary toward the front of chamber 12c and loads it onto a transporter. This latter transporter carries the carrier to chamber 14 to continue the substrate processing. While carriers are being transferred from chamber 12a, a new tray is placed in chamber 12b and a vacuum is reestablished in this chamber. Thereafter, when chamber 12a is emptied of its carriers, the system then utilizes carriers from the replenished chamber 12b. Also, while the carriers are used from chamber 12b, a new batch of carriers is loaded into chamber 12a. Thus, in the embodiment of FIG. 34, alternately operating load chambers are provided for delivering a continuous supply of carriers to downstream chambers for processing.

Also, the unload chamber may comprise two unload chambers, like the load chambers 12a and 12b, together with an unload interface chamber like chamber 12c. However, this is not typically used. That is, uniformity in the processed discs is particularly affected by contaminants, such as water vapor, carried by unprocessed substrates from chamber 12 to chamber 14. By pumping chamber 12 to a high vacuum, such effects are minimized. However, the discs are far less sensitive after they have been completely processed. Consequently, discs may be transferred from chamber 20 to chamber 22 without waiting for the establishment of a vacuum which is as high as the vacuum in chamber 12.

In addition, sputter etching for cleaning purposes may be performed in chambers 12 and interface chamber 12c as desired. To accomplish sputter etching, sputtering assemblies and a plunger is utilized in these chambers. Sputter etching is accomplised by negatively biasing the plunger 228, and thus the carrier which is mounted to the plunger and the supported substrates. This causes positive ions in the plasma to bombard the substrates and remove a small quantity of material from the substrate surfaces. Substantially uniform etching occurs because the planetary motion imparted to the substrates during etching exposes both substrate surfaces to the plasma. Also, additional processing apparatus 790 may be placed in chambers 12 or 12c. Such apparatus may comprise commercially available ion guns which bombard the substrates with ions for cleaning purposes. Alternately, or in addition, such apparatus 790 may comprise substrate heaters for warming the substrates prior to delivery to chamber 14.

Having illustrated and described the principles of our invention with reference to several preferred embodiments, it should be apparent to those persons skilled in the art that such invention may be modified in arrangement and detail without departing from such principles. We claim as our invention all such modifications as come within the true spirit and scope of the following claims.

We claim:

1. A system for depositing plural thin film layers on a substrate comprising:
   first and second deposition chambers;
   a sealed transfer passageway means for interconnecting the first and second chambers so as to permit passage of a substrate through the transfer passageway means and between the first and second chambers;
   vacuum means for establishing a vacuum in the first and second chambers;
   first sputtering means disposed in the first chamber, for sputtering a first thin film layer of a first substance on the subtrate;
   second sputtering means disposed in the second chamber for sputtering a second layer of a magnetic material on the substrate such that said second layer having a coercivity which varies in a radial direction from the center of the substrate; and
   passageway closure means for selectively closing and sealing the transfer passageway means to selectively isolate the first chamber from the second chamber.

2. A system according to claim 1 in which said second sputtering means comprises means for sputtering a magnetic layer of cobalt-platinum on the substate wherein the platinum concentration in said magnetic layer decreases in the radial direction outwardly from the center of the substrate, thereby decreasing the coercivity of said magnetic layer in the radial outward direction.

3. A system according to claim 1 in which said second sputtering means comprises means for sputtering a second magnetic layer of cobalt-platinum on the substrate, and said first sputtering means comprises means for sputtering a first layer of chrome on the substrate, said first layer decreasing in thickness in a radial direction outwardly from the center of the substrate, thereby decreasing the coercivity of said second magnetic layer in the radial direction outwardly from the center of the substrate.

4. A system for processing substrates by depositing plural thin film layers on the substrates comprising:
   load chamber means having a substrate receiving inlet opening for receiving substrates to be processed by the system, the load chamber means also having an inlet closure means for closing and sealing the inlet opening following the loading of substrates through the inlet opening and into the load chamber means;
   first deposition chamber means coupled to the load chamber means for receiving substrates from the load chamber means for processing therein, first sputtering means positioned in the first deposition chamber means for sputtering a first thin film layer of a first substance onto substrates positioned in the first deposition chamber means;
   second deposition chamber means for receiving substrates from the first deposition chamber means for processing therein, second sputtering means positioned in the second deposition chamber means for simultaneously sputtering a second thin film layer of at least two constituent materials onto substrates positioned in the second deposition chamber means such that the relative concentration of one of the two constituent materials decreases in the radial direction outwardly from the center of the substrate;
   unload chamber means coupled to the second deposition chamber means for receiving substrates following processing by the second deposition chamber means, the unload chamber means having a substrate delivery outlet opening through which processed substrates are unloaded from the system, the unload chamber means also having outlet closure means for closing and sealing the outlet opening folloing unloading of substrates from the unload chamber means;
   transfer passageway means for interconnecting the load, first deposition, second deposition, and unload chamber means such that the load, first deposition, second deposition, and unload chamber means communicate with one another through the transfer passageway means, the load, first deposition, second deposition, and unload chamber means and the transfer passageway means defining a sealed substrate processing pathway along which substrates pass through the transfer passageay means and between the load, first deposition, second deposition, and unload chamber means;
   substrate transfer means for transferring substrates along the processing pathway between the load, first deposition, second deposition, and unload chamber means;
   vacuum means for establishing a vacuum in the load chamber means upon closure of the inlet opening, in the first and second deposition chamber means, and in the unload chamber means upon closure of the outlet opening;
   vacuum relief means for relieving the vacuum in the load chamber means prior to opening the inlet closure means and for relieving the vacuum in the unload chamber means prior to opening the outlet closure means;
   passageway closure means for selectively closing and sealing the transfer passageway means at locations between the load, first deposition, second deposition, and unload chamber means to selectively isolate and seal the load, first deposition, second deposition, and unload chamber means from one another, the passageway closure menas comprising means for isolating the load chamber means fromt he first and second deposition chamber means while the vacuum is relieved in the load chamber means during loading of substrates, the passageway closure means also comprising means for isolating the unload chamber means from the first and second deposition chamber means while the vacuum is relieved in the unload chamber means during unload of substrates.

5. A system according to claim 4 in which the system includes third deposition chamber means for sputtering a thin film layer on substrates positioned in the third deposition chamber means;
   the passageway closure means comprising means for selectively closing and sealing the transfer passageway means at locations between the load, first deposition, second deposition, third deposition and unload chamber means to selectively isolate and seal the load, first deposition, second deposition, third deposition, and unload chamber means from one another; and
   the substrate transfer means comprising means for transferring substrates from the load chambers means to the first deposition chamber means for deposition of the first layer on the substrate in the first chamber, the substrate transfer means comprising means for transferring substrates containing the deposited first layer to the second chamber means for deposition of the second layer thereon, the substrate transfer means comprising mean for transferring substrates containing the deposited first and second layers to the third chamber means for deposition of the third layer thereon, and the substrate transfer means comprising means for transferring substrates containing the first, second and third layers to the unload chamber means.

6. A system according to claim 5 including fourth deposition chamber means, fourth sputtering means in the fourth deposition chamber means for sputtering a thin film layer of a wear resistant substance on substrates positioned in the fourth deposition chamber means;

the passageway closure means comprising means for selectively closing and sealing the transfer passageway means at locations between the load, first deposition, second deposition, third deposition, fourth deposition and unload chamber means to selectively isolate and seal the load, first deposition, second deposition, third deposition, fourth deposition, andd unload chamber means from one another; and the substrate transfer means comprising means for transferring substrates containing the first, second and third layers from the third deposition chamber means to the fourth deposition chamber means for deposition of the fourth layer thereon, the substrate transfer means also comprising means for transferring substrates containing the first, second, third and fourth layers from the fourth deposition chamber means to the unload chamber means.

7. A system according to claim 6 including carrier means for carrying a plurality of substrates supported by the carrier means in a vertical plane, at least on such carrier means being loaded into the load chamber means during loading of substrates therein, the substrate transfer means including transporter means for transporting the carrier means, and thereby the substrates carried by the carrier means, along the processing pathway between the load, first deposition, second deposition, third deposition, foruth deposition, and unload chamber means, and transporter drive means for driving the transporter means along the processing pathway said carrier means supporting said plurality of substrates for planetary motion when the carrier means is rotated.

8. A system according to claim 7 in which the first, second, third and fourth deposition chamber means each include plunger means for engaging and lifting the carrier means from the transporter means in the respective first, second, third, and fourth deposition chambers, each plunger means comprising means for rotating the lifted carrier means during sputter deposition in the deposition chasmber to thereby impart planetary motion to the carried substrates during such deposition, each plunger means also comprising means for returning the carrier means to the transporter means following deposition.

9. A system according to claim 8 in which the carrier means has a central hub, each plunger means including hub gripping means for insertion into the hub of a carrier means positioned by the transporter means within the deposition chamber means containing the plunger means, the hub gripping means comprising means for gripping the hub and lifting the carrier means from the transporter means, the plunger means comprising means for rotating the lifted carrier during sputtering and for lowering the carrier means to the transporter means following deposition, and the plunger means including means for releasing the hub gripping means from the hub and withdrawing the hub gripping means from the hub after the carrier means is lowered to the transporter means, whereby the carrier means may then be carried by the transporter means along the processing pathway for further processing.

10. A system according to claim 9 in which each said carrier means comprises a vertical planar pallet plate having a central hub and at least one sputtering opening through the pallet plate, the sputtering opening being centered at a location spaced from the center of the hub, the carrier means also including substrate support means for supporting substrates on the pallet plate for imparting planetary motion to the substrates as the pallet plate rotates, a major portion of one surface of the supported substrates being exposed through the sputtering opening so as to permit sputtering of a layer of material through the sputtering opening and onto the one surface simultaneously with the sputtering of the surface of the supported substrates which is opposite to the one surface.

11. A system according to claim 10 in which the substrates are annular with a circular central opening of a first diameter bounded by a first circular edge portion of the substrate, the support means comprising sheave means having a circular substrate supporting groove of a second diameter which is less than the first diameter, means for mounting the sheave means adjacent to the sputtering opening with the substrate supporting groove in a vertical plane, the sheave means comprising means for loosely receiving the first circular edge portion on the substrate supporting groove to support the substrate for planetary motion as the pallet plate rotates.

12. A method of depositing at least one thin film layer on a substrate comprising:

loading at least one substrate into a load chamber while a vacuum in the load chamber is relieved;

establishing a vacuum in the load chamber;

placing the load chamber in communication with a first deposition chamber within which a vacuum has been established;

transferring the substrate from the load chamber to the first deposition chamber while maintaining a vacuum in the load chamber;

sputter depositing a first layer of a first substance onto the substrate in the first deposition chamber;

transferring the substrate containing the first layer from the first deposition chamber to a second deposition chamber in which a vacuum has been established while maintaining the vacuum in the first deposition chamber;

simultaneously sputter depositing a second layer of at least two constituent materials onto the substrate in the second deposition chamber such that the concentration of one of said two constituent materials in the layer decreases in the radial outward direction from inner to outer position on the substrate;

transferring the substrate containing the first and second layers to a third deposition chamber in which a vacuum has been established while maintaining the vacuum in the second deposition chamber;

sputter depositing a third layer of a third substance on to the substrate in the third deposition chamber;

transferring the substrate containing the first, second and third layers to a fourth deposition chamber in which a vacuum has been established while maintaining the vacuum in the third deposition chamber;

sputtering a fourth layer of a fourth substance onto the substrate in the fourth chamber;

transferring the substrate containing the first, second, third and fourth layers from the fourth deposition chamber to an unload chamber in which a vacuum has been established while maintaining the vacuum in the fourth deposition chamber;

isolating the fourth deposition chamber from the unload chamber;

relieving the vacuum in the unload chamber while maintaining the vacuum in the fourth deposition chamber;

removing the substrate from the unload chamber while the vacuum is maintained in the fourth deposition chamber.

13. A method according to claim 12 in which the first layer is of chrome, the second layer is of cobalt and platinum, the third layer is of chrome, and the fourth layer is a wear resistant layer.

14. A method according to claim 13 in which the step of depositing the second layer comprises the step of depositing a platinum and cobalt magnetic layer with a percentage concentration of platinum in the layer which decreases in the radial outward direction so as to decrease the coercivity of said magnetic layer in the radial direction from inner to outer positions on the substrate.

15. A method according to claim 14 in which the step of depositing the first layer comprises the step of depositing a chrome layer, said step including the step of reducing the thickness of the first depositioned chrome layer in a radial outward direction so as to decrease the coercivity of said magnetic layer in the radial direction from inner to outer positions on the substrate.

* * * * *